(12) United States Patent
Zhao et al.

(10) Patent No.: US 6,887,741 B2
(45) Date of Patent: May 3, 2005

(54) METHOD FOR MAKING AN ENHANCED DIE-UP BALL GRID ARRAY PACKAGE WITH TWO SUBSTRATES

(75) Inventors: Sam Ziqun Zhao, Irvine, CA (US); Reza-ur Rahman Khan, Rancho Santa Margarita, CA (US); Imtiaz Chaudhry, Rancho Santa Margarita, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/730,093

(22) Filed: Dec. 9, 2003

(65) Prior Publication Data

US 2004/0113284 A1 Jun. 17, 2004

Related U.S. Application Data

(62) Division of application No. 10/101,751, filed on Mar. 21, 2002.

(51) Int. Cl.[7] .................. H01L 21/44; H01L 21/48; H01L 21/50
(52) U.S. Cl. ............................................. 438/125
(58) Field of Search ................... 438/125, 126

(56) References Cited

U.S. PATENT DOCUMENTS

| | | |
|---|---|---|
| 3,790,866 A | 2/1974 | Meyer et al. |
| 4,611,238 A | 9/1986 | Lewis et al. |
| 5,045,921 A | 9/1991 | Lin et al. |
| 5,065,281 A | 11/1991 | Hernandez et al. |
| 5,173,766 A | 12/1992 | Long et al. |
| 5,208,504 A | 5/1993 | Parker et al. |
| 5,216,278 A | 6/1993 | Lin et al. |
| 5,285,352 A | 2/1994 | Pastore et al. |
| 5,291,062 A | 3/1994 | Higgins, III |
| 5,294,826 A | 3/1994 | Marcantonio et al. |
| 5,366,589 A | 11/1994 | Chang |
| 5,394,009 A | 2/1995 | Loo |
| 5,397,917 A | 3/1995 | Ommen et al. |
| 5,397,921 A | 3/1995 | Karnezos |
| 5,409,865 A | 4/1995 | Karnezos |
| 5,433,631 A | 7/1995 | Beaman et al. |
| 5,438,216 A | 8/1995 | Juskey et al. |
| 5,474,957 A | 12/1995 | Urushima |
| 5,490,324 A | 2/1996 | Newman |
| 5,534,467 A | 7/1996 | Rostoker |
| 5,541,450 A | 7/1996 | Jones et al. |
| 5,552,635 A | 9/1996 | Kim et al. |
| 5,572,405 A | 11/1996 | Wilson et al. |
| 5,578,869 A | 11/1996 | Hoffman et al. |

(Continued)

FOREIGN PATENT DOCUMENTS

| | | | |
|---|---|---|---|
| EP | 0 573 297 A2 | 12/1993 | ......... H01L/23/498 |
| EP | 0 504 411 B1 | 6/1998 | ........... H01L/23/04 |
| FR | 2 803 098 A3 | 6/2001 | ......... H01L/23/367 |

(Continued)

OTHER PUBLICATIONS

Amkor package data sheet, "SuperFC®", from http://www.amkor.com/Products/all_datasheets/superfc.pdf, 2 pages (Jan. 2003).

(Continued)

*Primary Examiner*—David A. Zarneke
(74) *Attorney, Agent, or Firm*—Sterne, Kessler, Goldstein & Fox PLLC

(57) ABSTRACT

An electrically and thermally enhanced die-up ball grid array (BGA) package is described. An integrated circuit (IC) package includes a first substrate, a second substrate, and a stiffener. A surface of the first substrate is attached to a first surface of the stiffener. A surface of the second substrate is attached to a second surface of the stiffener. An IC die may be attached to a second surface of the second substrate or to the second surface of the stiffener. Additional electronic devices may be attached to the second surface of the second substrate.

50 Claims, 35 Drawing Sheets

U.S. PATENT DOCUMENTS

| | | | |
|---|---|---|---|
| 5,583,377 A | 12/1996 | Higgins, III | |
| 5,583,378 A | 12/1996 | Marrs et al. | |
| 5,642,261 A | 6/1997 | Bond et al. | |
| 5,648,679 A | 7/1997 | Chillara et al. | |
| 5,650,659 A | 7/1997 | Mostafazadeh et al. | |
| 5,650,662 A | 7/1997 | Edwards et al. | |
| 5,691,567 A | 11/1997 | Lo et al. | |
| 5,717,252 A | 2/1998 | Nakashima et al. | |
| 5,736,785 A | 4/1998 | Chiang et al. | |
| 5,744,863 A | 4/1998 | Culnane et al. | |
| 5,796,170 A | 8/1998 | Marcantonio | |
| 5,798,909 A | 8/1998 | Bhatt et al. | |
| 5,801,432 A | 9/1998 | Rostoker et al. | |
| 5,835,355 A | 11/1998 | Dordi | |
| 5,843,808 A | 12/1998 | Karnezos | |
| 5,844,168 A | 12/1998 | Schueller et al. | |
| 5,856,911 A | 1/1999 | Riley | |
| 5,866,949 A | 2/1999 | Schueller | |
| 5,883,430 A | 3/1999 | Johnson | |
| 5,889,321 A | 3/1999 | Culnane et al. | |
| 5,889,324 A | 3/1999 | Suzuki | |
| 5,894,410 A | 4/1999 | Barrow | |
| 5,895,967 A | 4/1999 | Stearns et al. | |
| 5,901,041 A | 5/1999 | Davies et al. | |
| 5,903,052 A | 5/1999 | Chen et al. | |
| 5,905,633 A | 5/1999 | Shim et al. | |
| 5,907,189 A | 5/1999 | Mertol | |
| 5,907,903 A | 6/1999 | Ameen et al. | |
| 5,920,117 A | 7/1999 | Sono et al. | |
| 5,949,137 A | 9/1999 | Domadia et al. | |
| 5,953,589 A | 9/1999 | Shim et al. | |
| 5,972,734 A | 10/1999 | Carichner et al. | |
| 5,976,912 A | 11/1999 | Fukutomi et al. | |
| 5,977,626 A | 11/1999 | Wang et al. | |
| 5,977,633 A | 11/1999 | Suzuki et al. | |
| 5,982,621 A | 11/1999 | Li | |
| 5,986,340 A | 11/1999 | Mostafazadeh et al. | |
| 5,986,885 A | 11/1999 | Wyland | |
| 5,998,241 A | 12/1999 | Niwa | |
| 5,999,415 A | 12/1999 | Hamzehdoost | |
| 6,002,147 A | 12/1999 | Iovdalsky et al. | |
| 6,002,169 A | 12/1999 | Chia et al. | |
| 6,011,304 A | 1/2000 | Mertol | |
| 6,011,694 A | 1/2000 | Hirakawa | |
| 6,020,637 A | 2/2000 | Karnezos | |
| 6,028,358 A | 2/2000 | Suzuki | |
| 6,034,427 A | 3/2000 | Lan et al. | |
| 6,040,984 A | 3/2000 | Hirakawa | |
| 6,057,601 A | 5/2000 | Lau et al. | |
| 6,060,777 A | 5/2000 | Jamieson et al. | |
| 6,069,407 A | 5/2000 | Hamzehdoost | |
| 6,077,724 A | 6/2000 | Chen | |
| 6,084,297 A | 7/2000 | Brooks et al. | |
| 6,084,777 A | 7/2000 | Kalidas et al. | |
| 6,114,761 A | 9/2000 | Mertol et al. | |
| 6,117,797 A | 9/2000 | Hembree | |
| 6,122,171 A | 9/2000 | Akram et al. | |
| 6,133,064 A | 10/2000 | Nagarajan et al. | |
| 6,140,707 A | 10/2000 | Plepys et al. | |
| 6,160,705 A | 12/2000 | Stearns et al. | |
| 6,162,659 A | 12/2000 | Wu | |
| 6,163,458 A | 12/2000 | Li | |
| 6,166,434 A | 12/2000 | Desai et al. | |
| 6,184,580 B1 | 2/2001 | Lin | |
| 6,201,300 B1 | 3/2001 | Tseng et al. | |
| 6,207,467 B1 | 3/2001 | Vaiyapuri et al. | |
| 6,212,070 B1 | 4/2001 | Atwood et al. | |
| 6,242,279 B1 | 6/2001 | Ho et al. | |
| 6,246,111 B1 | 6/2001 | Huang et al. | |
| 6,278,613 B1 | 8/2001 | Fernandez et al. | |
| 6,288,444 B1 | 9/2001 | Abe et al. | |
| 6,313,521 B1 | 11/2001 | Baba | |
| 6,313,525 B1 | 11/2001 | Sasano | |
| 6,347,037 B2 | 2/2002 | Iijima et al. | |
| 6,362,525 B1 | 3/2002 | Rahim | |
| 6,369,455 B1 | 4/2002 | Ho et al. | |
| 6,380,623 B1 | 4/2002 | Demore | |
| 6,462,274 B1 | 10/2002 | Shim et al. | |
| 6,472,741 B1 | 10/2002 | Chen et al. | |
| 6,525,942 B2 | 2/2003 | Huang et al. | |
| 6,528,869 B1 | 3/2003 | Glenn et al. | |
| 6,528,892 B2 | 3/2003 | Caletka et al. | |
| 6,541,832 B2 | 4/2003 | Coyle | |
| 6,545,351 B1 | 4/2003 | Jamieson et al. | |
| 6,552,266 B2 | 4/2003 | Carden et al. | |
| 6,552,428 B1 | 4/2003 | Huang et al. | |
| 6,552,430 B1 | 4/2003 | Perez et al. | |
| 6,563,712 B2 | 5/2003 | Akram et al. | |
| 6,583,516 B2 | 6/2003 | Hashimoto | |
| 6,614,660 B1 | 9/2003 | Bai et al. | |
| 6,617,193 B1 | 9/2003 | Toshio et al. | |
| 6,657,870 B1 | 12/2003 | Ali et al. | |
| 6,664,617 B2 | 12/2003 | Siu | |
| 6,724,071 B2 | 4/2004 | Combs | |
| 6,724,080 B1 | 4/2004 | Ooi et al. | |
| 2001/0001505 A1 | 5/2001 | Schueller et al. | |
| 2001/0040279 A1 | 11/2001 | Mess et al. | |
| 2001/0045644 A1 | 11/2001 | Huang | |
| 2002/0053731 A1 | 5/2002 | Chao et al. | |
| 2002/0072214 A1 | 6/2002 | Yuzawa et al. | |
| 2002/0079562 A1 | 6/2002 | Zhao et al. | |
| 2002/0079572 A1 | 6/2002 | Khan et al. | |
| 2002/0096767 A1 | 7/2002 | Cote et al. | |
| 2002/0098617 A1 | 7/2002 | Lee et al. | |
| 2002/0109226 A1 | 8/2002 | Khan et al. | |
| 2002/0135065 A1 | 9/2002 | Zhao et al. | |
| 2002/0171144 A1 | 11/2002 | Zhang et al. | |
| 2002/0180040 A1 | 12/2002 | Camenforte et al. | |
| 2002/0185717 A1 | 12/2002 | Eghan et al. | |
| 2002/0185720 A1 | 12/2002 | Khan et al. | |
| 2002/0185722 A1 | 12/2002 | Zhao et al. | |
| 2002/0185734 A1 | 12/2002 | Zhao et al. | |
| 2002/0185750 A1 | 12/2002 | Khan et al. | |
| 2002/0190361 A1 | 12/2002 | Zhao et al. | |
| 2002/0190362 A1 | 12/2002 | Khan et al. | |
| 2003/0057550 A1 | 3/2003 | Zhao et al. | |
| 2003/0111726 A1 | 6/2003 | Khan et al. | |
| 2003/0138613 A1 | 7/2003 | Thoman et al. | |
| 2003/0146503 A1 | 8/2003 | Khan et al. | |
| 2003/0146506 A1 | 8/2003 | Khan et al. | |
| 2003/0146509 A1 | 8/2003 | Zhao et al. | |
| 2003/0146511 A1 | 8/2003 | Zhao et al. | |
| 2003/0179549 A1 | 9/2003 | Zhong et al. | |
| 2003/0179556 A1 | 9/2003 | Zhao et al. | |
| 2004/0072456 A1 | 4/2004 | Dozler, II et al. | |

FOREIGN PATENT DOCUMENTS

| | | | | |
|---|---|---|---|---|
| JP | 61-49446 A | 3/1986 | ............ | H01L/23/36 |
| JP | 7-283336 A | 10/1995 | ............ | H01L/23/12 |
| JP | 10-50877 A | 2/1998 | ............ | H01L/23/12 |
| JP | 10-189835 A | 7/1998 | ............ | H01L/23/24 |
| JP | 10-247702 A | 9/1998 | ............ | H01L/23/12 |
| JP | 10-247703 A | 9/1998 | ............ | H01L/23/12 |
| JP | 11-17064 A | 1/1999 | ............ | H01L/23/14 |
| JP | 11-102989 A | 4/1999 | ............ | H01L/23/12 |
| JP | 2000-286294 A | 10/2000 | ............ | H01L/21/60 |
| JP | 2001-68512 A | 3/2001 | ............ | H01L/21/60 |
| TW | 383908 | 3/2000 | ............ | H01L/23/34 |
| TW | 417219 | 1/2001 | ............ | H01L/21/60 |

OTHER PUBLICATIONS

Andros, F., "Tape Ball Grid Array," from Puttlitz, K.J. and Totta, P.A. (eds.), *Area Array Interconnection Handbook*, pp. 619–620, ISBN No. 0–7923–7919–5, Kluwer Academic Publishers (2001).

Brofman, P.J. et al., "Flip–Chip Die Attach Technology," Puttlitz, K.J. and Totta, P.A. (eds.), *Area Array Interconnection Handbook*, pp. 315–349, ISBN No. 0–7923–7919–5, Kluwer Academic Publishers (2001).

Ghosal, B. et al., "Ceramic and Plastic Pin Grid Array Technology," Puttlitz, K.J. and Totta, P.A. (eds.), *Area Array Interconnection Handbook*, pp. 551–576, ISBN No. 0–7923–7919–5, Kluwer Academic Publishers (2001).

Harper, C.A. (ed.), *Electronic Packaging And Interconnection Handbook*, Third Edition, pp. 7.58–7.59, ISBN No. 0–07–134745–3, McGraw–Hill Companies (2000).

Lin, S. and Chang, N., "Challenges in Power–Ground Integrity," *Proceedings Of The 2001 International Conference On Computer–Aided Design*, pp. 651–654 (Nov. 4–8, 2001).

Lloyd, J. and Overhauser, D., "Electromigration wreaks havoc on IC design," *EDN*, pp. 145–148 (Mar. 26, 1998).

Song, W.S. and Glasser, L.A., "Power Distribution Techniques for VLSI Circuits," *IEEE Journal Of Solid–State Circuits*, vol. SC–21, No. 1, pp. 150–156 (Feb. 1986).

Tang, K.T. and Friedman, E.G., "Simultaneous Switching Noise in On–Chip CMOS Power Distribution Networks," *IEEE Transactions On Very Large Scale Integration (VLSI) Systems*, vol. 10, No. 4, pp. 487–493 (Aug. 2002).

Ahn, S.H. and Kwon, Y.S., "Popcorn Phenomena in a Ball Grid Array Package", *IEEE Transactions on Components, Packaging, and Manufacturing Technology Part B: Advanced Packaging*, IEEE, Aug. 1995, vol. 18, No. 3, pp. 491–495.

Amkor Electronics, "Amkor BGA Packaging: Taking The World By Storm", *Electronic Packaging & Production*, Cahners Publishing Company, May 1994, page unknown.

Anderson, L. and Trabucco, B., "Solder Attachment Analysis of Plastic BGA Modules", *Surface Mount International Conference*, Surface Mount International, Aug. 28–Sep. 1, 1994, San Jose, California, pp. 189–194.

Andrews, M., "Trends In Ball Grid Array Technology," *Ball Grid Array National Symposium*, Mar. 29–30, 1995, Dallas, Texas, 10 pages.

Attarwala, A.I. Dr. and Stierman, R., "Failure Mode Analysis of a 540 Pin Plastic Ball Grid Array", *Surface Mount International Conference*, Surface Mount International, Aug. 28–Sep. 1, 1994, San Jose, California, pp. 252–257.

Banerji, K., "Development of the Slightly Larger Than IC Carrier (SLICC)", *Journal of Surface Mount Technology*, Jul. 1994, pp. 21–26.

Bauer, C., Ph.D., "Partitioning and Die Selection Strategies for Cost Effective MCM Designs", *Journal of Surface Mount Technology*, Oct. 1994, pp. 4–9.

Bernier, W.E. et al., "BGA vs. QFP: A Summary of Tradeoffs for Selection of High I/O Components", *Surface Mount International Conference Proceedings*, Surface Mount International, Aug. 28–Sep. 1, 1994, San Jose, California, pp. 181–185.

Burgos, J. et al., "Achieving Accurate Thermal Characterization Using a CFD Code–A Case Study of Plastic Packages", *IEEE Transactions on Components, Packaging, and Manufacturing Technology Part A*, IEEE, Dec. 1995, vol. 18, No. 4, pp. 732–738.

Chadima, M., "Interconnecting Structure Manufacturing Technology," *Ball Grid Array National Symposium*, Dallas, Texas, Mar. 29–30, 1995, 12 pages.

Chanchani, R. et al., "Mini BGA: Pad and Pitch Ease Die Test and Handling", *Advanced Packaging*, IHS Publishing Group, May/Jun. 1995, pp. 34 and 36–37.

Chung, T.C. et al., "Rework of Plastic, Ceramic, and Tape Ball Grid Array Assemblies", *Ball Grid Array National Symposium Proceedings*, Dallas, Texas, Mar. 29–30, 1995, pp. 1–15.

Cole, M.S. and Caulfield, T. "A Review of Available Ball Grid Array (BGA) Packages", *Journal of Surface Mount Technology*, Surface Mount Technology Association, Jan. 1996, vol. 9, pp. 4–11.

Cole, M.S. and Caulfield, T., "Ball Grid Array Packaging", *Surface Mount International Conference Proceedings*, Surface Mount International, Aug. 28–Sep. 1, 1994, San Jose, California, pp. 147–153.

Dobers, M. and Seyffert, M., "Low Cost MCMs: BGAs Provide a Fine–Pitch Alternative", *Advanced Packaging*, IHS Publishing Group, Sep./Oct. 1994, vol. 3, No. 5, pp. 28, 30 and 32.

Dody, G. and Burnette, T., "BGA Assembly Process and Rework", *Journal of Surface Mount Technology*, Surface Mount Technology Association, Jan. 1996, vol. 9, pp. 39–45.

Edwards, D. et al., "The Effect of Internal Package Delaminations on the Thermal Performance of PQFP, Thermally Enhanced PQFP, LOC and BGA Packages", *45th Electronic Components & Technology Conference*, IEEE, May 21–24, 1995, Las Vegas, NV, pp. 285–292.

Ejim, T.L. et al., "Designed Experiment to Determine Attachment Reliability Drivers for PBGA Packages", *Journal of Surface Mount Technology*, Surface Mount Technology Association, Jan. 1996, vol. 9, pp. 30–38.

English–language Abstract of JP 10–189835, published Jul. 21, 1998, 1 page, printed from http://V3.espacenet.com.

English–language Translation of JP 10–247702, published Sep. 14, 1998, 8 pages.

English–language Abstract of JP 10–247703, published Sep. 14, 1998, 1 page, printed from http://v3.espacenet.com.

English–language Abstract of JP 10–050877, published Feb. 20, 1998, 1 page, printed from http://v3.espacenet.com.

English–language Translation of JP 11–102989, published Apr. 14, 1999, 24 pages.

English–language Abstract of JP 11–017064, published Jan. 22, 1999, 1 page, printed from http://v3.espacenet.com.

English–language Abstract of JP 2000–286294, published Oct. 13, 2000, 1 page, printed from http://v3.espacenet.com.

English–language Abstract of JP 2001–068512, published Mar. 16, 2001, 1 page, printed from http://v3.espacenet.com.

English–language Abstract of JP 61–049446, published Mar. 11, 1986, 1 page, printed from http://v3.espacenet.com.

English–language Abstract of JP 7–283336, published Oct. 27, 1995, 1 page, printed from http://v3.espacenet.com.

Ewanich, J. et al., "Development of a Tab (TCP) Ball Grid Array Package", *Proceedings of the 1995 International Electronics Packaging Conference*, San Diego, CA, Sep. 24–27, 1995, pp. 588–594.

Fauser, S. et al, "High Pin–Count PBGA Assembly", *Circuits Assembly*, Feb. 1995, vol. 6, No. 2, pp. 36–38 and 40.

Fauser, Suzanne et al., "High Pin Count PBGA Assembly: Solder Defect Failure Modes and Root Cause Analysis", *Surface Mount International, Proceedings of The Technical Program*, Surface Mount International, Aug. 28–Sep. 1, 1994, San Jose, California, pp. 169–174.

Ferguson, M. "Ensuring High–Yield BGA Assembly", *Circuits Assembly*, Feb. 1995, vol. 6, No. 2, pp. 54, 56 and 58.

Freda, M., "Laminate Technology for IC Packaging", *Electronic Packaging & Production*, Cahners Publishing Company, Oct. 1995, vol. 35, No. 11, pp. S4–S5.

Freedman, M., "Package Size and Pin–Out Standardization", *Ball Grid Array National Symposium*, Mar. 29–30, 1995, 6 pages.

Freyman, B. and Pennisi, R., "Overmolded Plastic Pad Array Carriers (OMPAC): A Low Cost, High Interconnect Density IC Packaging Solution for Consumer and Industrial Electronics", *41st Electronic Components & Technology Conference*, IEEE, May 11–16, 1991, pp. 176–182.

Freyman, B. et al., "Surface Mount Process Technology for Ball Grid Array Packaging", *Surface Mount International Conference Proceedings*, Surface Mount International, Aug. 29–Sep. 2, 1993, San Jose, California, pp. 81–85.

Freyman, B. et al., "The Move to Perimeter Plastic BGAs", *Surface Mount International Conference Proceedings*, San Jose, CA, Aug. 29–31, 1995, pp. 373–382.

Freyman, B., "Trends in Plastic BGA Packaging," *Ball Grid Array National Symposium*, Dallas, Texas, Mar. 29–30, 1995, 44 pages.

Gilleo, K., "Electronic Polymers: Die Attach and Oriented Z–Axis Films", *Advanced Packaging*, IHS Publishing Group, Sep./Oct. 1994, vol. 3, No. 5, pp. 37–38, 40 and 42.

Guenin, B. et al., "Analysis of a Thermally Enhanced Ball Grid Array Package", *IEEE Transactions on Components, Packaging, and Manufacturing Technology, Part A*, IEEE Components, Packaging, and Manufacturing Technology Society, Dec. 1995, vol. 18, No. 4, pp. 749–757.

Hart, C. "Vias in Pads", *Circuits Assembly*, Feb. 1995, vol. 6, No. 2, pp. 42, 44–46 and 50.

Hart, C., "Vias in Pads for Coarse and Fine Pitch Ball Grid Arrays", *Surface Mount International Conference Proceedings*, Surface Mount International, Aug. 28–Sep. 1, 1994, San Jose, California, pp. 203–207.

Hattas, D., "BGAs Face Production Testing: New Package Offers Promise but Must Clear Technology Hurdles.", *Advanced Packaging*, IHS Publishing Group, Summer 1993, vol. 2, No. 3, pp. 44–46.

Hayden, T.F. et al., "Thermal & Electrical Performance and Reliability Results for Cavity–Up Enhanced BGAs", *Electronic Components and Technology Conference*, IEEE, 1999, pp. 638–644.

Heitmann, R., "A Direct Attach Evolution: TAB, COB and Flip Chip Assembly Challenges", *Advanced Packaging*, IHS Publishing Group, Jul./Aug. 1994, vol. 3, No. 4, pp. 95–99.

Hodson, T., "Study Examines BGA Use", *Electronic Packaging & Production*, Mar. 1993, page unknown.

Holden, H., "The Many Techniques of Small Via Formation for Thin Boards", *The Institute for Interconnecting and Packaging Electronic Circuits Ball Grid Array National Symposium*, San Diego, CA, Jan. 18–19, 1996, pp. 1–7.

Houghten, J., "New Package Takes On QFPs", *Advanced Packaging*, IHS Publishing Group, Winter 1993, vol. 2, No. 1, pp. 38–39.

Houghten, J.L., "Plastic Ball–Grid Arrays Continue To Evolve", *Electronic Design*, Feb. 6, 1995, pp. 141–146.

"How To Give Your BGAs A Better Bottom Line.", *Advanced Packaging*, IHS Publishing Group, May/Jun. 1995, page unknown.

Huang, W. and Ricks, J., "Electrical Characterization of PBGA for Communication Applications by Simulation and Measurement", *National Electronic Packaging and Production Conference West '95*, Feb. 26–Mar. 2, 1995, Anaheim, California, pp. 300–307.

Hundt, M. et al., "Thermal Enhancements of Ball Grid Arrays", *National Electronic Packaging and Production Conference West '95*, Reed Exhibition Companies, Anaheim, CA, Feb. 25–29, 1996, pp. 702–711.

Hutchins, C.L., "Understanding Grid Array Packages", *Surface Mount Technology Magazine*, IHS Publishing Group, Nov. 1994, vol. 8, No. 11, pp. 12–13.

Hwang, J.S., "A Hybrid of QFP and BGA Architectures", *Surface Mount Technology Magazine*, IHS Publishing Group, Feb. 1995, vol. 9, No. 2, p. 18.

Hwang, J.S., "Reliability of BGA Solder Interconnections", *Surface Mount Technology Magazine*, IHS Publishing Group, Sep. 1994, vol. 8, No. 9, pp. 14–15.

Johnson, R. et al., "A Feasibility Study of of Ball Grid Array Packaging", *National Electronic Packaging and Production Conference East '93*, Boston, Massachusetts, Jun. 14–17, 1993, pp. 413–422.

Johnson, R. et al., "Thermal Characterization of 140 and 225 Pin Ball Grid Array Packages", *National Electronic Packaging & Production Conference East '93*, Boston, Massachusetts, Jun. 14–17, 1993, pp. 423–430.

Johnston, P. "Printed Circuit Board Design Guidelines for Ball Grid Array Packages", *Journal of Surface Mount Technology*, Surface Mount Technology Association, Jan. 1996, vol. 9, pp. 12–18.

Johnston, P., "Land Pattern Interconnectivity Schemes", *Ball Grid Array National Symposium*, Dallas, Texas, Mar. 29–30, 1995, pp. 2–21.

Kamezos, M., "An EPBGA Alternative," *Advanced Packaging*, Jun. 1998, pp. 90, 92, 94, and 96.

Kawahara, T. et al., "Ball Grid Array Type Package By Using of New Encapsulation Method", *Proceedings of the 1995 International Electronics Packaging Conference*, San Diego, CA, Sep. 24–27, 1995, pp. 577–587.

Knickerbocker, J.U. and Cole, M.S., "Ceramic BGA: A Packaging Alternative", *Advanced Packaging*, IHS Publishing Group, Jan./Feb. 1995, vol. 4, No. 1, pp. 20, 22 and 25.

Kromann, G., et al., "A Hi–Density C4/CBGA Interconnect Technology for a CMOS Microprocessor", *National Electronic Packaging and Production Conference West '95*, IEEE, Feb. 26–Mar. 2, 1995, Anaheim, California, pp. 1523–1529.

Kunkle, R., "Discrete Wiring for Array Packages", *Ball Grid Array National Symposium*, Dallas, Texas, Mar. 29–30, 1995, 9 pages.

Lall, B. et al., "Methodology for Thermal Evaluation of Multichip Modules", *IEEE, Transactions on Components, Packaging, and Manufacturing Technology Part A*, IEEE, Dec. 1995, vol. 18, No. 4, pp. 758–764.

Lasance, C. et al., "Thermal Characterization of Electronic Devices with Boundary Condition Independent Compact Models", *IEEE Transactions on Components, Packaging, and Manufacturing Technology Part A*, IEEE Components, Packaging, and Manufacturing Technology Society, Dec. 1995, vol. 18, No. 4, pp. 723–731.

Lau, J. et al., "No Clean Mass Reflow of Large Plastic Ball Grid Array Packages", *Circuit World*, Wela Publications Ltd., vol. 20, No. 3, Mar. 1994, pp. 15–22.

Lau, J., *Ball Grid Array Technology*, McGraw–Hill Inc., 1995, entire book submitted.

"Literature Review", Special Supplement to *Electronic Packaging & Production*, Feb. 1995, Cahners Publication, 10 pages.

*LSI LOGIC Package Selector Guide, Second Edition*, LSI Logic Corporation, 1994–1995, entire document submitted.

"LTCC MCMs Lead to Ceramic BGAs," *Advanced Packaging*, IHS Publishing Group, Sep./Oct. 1994, vol. 3, No. 5, pp. 14–15.

Mak, Dr. W.C. et al., "Increased SOIC Power Dissipation Capability Through Board Design and Finite Element Modeling", *Journal of Surface Mount Technology*, Surface Mount International, Oct. 1994, pp. 33–41.

Marrs, R. et al., "Recent Technology Breakthroughs Achieved with the New *Super*BGA®Package", *1995 International Electronics Packaging Conference*, San Diego, California, Sep. 24–27, 1995, pp. 565–576.

Marrs, R.C. and Olachea, G., "BGAs For MCMs: Changing Markets and Product Functionality", *Advanced Packaging*, IHS Publishing Group, Sep./Oct. 1994, vol. 3, No. 5, pp. 48, 50, and 52.

Matthew, L.C. et al., "Area Array Packaging: KGD in a Chip–Sized Package", *Advanced Packaging*, IHS Publishing Group, Jul./Aug. 1994, pp. 91–94.

U.S. Appl. No. 10/284,340, filed Oct. 31, 2002, Zhao et al.

Mawer, A. et al., "Plastic BGA Solder Joint Reliability Considerations", *Surface Mount International Conference Proceedings*, Surface Mount International, Aug. 28–Sep. 1, 1994, San Jose, California, pp. 239–251.

Mazzullo, T. and Schaertl, L., "How IC Packages Affect PCB Design", *Surface Mount Technology Magazine*, Feb. 1995, vol. 9, No. 2, pp. 114–116.

Mearig, J., "An Overview of Manufacturing BGA Technology", *National Electronic Packaging and Production Conference West '95*, Feb. 26–Mar. 2, 1995, Anaheim, California, pp. 295–299.

Mertol, A., "Application of the Taguchi Method on the Robust Design of Molded 225 Plastic Ball Grid Array Packages", *IEEE Transactions on Components, Packaging, and Manufacturing Technology Part B: Advanced Packaging*, IEEE, Nov. 1995, vol. 18, No. 4, pp. 734–743.

Mescher, P. and Phelan, G., "A Practical Comparison of Surface Mount Assembly for Ball Grid Array Components", *Surface Mount International Conference Proceedings*, Surface Mount International, Aug. 25–Sep. 4, 1994, San Jose, California, pp. 164–168.

Mulgaonker, S. et al., "An Assessment of the Thermal Performance of the PBGA Family", *Eleventh Annual IEEE Semiconductor Thermal Measurement and Management Symposium*, IEEE, San Jose, CA, Feb. 7–9, 1995, pp. 17–27.

"New PBGA Pushes Technology to Outer Limits", *Advanced Packaging*, HIS Publishing Group, Jan./Feb. 1995, p. 11.

Olachea, G., "Managing Heat: A Focus on Power IC Packaging", *Electronic Packaging & Production (Special Supplement)*, Cahners Publishing Company, Nov. 1994, pp. 26–28.

"Pad Array Improves Density", *Electronic Packaging & Production*, Cahners Publishing Company, May 1992, pp. 25–26.

Partridge, J. and Viswanadham, P., "Organic Carrier Requirements for Flip Chip Assemblies", *Journal of Surfaces Mount Technology*, Surface Mount Technology Association, Jul. 1994, pp. 15–20.

Ramirez, C. and Fauser, S., "Fatigue Life Comparison of The Perimeter and Full Plastic Ball Grid Array", *Surface Mount International Conference Proceedings*, Surface Mount International, Aug. 28–Sep. 1, 1994, San Jose, California, pp. 258–266.

Rogren, P., "MCM–L Built on Ball Grid Array Formats", *National Electronic Packaging and Production Conference West '94*, Feb. 27–Mar. 4, 1994, Anaheim, California, pp. 1277–1282.

Rooks, S., "X–Ray Inspection of Flip Chip Attach Using Digital Tomosynthesis", *Surface Mount International Proceedings of The Technical Program*, Aug. 28–Sep. 1, 1994, San Jose, California, pp. 195–202.

Rukavina, J., "Attachment Methodologies: Ball Grid Array Technology", *Ball Grid Array National Symposium*, Dallas, Texas, Mar. 29–30, 1995, 36 pages.

Sack, T., "Inspection Technology", *Ball Grid Array National Symposium*, Dallas, Texas, Mar. 29–30, 1995, pp. 1–41.

Sakaguchi, H., "BGA Mounting Technology," pp. 1–4, date and source unknown.

Schmolze, C. and Fraser, A., "SPICE Modeling Helps Enhance BGA Performance", *Electronic Packaging & Production*, Jan. 1995, pp. 50–52.

Schueller, R.D. et al., "Performance and Reliability of a Cavity Down Tape BGA Package," *IEEE Electronic Packaging Technology Conference*, 1997, pp. 151–162.

*Semiconductor Group Package Outlines Reference Guide*, Texas Instruments, 1995, entire document submitted.

Shimizu, J. "Plastic Ball Grid Array Coplanrity", *Surface Mount International Conference*, San Jose, California, Aug. 31–Sep. 2, 1993, pp. 86–91.

Sigliano, R., "Using BGA Packages: An Appealing Technology in a QFP and Fine–Pitch Market", *Advanced Packaging*, IHS Publishing Group, Mar./Apr. 1994, pp. 36–39.

Sirois, L., "Dispensing for BGA: Automated Liquid Dispensing in a High–Density Environment", *Advanced Packaging*, IHS Publishing Group, May/Jun. 1995, pp. 38 and 41.

Solberg, V., "Interconnection Structure Preparation: Impact of Material Handling and PCB Surface Finish on SMT Assembly Process Yield", *Ball Grid Array National Symposium*, Dallas Texas, Mar. 29–30, 1995, 9 pages.

"Survival of the Fittest", *Advanced Packaging*, IHS Publishing Group, Mar./Apr. 1995, page unknown.

Thompson, T., "Reliability Assessment of a Thin (Flex) BGA Using a Polyimide Tape Substrate", *International Electronics Manufacturing Technology Symposium*, IEEE, 1999, pp. 207–213.

Tuck, J., "BGA Technology Branches Out", *Circuits Assembly*, Feb. 1995, vol. 6, No. 2, pp. 24, 26, and 28.

"Tutorial and Short Courses", *45th Electronic Components & Technology Conference*, May 21–24, 1995, Las Vegas, Nevada, IEEE, 4 pages.

Vardaman, E.J. and Crowley, R.T., "Worldwide Trends In Ball Grid Array Developments", *National Electronic Packaging and Production Conference West '96*, Reed Exhibition Companies, Anaheim, CA, Feb. 25–29, 1996, pp. 699–701.

Walshak, D. and Hashemi, H., "BGA Technology: Current and Future Direction for Plastic, Ceramic and Tape BGAs", *Surface Mount International Conference Proceedings*, Surface Mount International, Aug. 28–Sep. 1, 1994, San Jose, California, pp. 157–163.

Walshak, D. and Hashemi, H., "Thermal Modeling of a Multichip BGA Package", *National Electronic Packaging and Production Conference West '94*, Reed Exhibition Companies, Anaheim, California, Feb. 27–Mar. 4, 1994, pp. 1266–1276.

Xie, H. et al., "Thermal Solutions to Pentium Processors in TCP in Notebooks and Sub–Notebooks", *45th Electronic Components & Technology Conference*, IEEE, Las Vegas, NV, May 21–24, 1995, pp. 201–210.

Yip, W.Y., "Package Characterization of a 313 Pin BGA", *National Electronic Packaging and Production Conference West '95*, Reed Exhibition Companies, Feb. 26–Mar. 2, 1995, Anaheim, California, pp. 1530–1541.

Zamborsky, E., "BGAs in the Assembly Process", *Circuits Assembly*, Feb. 1995, vol. 6, No. 2, pp. 60, 62–64.

Zhao, Z., Ph.D., "IC Package Thermal Issues and Thermal Design," ASAT, Inc., Jan. 14, 2000, 98 pages, presented at $2^{nd}$ *International Icepak User's Group Meeting*, Palo Alto, CA, on Feb. 7, 2000.

Zhao, Z., Ph.D., "Thermal Design and Modeling of Packages," *IEEE Short Courses*, Broadcom Corporation, Oct. 25, 2000, 95 pages.

Zimerman, M., "High Performance BGA Molded Packages for MCM Application", *Surface Mount International Conference Proceedings*, Surface Mount International, Aug. 28–Sep. 1, 1994, San Jose, California, pp. 175–180.

Zweig, G., "BGAs: Inspect the Process, Not the Product", *Electronic Packaging & Production (Special Supplement)*, Cahners Publishing Company, Aug. 1994 (Supplement), p. 41.

Freyman, B. and Petrucci, M., "High–Pincount PBGAs: Implementation Into Volume Manufacturing," *Advanced Packaging*, An IHS Group Publication, May/Jun. 1995, pp. 44–46.

English–language Abstract of FR 2803098, published Jun. 29, 2001, 1 page, printed from http://v3.espacenet.com.

English–language Summary of Decision of Rejection from Taiwanese Application No. 91108573, 5 pages.

Zhao et al., U.S. Appl. No. 10/284,340, filed Oct. 31, 2002, entitled "Ball Grid Array Package With Patterned Stiffener Layer," 137 pages.

stiffener temperature distribution

METHOD FOR MAKING AN ENHANCED DIE-UP BALL GRID ARRAY PACKAGE WITH TWO SUBSTRATES

This is a divisional application of pending U.S. application Ser. No. 10/101,751, filed Mar. 21, 2002, now allowed, which is herein incorporated by reference in its entirety.

BACKGROUND OF THE INVENTION

1. Field of the Invention

The invention relates generally to the field of integrated circuit (IC) device packaging technology, and more particularly to ball grid array (BGA) package substrate configurations.

2. Background Art

Integrated circuit (IC) dies are typically mounted in or on a package that is attached to a printed circuit board (PCB). One such type of IC die package is a ball grid array (BGA) package. BGA packages provide for smaller footprints than many other package solutions available today. A BGA package has an array of solder balls located on a bottom external surface of a package substrate. The solder balls are reflowed to attach the package to the PCB. The IC die is mounted to a top surface of the package substrate. Wire bonds typically couple signals in the IC die to the substrate. The substrate has internal routing which electrically couples the IC die signals to the solder balls on the bottom substrate surface.

A number of BGA package substrate types exist, including ceramic, plastic, and tape (also known as "flex"). In some BGA package types, a stiffener may be attached to the substrate to supply planarity and rigidity to the package. In such packages, the IC die may be mounted to the stiffener instead of the substrate. Openings in the stiffener may be used to allow the IC die to be wire-bonded to the substrate.

Die-up and die-down BGA package configurations exist. In die-up BGA packages, the IC die is mounted on a top surface of the substrate or stiffener, opposite of the side to which the solder balls are attached. In die-down BGA packages, the IC die is mounted on a bottom surface of the substrate or stiffener, on the same side as which the solder balls are attached.

Conventional BGA packages are subject to high thermal stresses that result from the heat given off during operation of the mounted IC die. The thermal stresses are primarily imposed on the IC die and solder balls due to the mismatch of the thermal expansion coefficient (CTE) between the semiconductor die and the metal stiffener. As a result, conventional flex BGA packages have difficulty in meeting reliability requirements for die sizes larger than 9 mm. See, e.g., Thompson, T., et al., *Reliability Assessment of a Thin (Flex) BGA Using a Polyimide Tape Substrate*, International Electronics Manufacturing Technology Symposium, IEEE, pp. 207–213 (1999).

The tape substrate used in flex BGA packages is typically polyimide, which has very low values of thermal conductivity. Consequently, the IC die is separated from the PCB internally by the tape substrate thermal barrier. The lack of direct thermal connection from IC die to PCB leads to relatively high resistance to heat transfer from IC die-to-board (theta-jb).

A stiffener attached to a substrate enhances heat spreading. However, the openings on the stiffener/heat spreader for wire bond connections tend to reduce the thermal connections between the IC die and the edges of the stiffener/heat spreader. As a result, heat spreading is limited largely to the region of the IC die attach pad, while areas at the stiffener/heat spreader periphery do not contribute effectively to heat spreading.

Dissimilar materials are used to build flex BGA packages. These materials expand and contract at different rates due to changes in temperature during manufacturing of the package, and application of the package. The CTE of copper typically used for a stiffener/heat spreader in a tape BGA package is approximately $17.4 \times 10^{-6}/°$ C. For polyimide tape, the CTE may vary from $30 \times 10^{-6}/°$ C. to $66 \times 10^{-6}/°$ C. Because of the difference in CTE values, changes in temperature during the BGA package assembly process, testing, and application may lead to high levels of thermal stress. De-lamination of the polyimide tape substrate from the stiffener/heat spreader may occur when the adhesive film between the tape and the stiffener/heat spreader can not accommodate the thermal stress during the solder reflow process, thermal fatigue test, and temperature storage test, for example.

Furthermore, because of the high density of the BGA package substrate routing circuitry, it is difficult to bond each power and ground pad on the IC die to the substrate by a corresponding bond finger. As a result, the distribution of ground and power signals connecting to the IC die is frequently compromised in conventional BGA packages.

Hence, what is needed are BGA packages with improved heat spreading capabilities, while also providing for greater routing capacity and higher levels of IC electrical performance.

BRIEF SUMMARY OF THE INVENTION

Ball grid array (BGA) packages having enhanced electrical and thermal characteristics are described herein. In a first aspect, the present invention is directed to integrated circuit (IC) packages, and a method of assembling IC packages. An IC package includes a first substrate, a second substrate, and a stiffener. A surface of the first substrate is attached to a first surface of the stiffener. A surface of the second substrate is attached to a second surface of stiffener.

In another aspect, an electronic device is mounted to a second surface of the second substrate.

In another aspect, the present invention is directed to a method of making a plurality of IC packages that have two substrates. A stiffener strip is formed that includes a plurality of stiffeners. A first substrate strip is formed that includes a plurality of first substrates. A second substrate strip is formed that includes a plurality of second substrates. The first substrate strip is attached to a first surface of the stiffener strip. The second substrate strip is attached to a second surface of the stiffener strip, whereby a substrate/stiffener/substrate strip combination is created. The substrate/stiffener/substrate strip combination is singulated into a plurality of separate substrate/stiffener/substrate combinations.

Further aspects of the present invention, and further features and benefits thereof, are described below. Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1A:
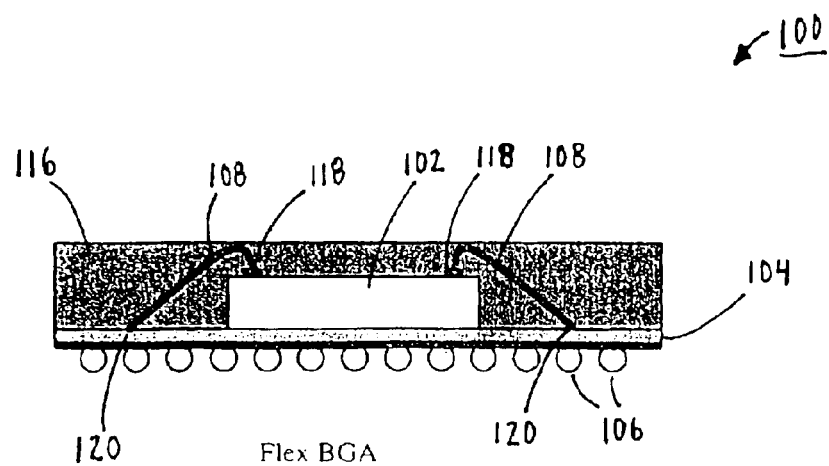
FIGS. 1A and 1B illustrate conventional flex BGA packages.

FIGS. 18A–E show views of exemplary stiffener strips at various stages of assembly, according to embodiments of the present invention.

FIGS. 19A–F show views of exemplary substrate strips at various stages of assembly, according to embodiments of the present invention.

FIGS. 20A–M show flowcharts providing operational steps for assembling one or more embodiments of the present invention.

FIGS. 21A–G show flowcharts providing operational steps for assembling one or more embodiments of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

1.0 Overview

The present invention is directed to a method and system for improving the mechanical, thermal, and electrical performance of BGA packages. The present invention is applicable to BGA packages with all types of substrates, including ceramic, plastic, and tape (flex) BGA packages. Furthermore the present invention is applicable to die-up (cavity-up) and die-down (cavity-down) orientations.

Numerous embodiments of the present invention are presented herein. In a first embodiment, a first substrate and second substrate are present in a BGA package. The first substrate is attached to the bottom surface of the package stiffener, and has solder balls attached to its bottom surface. The second substrate is attached to the top surface of the package stiffener. An IC die can be attached to the second substrate, or to the package stiffener through an opening in the second substrate. In a second embodiment, an electrical device in addition to the package IC die is present in a BGA package. The electrical device is attached to the top surface of the second substrate. Additionally, embodiments for assembling the first and second substrates, the package stiffener, and one or more BGA packages with two substrates are described herein.

In the embodiments presented herein, BGA package mechanical and electrical performances are improved. Having a second substrate located in a BGA package provides for additional package routing capacity. Hence, larger sized IC dies with higher input and output (I/O) counts can be packaged in the same size package. Furthermore, the additional routing capacity allows for additional electrical devices to be present in the BGA package. For example, one or more resistors, capacitors, inductors, diodes, and additional IC dies may be attached to the second substrate in the BGA package, further improving the electrical performance of the BGA package.

Furthermore, by attaching substrates to both sides of the package stiffener, the mechanical performance of the BGA package is improved. In such an arrangement, the substrate/stiffener/substrate combination is more symmetrical than a conventional substrate/stiffener configuration. This aids in balancing package thermal stress, and relieves resulting strains at the interfaces between the substrates and the stiffener. This is because a conventional die-down BGA package may be considered to be similar to a "bi-metal" system. When temperature rises, the substrate/stiffener combination bends in a direction of the material with lower value of CTE; i.e., towards the stiffener. When temperature is lowered, the substrate/stiffener combination bends in a direction of the material with higher value of CTE; i.e., towards the substrate. The present invention described herein substantially forms a "tri-metal" system, with the stiffener sandwiched between two substrates. Preferably, the package substrates are manufactured from the same material. In such an system, the substrate/stiffener/substrate combination will not bend significantly with a change of temperature. This is because with temperature changes, both substrates will bend towards or away from the stiffener, essentially canceling each other's bending motion.

This is particularly important during the substrate-to-stiffener lamination process. Thermal-set epoxies are commonly used for flex tape substrate lamination. The temperature used during the tape substrate attachment process ranges from 125° C. to 150° C. depending on the adhesive material used. After a flex tape substrate is laminated to a metal stiffener strip, thermal stress is created on the stiffener surface when the metal stiffener strip is cooled to room temperature. This thermal stress may lead to warpage of the metal stiffener strip. However, when flex tape substrates are laminated to both sides of the stiffener strip, the warpage of the stiffener due to the CTE mismatch is minimized. Manufacturing yields and reliability in application environments are thus improved.

Either or both package substrates may have one, two, or more routing layers, further improving routing capacity. For example, a multi-layer flex tape substrate may be laminated to the top surface of the stiffener, while a single layer flex tape substrate may be laminated to the bottom surface of the stiffener.

Improved power/ground connections can be made through the use of the package stiffener as a power or ground plane. Power or ground wire bonds may be coupled between the IC die (and any further electrical devices in the BGA package), and the stiffener power or ground plane. The stiffener power or ground plane may be connected to PCB power or ground potentials using thermal/ground solder balls and/or a thermal connector (also known as a heat slug) under the BGA package. Various package inductances are reduced by the improved routing and stiffener power/ground plane performance. Additional advantages may also be realized.

Ball grid array package types are described in section 2.0 below. Further detail on the above described embodiments, and additional embodiments according to the present invention, are presented thereafter in section 3.0. The embodiments described herein may be combined in any applicable manner, as required by a particular application.

2.0 Ball Grid Array (BGA) Package

A ball grid array (BGA) package is used to package and interface an IC die with a printed circuit board (PCB). BGA packages may be used with any type of IC die, and are particularly useful for high speed ICs. In a BGA package, solder pads do not just surround the package periphery, as in chip carrier type packages, but cover the entire bottom package surface in an array configuration. BGA packages are also referred to as pad array carrier (PAC), pad array, land grid array, and pad-grid array packages. BGA packages types are further described in the following paragraphs. For additional description on BGA packages, refer to Lau, J. H., *Ball Grid Array Technology*, McGraw-Hill, New York, (1995), which is herein incorporated by reference in its entirety.

Die-up and die-down BGA package configurations exist. In die-up BGA packages, the IC die is mounted on a top surface of the substrate or stiffener, in a direction away from the PCB. In die-down BGA packages, the IC die is mounted on a bottom surface of the substrate or stiffener, in a direction towards the PCB.

A number of BGA package substrate types exist, including ceramic, plastic (PBGA), and tape (also known as "flex"). FIG. 1A illustrates a conventional flex BGA package 100. BGA package 100 includes an IC die 102, a tape substrate 104, a plurality of solder balls 106, and one or more wire bonds 108. Tape or flex BGA packages are particularly appropriate for large IC dies with large numbers of input and outputs, such as application specific integrated circuits (ASIC) and microprocessors.

Tape substrate 104 is generally made from one or more conductive layers bonded with a dielectric material. For instance, the dielectric material may be made from various substances, such as polyimide tape. The conductive layers are typically made from a metal, or combination of metals, such as copper and aluminum. Trace or routing patterns are made in the conductive layer material. Substrate 104 may be a single-layer tape, a two-layer tape, or additional layer tape substrate type. In a two-layer tape, the metal layers sandwich the dielectric layer, such as in a copper-Upilex-copper arrangement. One or both sides of substrate 104 may be coated with a solder mask, leaving certain designated bond fingers/traces/solder pads exposed.

IC die 102 is attached directly to substrate 104, for example, by an epoxy. IC die 102 is any type of semiconductor integrated circuit, separated from a semiconductor wafer.

One or more wire bonds 108 connect corresponding bond pads/pins 118 on IC die 102 to contact points 120 on substrate 104.

An encapsulant 116, such as a mold compound or epoxy, covers IC die 102 and wire bonds 108 for mechanical and environmental protection.

Figure 1B:
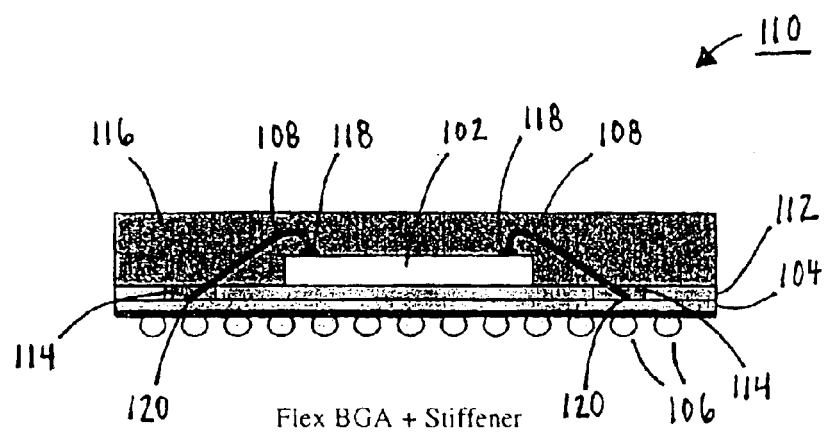

As shown in FIG. 1A, flex BGA package 100 does not include a stiffener. In some BGA package types, particularly in flex BGA packages, a stiffener can be attached to the substrate to add planarity and rigidity to the package. FIG. 1B illustrates a flex BGA package 110, similar to flex BGA package 100, that incorporates a stiffener 112. Stiffener 112 may be laminated to substrate 104. Stiffener 112 is typically made from a metal, or combination of metals, such as copper, tin, and aluminum, or may be made from a polymer, for example. Stiffener 112 also may act as a heat sink, and allow for greater heat spreading in BGA package 110. One or more openings 114 in stiffener 112 may be used to allow for wire bonds 108 to connect IC die 102 to substrate 104. Stiffener 112 may be configured in other ways, and have different opening arrangements than shown in FIG. 1B.

Figure 2A:
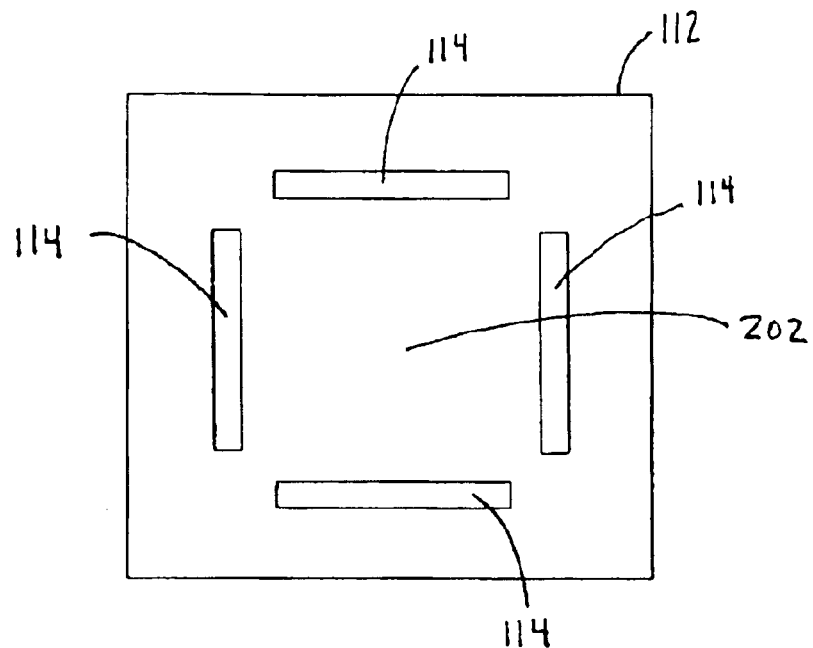
FIG. 2A shows a top view of a stiffener.
Figure 2B:
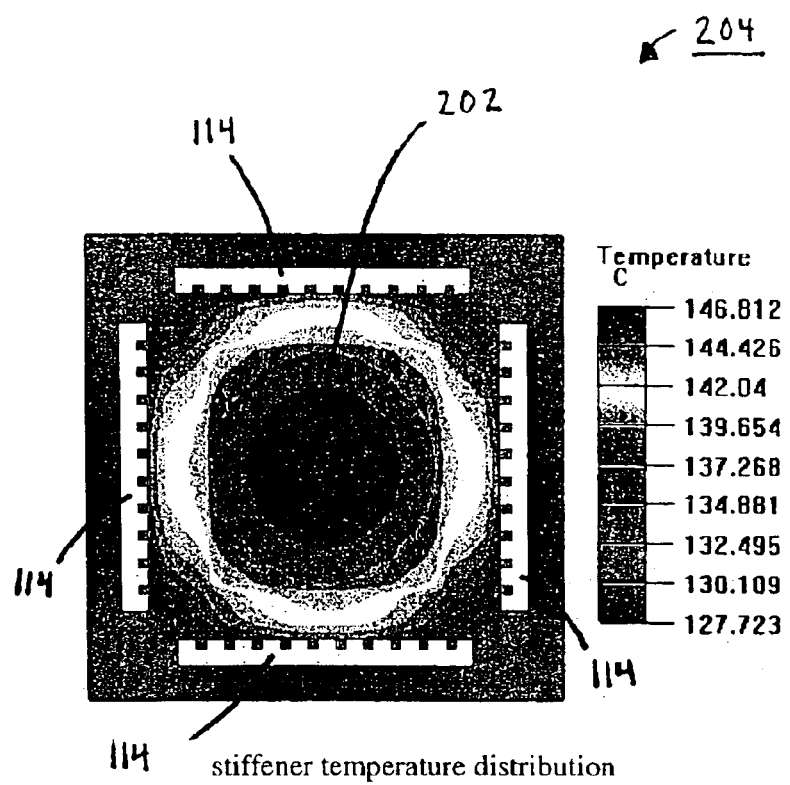
FIG. 2B shows a temperature distribution for a stiffener during operation of an IC device in a flex BGA package.

The use of a stiffener in a flex BGA package requires additional considerations when attempting to manage heat spreading. FIG. 2A shows a top view of a stiffener 112. Stiffener 112 includes an opening 114 adjacent to all four sides of an IC die mounting position 202 in the center of stiffener 112. FIG. 2B shows a temperature distribution 204 of a stiffener, such as stiffener 112, during operation of an IC die in a flex BGA package. Temperature distribution 204 shows that heat transfer from IC die mounting position 202 to the edges of stiffener 112 is substantially limited by openings 114. Openings 114 act as thermal barriers to heat spreading in stiffener 112.

Figure 13:
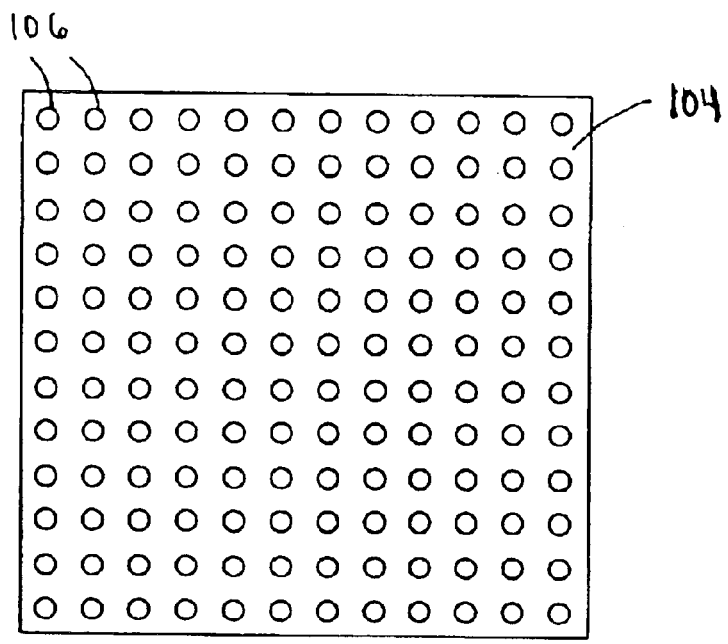
FIGS. 13 and 14 show bottom views of exemplary BGA packages, according to embodiments of the present invention.

As described above, a BGA package includes an array of solder balls located on a bottom external surface of the package substrate. FIG. 13 illustrates an exemplary solder ball arrangement for die-up BGA packages, such as flex BGA packages 100 and 110. As shown in FIG. 13, a bottom surface of substrate 104 is covered with an array of solder balls 106. Each of solder balls 106 is attached to a solder ball pad (not shown) on the bottom surface of substrate 104. Wire bonds coupled to an IC die in the BGA package are electrically connected to solder balls 106 underneath substrate 104 through corresponding vias and routing in substrate 104. The vias in substrate 104 can be filled with a conductive material, such as solder, to allow for these connections. Solder balls 106 are used to attach the BGA package to a PCB.

Note that although wire bonds, such as wire bonds 108, are shown and described herein, IC dies may be mounted and coupled to a substrate with solder balls located on the bottom surface of the IC die, by a process commonly referred to as "C4" or "flip chip" packaging.

As shown in FIG. 13, solder balls 106 may be arranged in an array. FIG. 13 shows a 12 by 12 array of solder balls on the bottom surface of substrate 104. Other sized arrays of solder balls are also applicable to the present invention. Solder balls 106 may be reflowed to attach the BGA package to a PCB. The PCB may include contact pads to which solder balls 106 are bonded. PCB contact pads are generally made from a metal or combination of metals, such as copper, nickel, tin, and gold.

Figure 3:
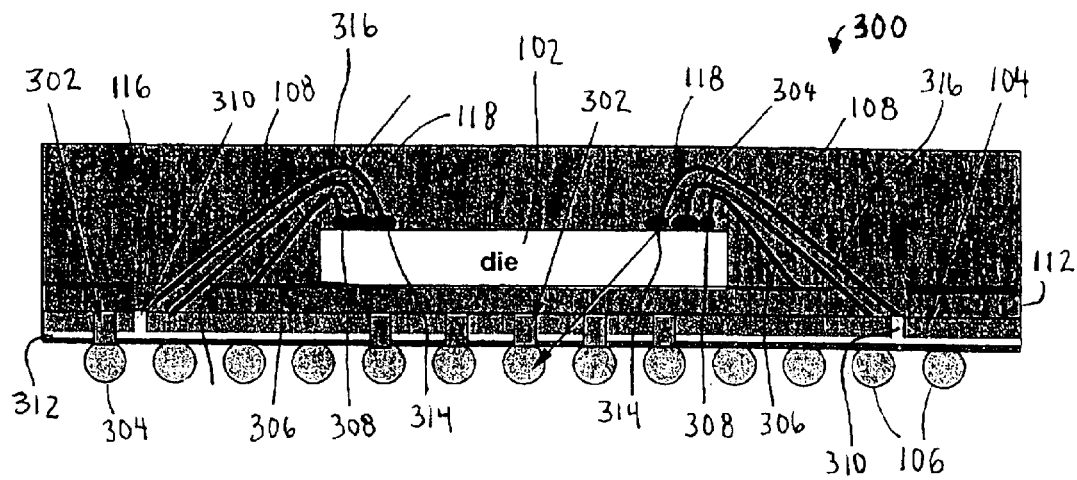
FIG. 3 shows a cross-sectional view of a die-up BGA package.

The BGA package stiffener/heat spreader may be used as a ground or power plane for the BGA package. FIG. 3 shows a cross-sectional view of a BGA package 300, according to an embodiment of the present invention. Stiffener 112 in BGA package 300 is configured to operate as a ground plane for BGA package 300. As shown in FIG. 3, one or more centrally located vias 302 in substrate 104 couple stiffener 112 to thermal solder balls 304 attached to the bottom surface of substrate 104. One or more of thermal solder balls 304 attach to a ground potential in a PCB when BGA package 300 is mounted on the PCB. One or more pins of IC die 102 may be coupled to stiffener 112. As shown in FIG. 3, ground wire bonds 306 couple ground pads 308 on IC die 102 to stiffener 112.

Furthermore, one or more layers of substrate 104 may act as ground or power planes for the BGA package. For example, as shown in FIG. 3, one or more vias 310 in substrate 104 couple a lower substrate layer 312 to corresponding power pins 314 of IC die 102 through power wire bonds 316 in BGA package 300. Substrate layer 312 functions as a power plane for BGA package 300.

Figure 4:
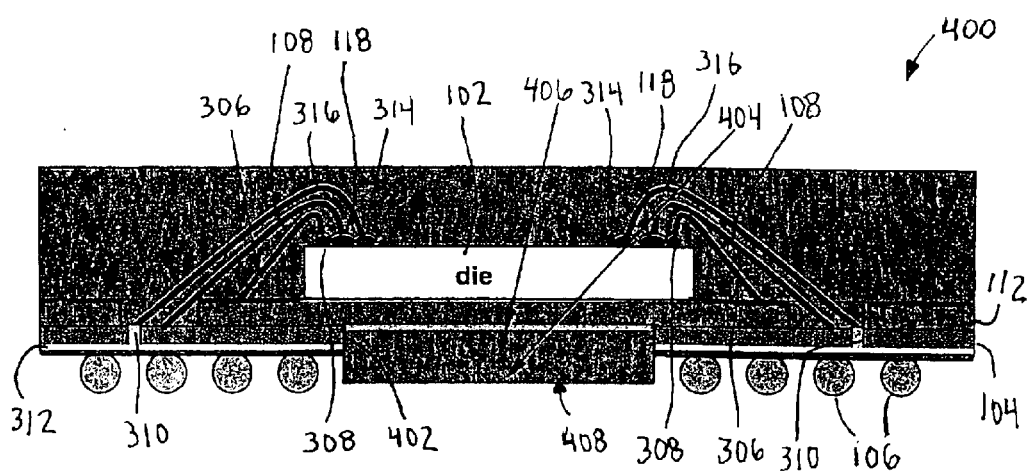
FIG. 4 illustrates a cross-sectional view of a die-up BGA package with thermal connector.

Direct electrical and thermal connection from BGA package ground to a PCB ground plane is also possible by attaching a heat spreader/heat slug between the stiffener and PCB. FIG. 4 illustrates a cross-sectional view of a die-up BGA package 400 with heat spreader/heat slug attached, according to an embodiment of the present invention. As shown in FIG. 4, a ground/thermal connector 404 is coupled in BGA package 400. A portion of the bottom surface of stiffener 112 is exposed through a centrally located opening 402 of substrate 104. Ground/thermal connector 404 is coupled to the exposed bottom surface portion of stiffener 112.

Figure 11:
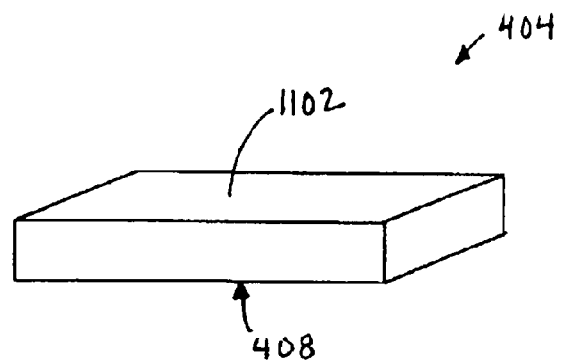
FIG. 11 shows an exemplary thermal connector, according to an embodiment of the present invention.

FIG. 11 shows a perspective view of an example ground/thermal connector 404, according to an embodiment of the present invention. A top surface 1102 and a bottom surface 408 of ground/thermal connector 404 shown in FIG. 11 are substantially rectangular in shape. Ground/thermal connector 404 may be configured in other shapes, such as where top surface 1102 and bottom surface 408 are elliptical, round, or other shape.

The material used for ground/thermal connector 404 may be one or more metals such as copper, aluminum, or the like, or combinations and alloys thereof, for example. Ground/thermal connector 404 may be machined, molded, or otherwise manufactured from these materials. Ground/thermal connector 404 can be made from the same material as stiffener 112, or different material. Ground/thermal connector 404 may be laminated or otherwise attached to the exposed portion of stiffener 112 using an adhesive material 406, such as a solder or a silver-filled or other thermally conductive epoxy. Bottom surface 408 and/or top surface 1102 of ground/thermal connector 404 may be plated with solder, silver, nickel, or other metal(s) and alloy(s) to facilitate its surface mount to soldering pads on the PCB and its attachment to stiffener 112. Metal pads on the PCB may be connected to a PCB ground plane to shorten the length of electrical current return paths, as well as enhance the conductive heat dissipation path from IC die 102 to the PCB.

Figure 14:
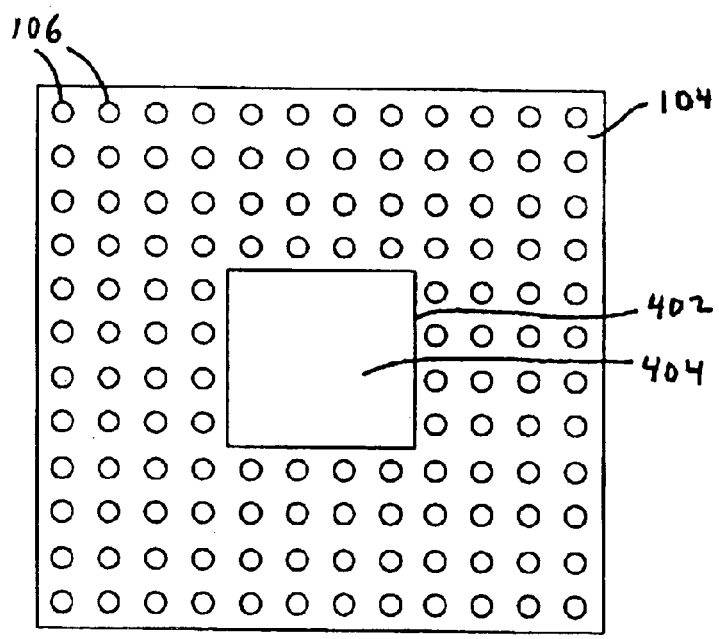

FIG. 14 illustrates a view of an example bottom surface of die-up BGA package 400, with solder balls 106 arranged around ground/thermal connector 404 on the bottom surface of substrate 104.

The present invention is applicable to improving thermal and electrical performance in the BGA package types described herein, and further BGA package and other IC package types.

3.0 BGA Embodiments According to the Present Invention

Further details of structural and operational implementations of ball grid array packages of the present invention are described in the following sections, along with processes for assembling the ball grid array packages. These implementations and processes are described herein for illustrative purposes, and are not limiting. For instance, the present invention as described herein can be implemented in both die-up and die-down BGA package types, as well as other IC package types. Furthermore, each of the embodiments presented below are applicable to tape substrate BGA packages, plastic substrate BGA packages, and ceramic substrate BGA packages. The description below is adaptable to these and other package types, as would be understood to persons skilled in the relevant art(s) from the teachings herein. For instance, in plastic substrate BGA packages, and some tape BGA packages, a stiffener may not be required in the BGA package.

Features of each of the embodiments presented below may be incorporated into BGA packages independently, or may be combined in any manner, as would be apparent to persons skilled in the relevant art(s) from the teachings herein.

3.1 BGA Embodiments with Two Substrates

According to embodiments of the present invention, a BGA package includes two package substrates. A package substrate is attached to both the top and bottom surfaces of the package stiffener. The presence of two package substrates provides the BGA package with greater routing capability, greater package I/O capacity, and improved thermal stress relief, among other advantages.

Figure 5:
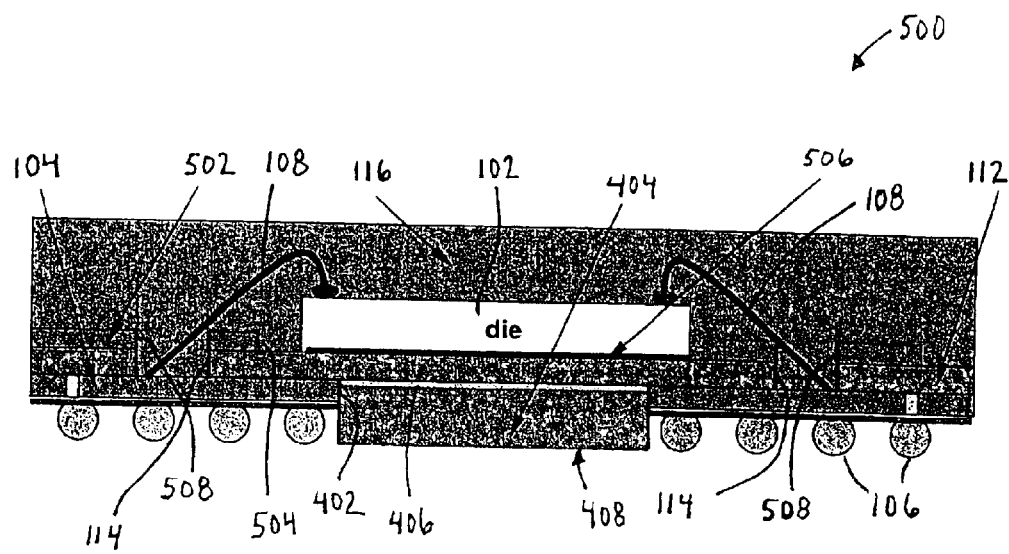
FIG. 5 shows a cross-sectional view of a BGA package with two substrates and a thermal connector, according to an embodiment of the present invention.

FIG. 5 illustrates a cross-sectional view of a die-up BGA package 500, according to an embodiment of the present invention. BGA package 500 includes IC die 102, first substrate 104, plurality of solder balls 106, one or more wire bonds 108, stiffener 112, encapsulant 116, thermal/ground connector 404, adhesive or solder material 406, and a second substrate 502. Refer to the discussion above related to FIGS. 1A, 1B, 3, and 4 for additional detail on the structure and operation of some of these elements.

As shown in FIG. 5, a top surface of first substrate 104 is attached to a bottom first surface of stiffener 112, and a bottom surface of second substrate 502 is attached to a top second surface of stiffener 112. The addition of second substrate 502 to a BGA package allows for numerous advantages described herein.

Second substrate 502 may be produced in a similar fashion as first substrate 104. When first and second substrates 104 and 502 are tape substrates, second substrate 502 may be made from one or more conductive layers bonded with a dielectric material. For instance, the dielectric material may be made from various substances, such as polyimide tape. The conductive layers are typically made from a metal, or combination of metals, such as copper and aluminum. Trace or routing patterns are made in the conductive layer material. Substrate 502 may be a single-layer tape, a two-layer tape, or additional layer tape substrate type. In a two-layer tape, the metal layers sandwich the dielectric layer, such as in a copper-Upilex-copper arrangement. In alternative embodiments, first and/or second substrates 104 and 502 may be plastic or ceramic substrates. Further details on forming tape substrate versions of first and second substrates 104 and 502 are provided in section 3.3 below.

Stiffener 112 provides stiffness to BGA package 500. Stiffener 112 may also operate as a ground or power plane, and may provide enhanced thermal spreading for the BGA package, as described in section 2.0 above.

Figure 7:
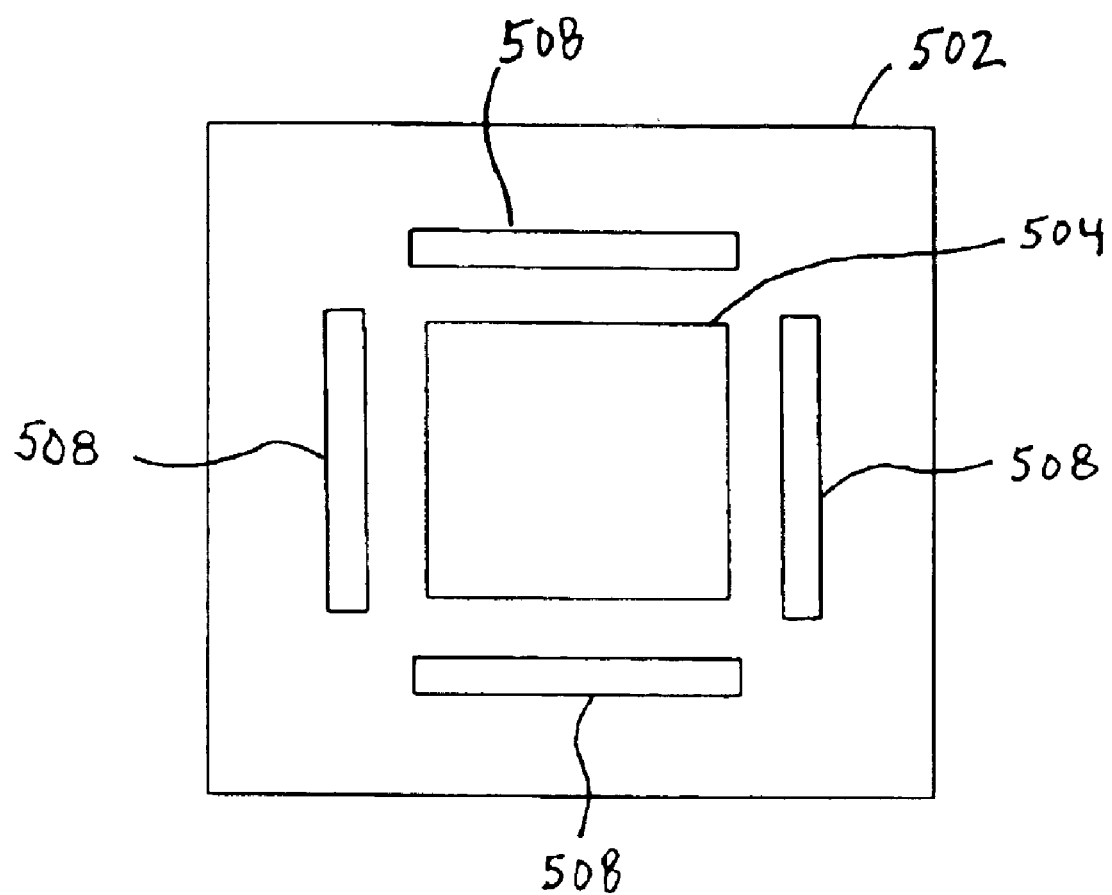
FIG. 7 illustrates a top view of a BGA package substrate with exemplary wire bond openings and a central opening, according to an embodiment of the present invention.

FIG. 7 illustrates a top view of second substrate 502 that has exemplary wire bond openings 508 and a centrally located opening 504, according to an embodiment of the present invention. IC die 102 may attach to stiffener 112 through centrally located opening 504. A portion of the top surface of stiffener 112 may be plated with a centrally located die-attach pad 506 for attachment of IC die 102.

Centrally located opening 504 may be formed in any shape. Centrally located opening 504 may be sized to conform closely to IC die 102, such that there is no substantial gap between the edges of centrally located opening 504 and the outer edges of IC die 102. Alternatively, centrally located opening 504 can be sized so that a gap exists between the edges of centrally located opening 504 and one or more edges of IC die 102. In such an configuration, a portion of the top surface of stiffener 112 is exposed between IC die 102 and second substrate 502.

Wire bond openings 508 in second substrate 502 allow for wire bonds to pass through second substrate 502. For illustrative purposes, wire bond openings 508 are shown in FIG. 7 as having a substantially rectangular shape. Wire bond openings 508 may have any shape that allows wire bonds to pass through, as would be understood by persons skilled in the relevant art(s) from the teachings herein. For example, wire bond openings 508 may be circular, elliptical, rectangular, or any other polygon or shape. Furthermore, any number of one or more wire bond openings 508 may be present in second substrate 502, as required by the particular application.

Figure 6:
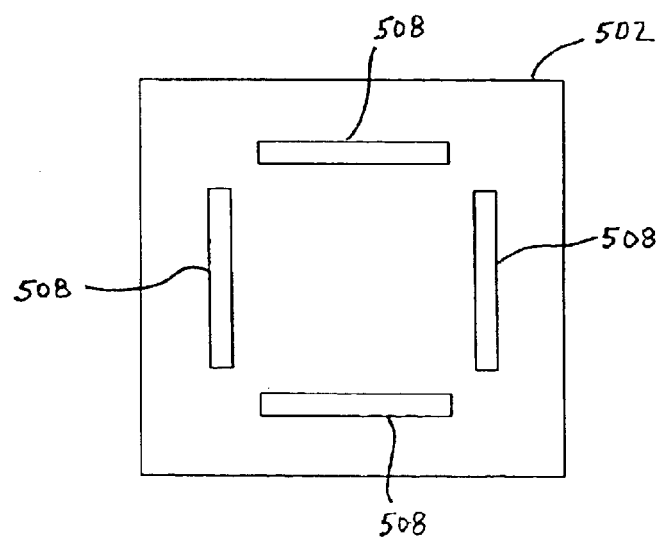
FIG. 6 illustrates a top view of a BGA package substrate with exemplary wire bond openings, according to an embodiment of the present invention.
Figure 12:
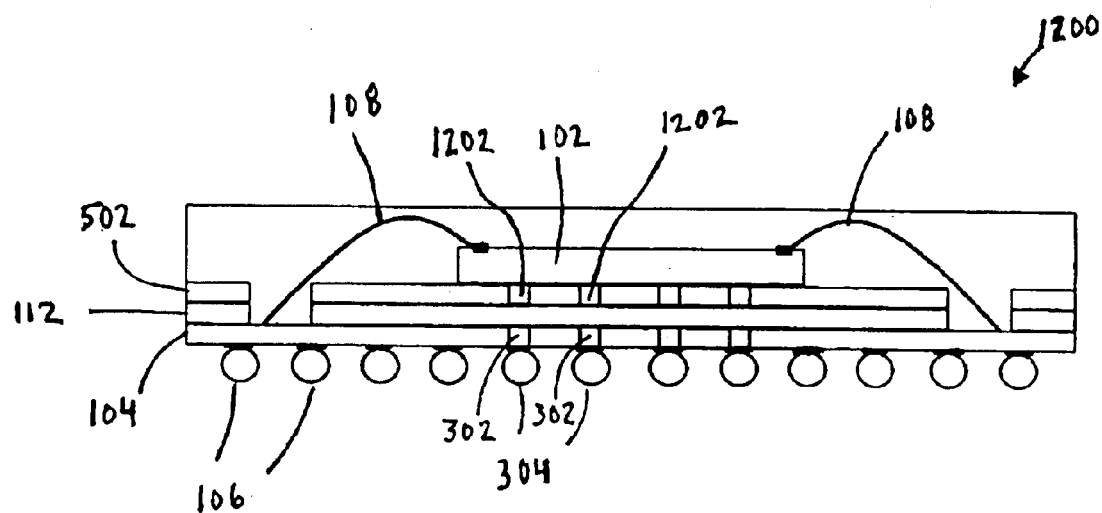
FIG. 12 shows a cross-sectional view of a BGA package with two substrates, according to an embodiment of the present invention.

In alternative embodiments, second substrate 502 may not include a centrally located opening 504. FIG. 6 illustrates a top view of a second substrate 502 that does not include a centrally located opening, according to an embodiment of the present invention. FIG. 12 shows a cross-sectional view of a BGA package 1200 that includes second substrate 502 as shown in FIG. 6, according to an embodiment of the present invention. In FIG. 12, IC die 102 is attached to the top surface of second substrate 502. A centrally located portion of the top surface of second substrate 502 may have a die attach pad plated or otherwise formed thereon, to enhance the attachment of IC die 102 to second substrate 502. Note that attachment of IC die 102 to stiffener 112 rather than to second substrate 502 may allow for greater thermal transfer from IC die 102 to stiffener 112.

A BGA package having two substrates may be further enhanced for improved thermal and electrical coupling with the PCB, according to the present invention. For example, stiffener 112 may be coupled more directly to a PCB through the use of a ground/thermal connector and/or additional conductive vias. These configurations are described as follows.

As shown in FIG. 5, ground/thermal connector 404 is coupled to a portion of the bottom surface of stiffener 112 by adhesive or solder material 406 through centrally located opening 402. As described above, bottom surface 408 of ground/thermal connector 404 may be plated with solder, silver, or other materials to facilitate surface mount to soldering pads on a PCB. When mounted to the PCB, ground/thermal connector 404 may operate as a ground or power connection between stiffener 112 and PCB ground or power signals. When ground/thermal connector 404 operates as a ground or power connection, it shortens the length of electrical current return paths.

Ground/thermal connector 404 also enhances the conductive heat dissipation path from IC die 102 to the PCB. Stiffener 112 is a relatively good conductor of heat. However, first substrate 104 is relatively inefficient at conducting heat, and effectively forms a thermal barrier between IC die 102 and the PCB. When ground/thermal connector 404 is not present, heat must conduct from IC die 102 through stiffener 112, first substrate 104, and solder balls 106 to the PCB. When ground/thermal connector 404 is present, heat may conduct relatively more efficiently through stiffener 112 and ground/thermal connector 404 to the PCB.

Figure 8:
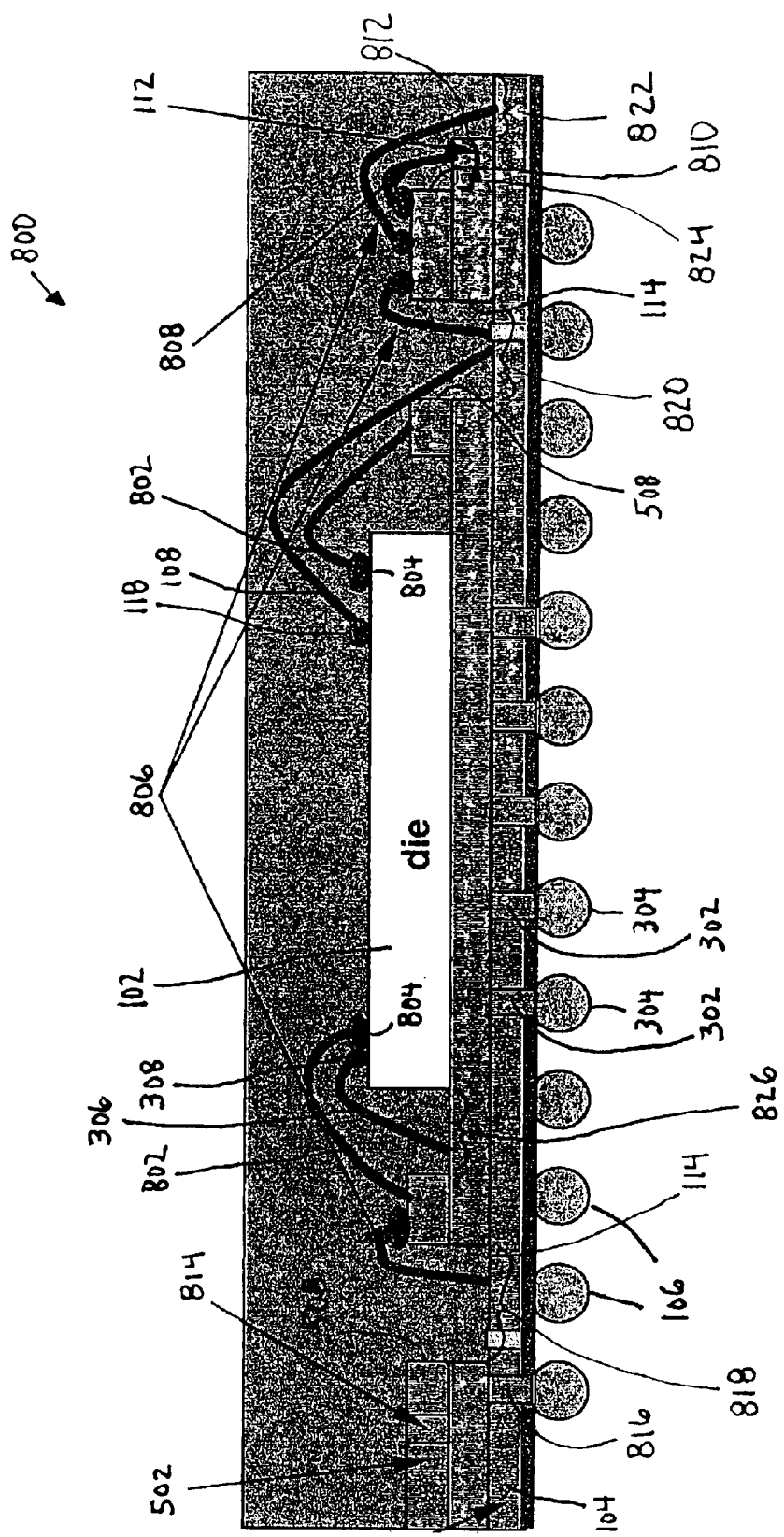
FIG. 8 shows a cross-sectional view of a BGA package with two substrates, according to an embodiment of the present invention.
Figure 16:
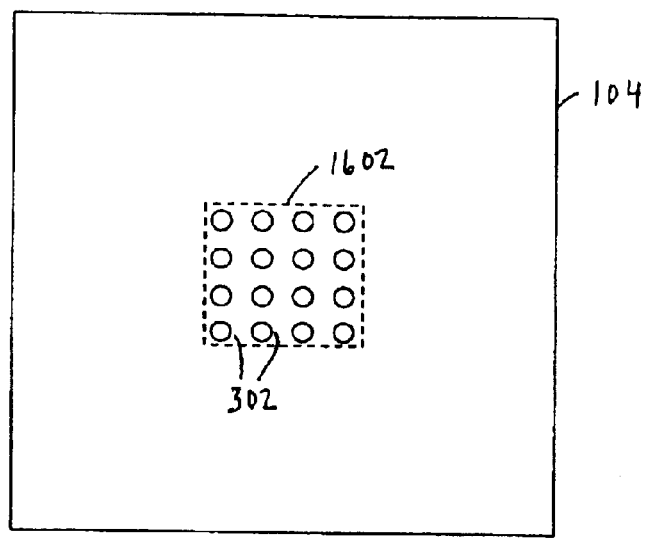
FIG. 16 shows an exemplary arrangement for centrally located vias in a first substrate, according to an embodiment of the present invention.

In an alternative embodiment, thermal vias may be present in first substrate 104 to perform the functions of thermal and electrical coupling to a PCB. FIG. 8 shows a cross-sectional view of a BGA package 800 that has two substrates, according to an embodiment of the present invention. As shown in FIG. 8, one or more centrally located vias 302 in first substrate 104 may be used to couple stiffener 112 to a PCB through thermal solder balls 304. This configuration of BGA package 800 is similar to the configuration of BGA package 300 described above and shown in FIG. 3. FIG. 16 shows an exemplary arrangement for centrally located vias 302 in first substrate 104, according to an embodiment of the present invention (other features and vias of first substrate 104 are not shown in FIG. 16). As shown in FIG. 16, centrally located vias 302 are located in first substrate 104 within an outer profile 1602 of IC die 102. Outer profile 1602 is an outer profile of a region underneath IC die 102 that exists when IC die 102 is mounted to top of the BGA package. Centrally located vias 302 may be conductively filled (e.g., with solder) to enhance their connectivity. Note that centrally located vias 302 may be arranged differently than shown in FIG. 16, and more or fewer centrally located vias 302 may be present in first substrate 104. Vias 302 may also be located in first substrate 104 overlapping or outside of outer profile 1602.

In an embodiment, centrally located vias 302 in substrate 104 couple stiffener 112 to thermal solder balls 304 attached to the bottom surface of first substrate 104. Thermal solder balls 304 are attached to solder ball pads exposed through a solder mask on the bottom surface of first substrate 104. Centrally located vias 302 are coupled directly to, or through traces on the bottom surface of first substrate 104, to the solder ball pads.

Furthermore, as shown in FIG. 12, when IC die 102 is coupled to the top surface of second substrate 502, one or more centrally located vias 1202 may be located in second substrate 502 to provide improved thermal coupling between IC die 102 and stiffener 112.

Embodiments of the present invention allow for a variety of substrate routing schemes and wire bond connections to be present in a BGA package. These routing schemes and wire bond connections at least allow for: (i) signals of IC die 102 to interface with signals of the PCB; (ii) signals of IC die 102 to interface with any additional electronic devices present in the BGA package (such as those described below in section 3.2); (iii) signals of any additional electronic devices in the BGA package (if present) to interface with signals of the PCB; and (iv) allow for enhanced connectivity to a stiffener power or ground plane.

Many wire bond connections are possible. For example, wire bonds may couple signal pins of IC die 102 to stiffener 112, to bond fingers/traces/surface pads of first substrate 104, and/or to bond fingers/traces/surface pads of second substrate 502. Wire bonds may also couple stiffener 112 to bond fingers/traces/surface pads of first substrate 104 and/or to bond fingers/traces/surface pads of second substrate 502. Wire bonds may additionally couple bond fingers/traces/surface pads of first substrate 104 to bond fingers/traces/surface pads of second substrate 502. Some examples of these types of wire bond connections are described below.

Wire bonds and trace/routing patterns in first and second substrates 104 and 502 allow signals in IC die 102 to be coupled eventually to solder balls 106 on the bottom surface of first substrate 104. Wire bonds may couple pins on IC die 102 to bond fingers/traces/surface pads of first substrate 104. For example, as shown in FIG. 5, wire bonds 108 are coupled between IC die 102 and a surface of first substrate 104 through wire bond openings 508 and stiffener openings 114.

As shown in FIG. 8, signal bond fingers/traces/surface pads of second substrate 502 may be coupled to bond fingers/traces/surface pads of first substrate 104. For example, wire bonds 806 couple between the top surface of second substrate 502 and traces (not shown) on a first surface portion 818, a second surface portion 820, and a third surface portion 822 of the top surface of first substrate 104. Wire bonds 806 also extend through openings 508 and 114. Also as shown in FIG. 8 one or more vias 816 in first substrate 104 couple traces on the top surface of first substrate 104 through first substrate 104 to traces and solder balls 106 on the bottom surface of first substrate 104.

Wire bonds may couple pads on IC die 102 to bond fingers/traces/surface pads of second substrate 502, and to stiffener 112. For example, as shown in FIG. 8, wire bond 802 couples IC die pad 804 to a trace (not shown) on the top surface of second substrate 502. Furthermore, wire bond 306 couples IC die pad 308 to stiffener surface portion 826 on the top surface of stiffener 112. Stiffener 112 may be have one or more metal plated (e.g., gold, silver, etc.) pads on its surface to enhance attachment of wire bonds.

Wire bonds may also couple bond fingers/traces/surface pads of second substrate 502 to stiffener 112. For example, as shown in FIG. 8, wire bond 808 couples a trace (not shown) on the top surface of second substrate 502 to a trace (not shown) on stiffener surface portion 824 on the top surface of stiffener 112 Second substrate 502 has a second substrate edge 810 formed to exposed stiffener surface portion 824.

Figure 9:
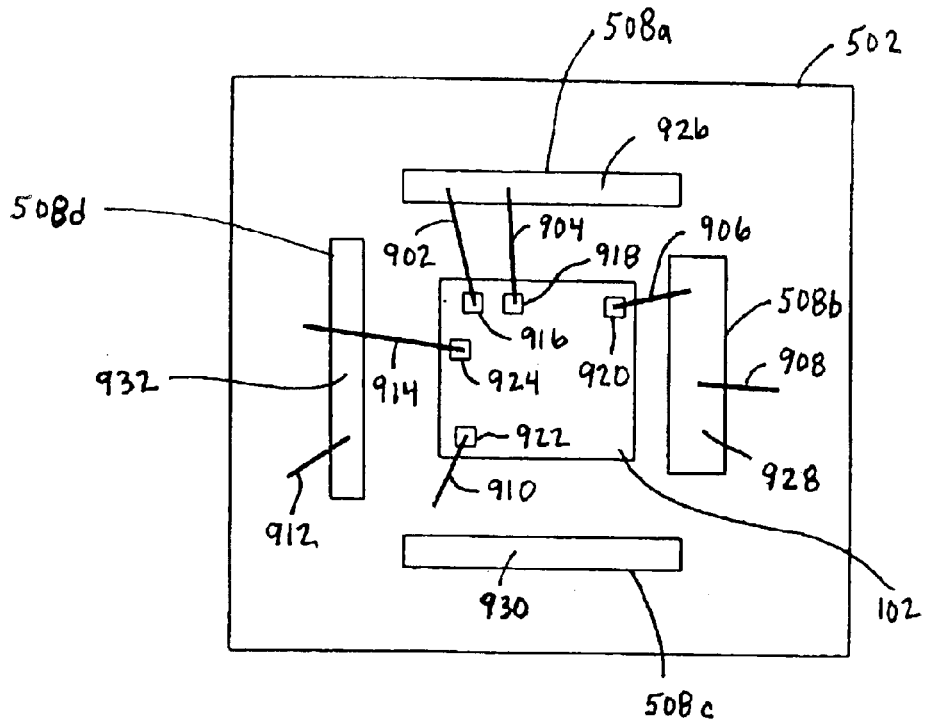
FIGS. 9 and 10 illustrate top views of die-up tape BGA packages with exemplary wire bond attachments, according to embodiments of the present invention.
Figure 10:
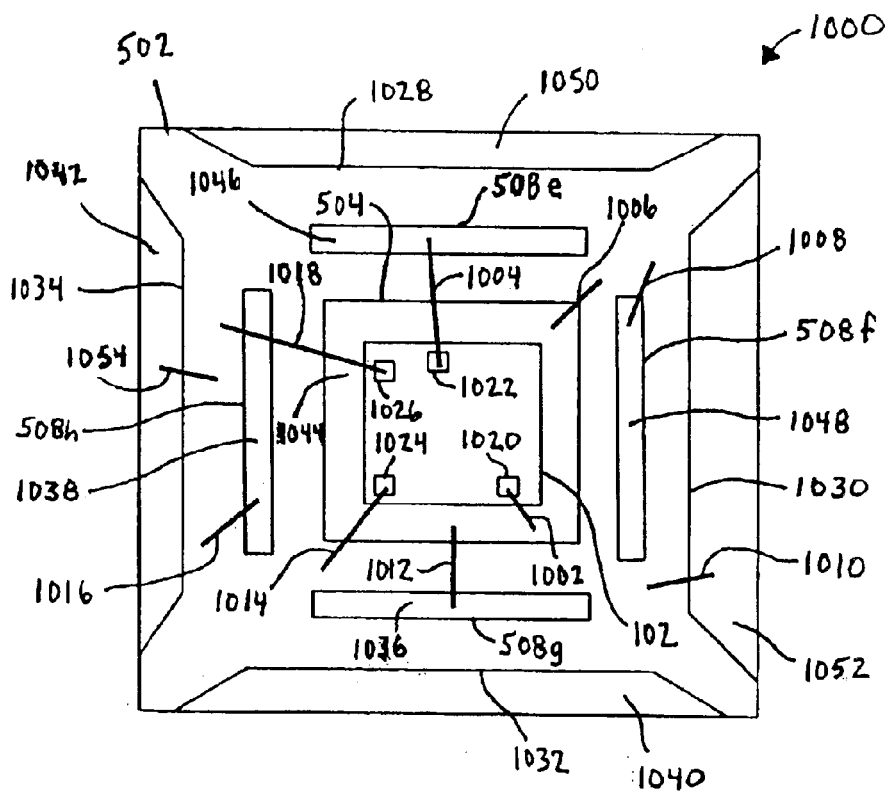

FIGS. 9 and 10 illustrate example wire bond attachments from atop view perspective for die-up BGA packages having two substrates. FIG. 9 illustrates a die-up BGA package 900 with IC die 102 attached to the top surface of second substrate 502. FIG. 10 illustrates a die-up BGA package 1000 with IC die 102 attached to the top surface of stiffener 112 through centrally located opening 504 in second substrate 502.

As shown for BGA package 1000 in FIG. 10, second substrate 502 includes centrally located opening 504 and a fifth, a sixth, a seventh, and an eighth opening 508e, 508f, 508g, and 508h. These openings expose portions of the top surface of stiffener 112. Centrally located opening 504 exposes a stiffener surface portion 1044. Fifth opening 508e exposes a stiffener surface portion 1046. Sixth opening 508f exposes a stiffener surface portion 1048. Each of these openings are formed to allow one or more wire bonds to attach to the exposed portion of stiffener 112 through the respective opening. Stiffener 112 may have contact pads formed or plated thereon (not shown in FIGS. 9 and 10) to enhance attachment of wire bonds.

As shown in FIG. 10, a wire bond 1002 couples a first I/O pad 1020 on IC die 102 to stiffener surface portion 1044 through centrally located opening 504. A wire bond 1004 couples a second I/O pad 1022 on IC die 102 to stiffener surface portion 1046 through fifth opening 508e. A wire bond 1006 couples a trace (not shown) on the top surface of second substrate 502 to stiffener surface portion 1044 through centrally located opening 504. A wire bond 1008 couples a trace (not shown) on the top surface of second substrate 502 to stiffener surface portion 1048 through sixth opening 508f.

In embodiments, second substrate 502 may have at least one edge formed to expose a portion of the top surface of stiffener 112. As shown in FIG. 10, second substrate 502 includes a first edge 1028 and a second edge 1030 that expose portions of the top surface of stiffener 112. First edge 1028 exposes a stiffener surface portion 1050. Second edge 1030 exposes a stiffener surface portion 1052. First and second edges 1028 and 1030 are formed to allow one or more wire bonds to attach to the exposed portions of stiffener 112. The wire bonds may attach stiffener 112 to any one or more of IC die 102, traces on the top surface of first substrate 104, and/or traces on the top surface of second substrate 502. For example, FIG. 10 shows a wire bond 1010 that couples a trace (not shown) on the top surface of second substrate 502 to stiffener surface portion 1052.

In embodiments, second substrate 502 and stiffener 112 may have one or more overlapping openings that expose a portion of the top surface of first substrate 104. As shown in FIG. 9, second substrate 502 of BGA package 900 includes a first, a second, a third, and a fourth opening 508a, 508b, 508c, and 508d. First opening 508a and an overlapping opening in stiffener 112 expose a first substrate surface portion 926. Second opening 508b and an overlapping opening in stiffener 112 expose a first substrate surface portion 928. Third opening 508c and an overlapping opening in stiffener 112 expose a first substrate surface portion 930. Fourth opening 508d and an overlapping opening in stiffener 112 expose a first substrate surface portion 932.

Wire bonds may attach to the exposed portions of first substrate 104. For example, as shown in FIG. 9, a wire bond 902 couples a first I/O pad 916 on IC die 102 to a trace (not shown) on first substrate surface portion 926 through first opening 508a and the corresponding opening in stiffener 112. A wire bond 904 couples a second I/O pad 918 on IC die 102 to first substrate surface portion 926 through first opening 508a and the corresponding opening in stiffener 112. A wire bond 906 couples a third I/O pad 920 on IC die 102 to first substrate surface portion 928 through second opening 508b and the corresponding opening in stiffener 112. A wire bond 908 couples a trace (not shown) on second substrate 502 to a trace (not shown) on first substrate surface portion 928 through second opening 508b and the corresponding opening in stiffener 112.

As shown in FIG. 10, second substrate 502 includes seventh opening 508g and eighth opening 508h that overlap with openings in stiffener 112 to expose portions of the top surface of first substrate 104. Seventh opening 508g and an overlapping opening in stiffener 112 expose a first substrate surface portion 1036. Eighth opening 508h and an overlapping opening in stiffener 112 expose a first substrate surface portion 1038. Each of these openings are formed to allow one or more wire bonds to attach to the exposed portion of first substrate 104 through the respective openings in second substrate 502 and stiffener 112.

As shown in FIG. 10, a wire bond 1012 couples stiffener surface portion 1044 to a trace (not shown) on first substrate surface portion 1036 through seventh opening 508g and a corresponding opening in stiffener 112. A wire bond 1016 couples a trace (not shown) on the top surface of second substrate 502 to a trace (not shown) on first substrate surface portion 1038 through eighth opening 508h and a corresponding opening in stiffener 112.

In embodiments, second substrate 502 and stiffener 112 have one or more edges formed to expose a portion of the top surface of first substrate 104. As shown in FIG. 10, second substrate 502 includes a third edge 1032 and a fourth edge 1034 that expose portions of the top surface of first substrate 104. Third edge 1032 and an edge of stiffener 112 expose a first substrate surface portion 1040. Fourth edge 1034 and an edge of stiffener 112 expose a first substrate surface portion 1042. These edges are formed to allow one or more wire bonds to attach to the exposed portions of first substrate 104. The wire bonds may attach traces on the exposed portions of first substrate 104 to IC die 102, traces on the top surface of second substrate 502, and/or to the top surface of stiffener 112. For example, FIG. 10 shows a wire bond 1054 that couples a trace (not shown) on the top surface of second substrate 502 to a trace (not shown) on first substrate surface portion 1042.

Additional wire bond arrangements are also applicable to the present invention. For example, as shown in FIG. 9, a wire bond 910 couples a fourth IC die I/O pad 922 to a trace (not shown) on the top surface of second substrate 504. A wire bond 914 couples a fifth IC die I/O pad 924 to a trace (not shown) on the top surface of second substrate 504. As shown in FIG. 9, wire bond 914 extends over fourth opening 508d in second substrate 502. As shown in FIG. 10, a wire bond 1014 couples a third IC die I/O pad 1024 to a trace (not shown) on the top surface of second substrate 504. A wire bond 1018 couples a fourth IC die I/O pad 1026 to a trace (not shown) on the top surface of second substrate 504. As shown in FIG. 10, wire bond 1018 extends over eighth opening 508h in second substrate 502.

Figure 20A:
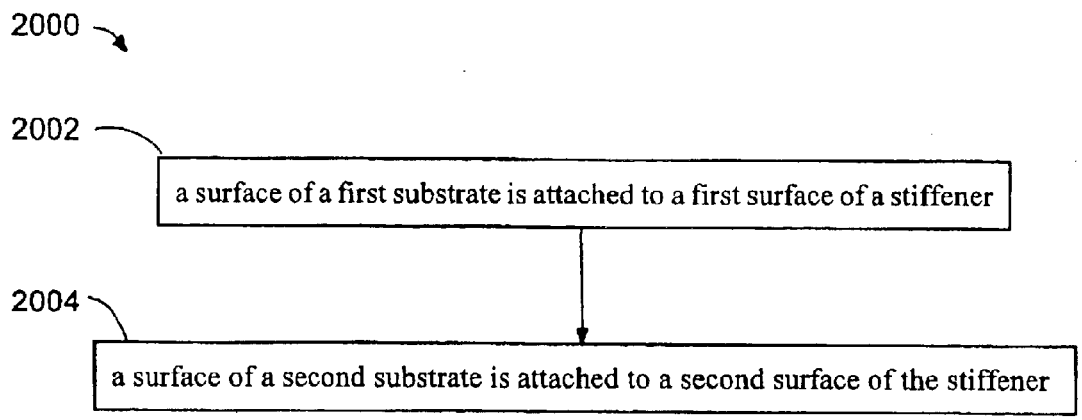

FIG. 20A shows a flowchart 2000 providing operational steps for assembling one or more embodiments of the present invention. FIGS. 20B-L provide operational steps according to further embodiments. Optional steps according to the further embodiments are indicated by dotted lines. The steps of FIGS. 20A–L do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

Flowchart 2000 begins with step 2002. In step 2002, a surface of a first substrate is attached to a first surface of a stiffener. For example, the first substrate is first substrate 104, and the stiffener is stiffener 112. First substrate 104 may be laminated or otherwise attached to stiffener 112.

In step 2004, a surface of a second substrate is attached to a second surface of the stiffener. For example, the second substrate is second substrate 502, which is attached to stiffener 112. Second substrate 502 may be laminated or otherwise attached to stiffener 112. First and second substrates 104 and 502 may be flex substrate types, or other substrate types suitable for a BGA package.

Figure 20B:
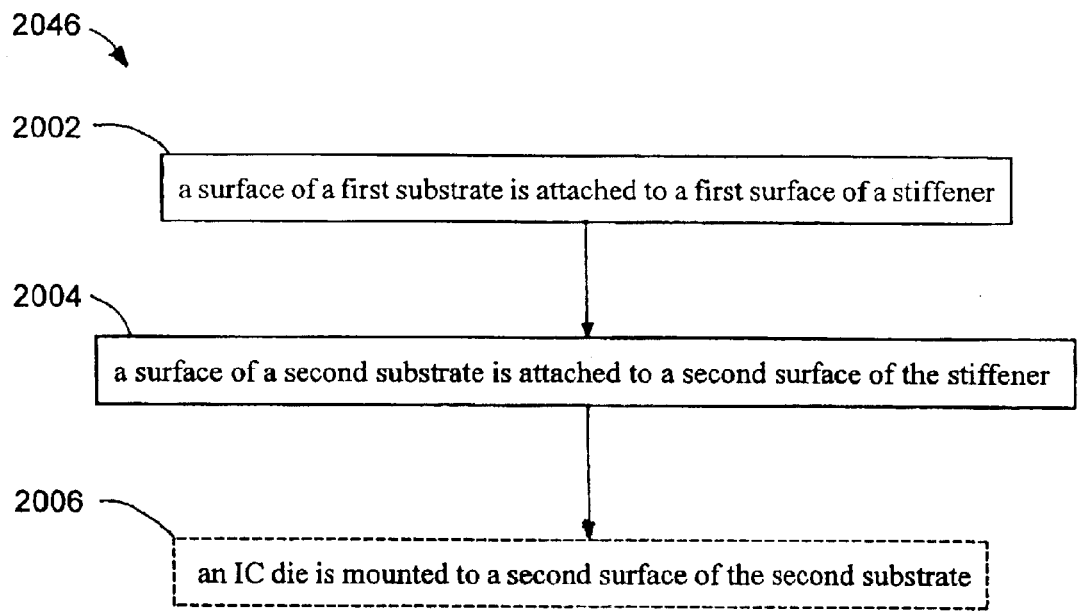

FIG. 20B provides a flowchart 2046 with an additional optional step for flowchart 2000 of FIG. 20A, according to an embodiment of the present invention. In step 2006, an IC die is mounted to a second surface of the second substrate. For example, the IC die is IC die 102, mounted to the top surface of second substrate 502, as shown in FIG. 5.

Figure 20C:
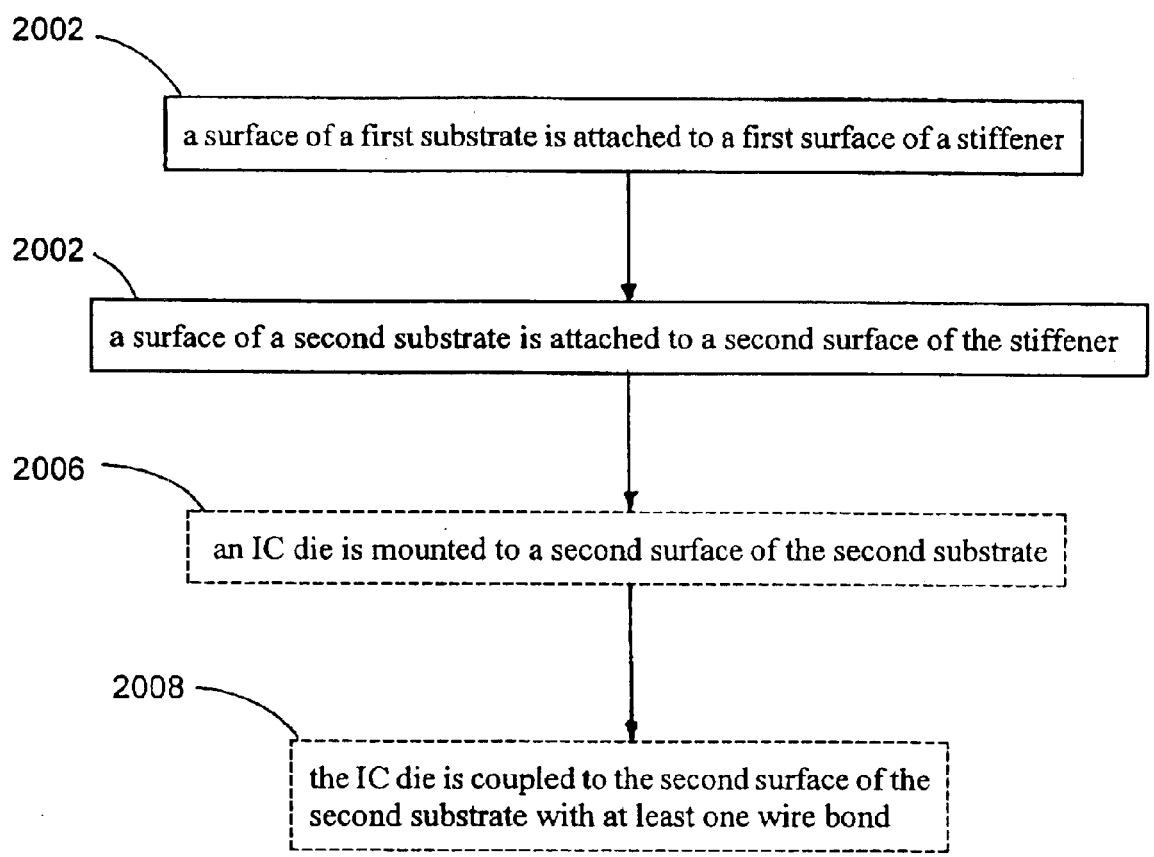

FIG. 20C provides an additional optional step for flowchart 2046 of FIG. 20B, according to an embodiment of the present invention. In step 2008, the IC die is coupled to the second surface of the second substrate with at least one wire bond. For example, IC die 102 is coupled to a trace (not shown) on the top surface of second substrate 502 with wire bond 806, as shown in FIG. 8.

Figure 20D:
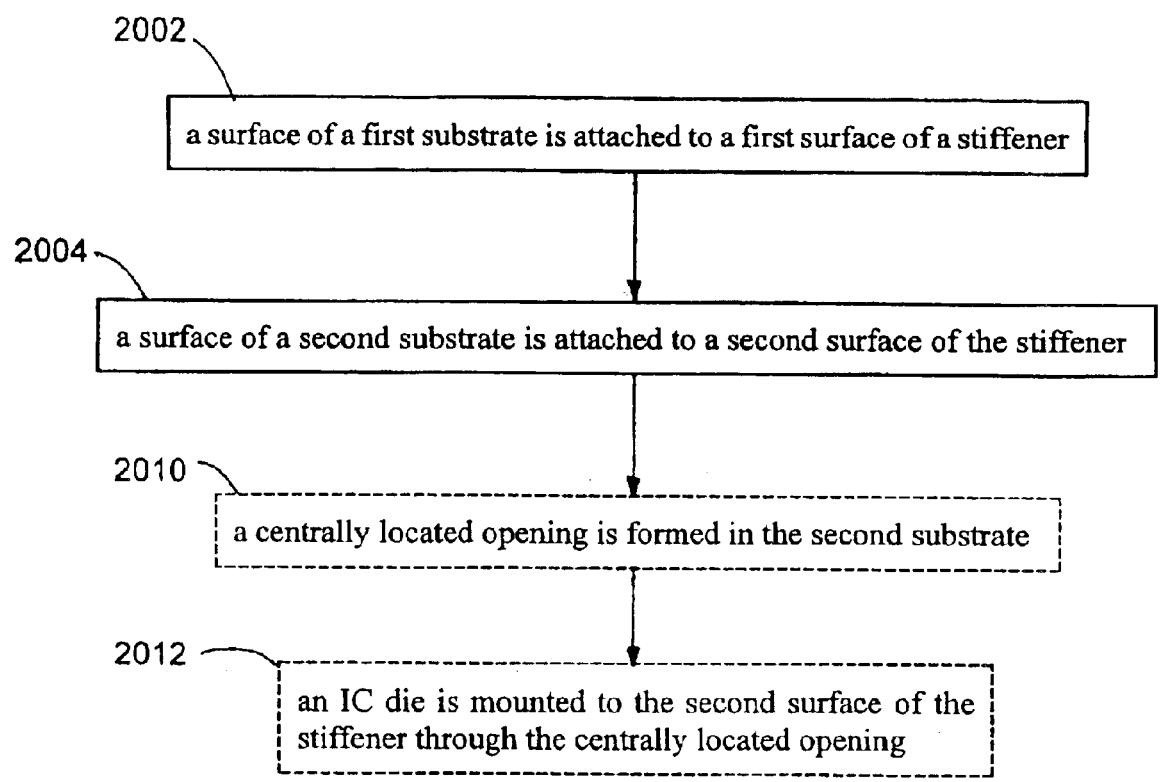

FIG. 20D provides additional optional steps for flowchart 2000 of FIG. 20A:

In an embodiment, flowchart 2000 further includes step 2010. In step 2010, a centrally located opening is formed in the second substrate. For example, the centrally located opening is centrally located opening 504 formed in second substrate 502, as shown in FIG. 5.

In an embodiment, flowchart 2000 further includes step 2012. In step 2012, an IC die is mounted to the second surface of the stiffener through the centrally located opening. For example, IC die 102 is mounted to the top surface of stiffener 112 through centrally located opening 504, as shown in FIG. 5.

Figure 20E:
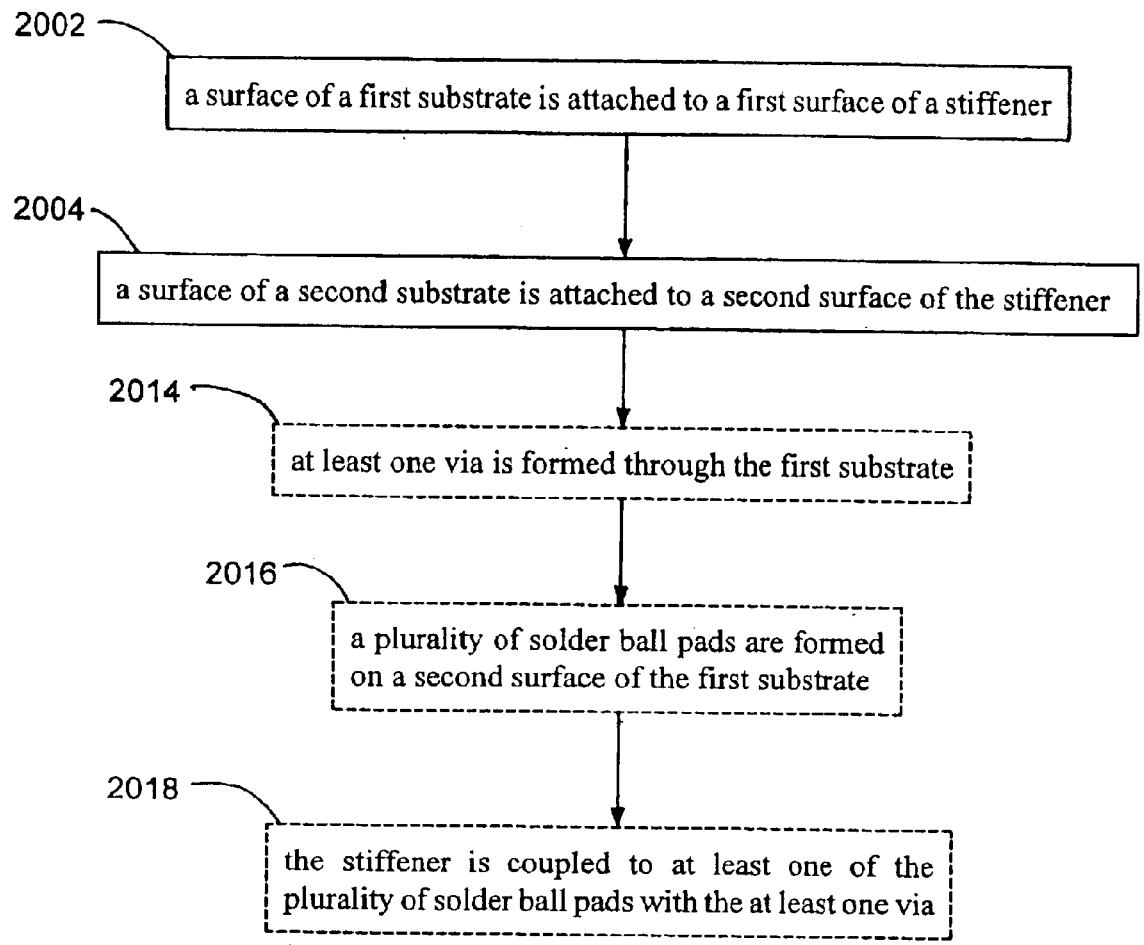

FIG. 20E provides additional optional steps for flowchart 2000 of FIG. 20A:

In an embodiment, flowchart 2000 further includes step 2014. In step 2014, at least one via is formed through the first substrate. For example, the at least one via may be via 302 and/or via 310, as shown in FIG. 3, or any other via in first substrate 104. In an embodiment, step 2014 may include the step where the at least one via is positioned in a central region of the first substrate. For example, the at least one via is one or more vias 302 formed in first substrate 104, as shown in FIG. 8. In an embodiment, step 2014 may include the step where the at least one via is filled with a conductive material, such as a solder.

In an embodiment, flowchart 2000 further includes step 2016. In step 2016, a plurality of solder ball pads are formed on a second surface of the first substrate. For example, the plurality of solder balls pads are solder ball pads exposed on the bottom surface of first substrate 104 through a solder mask. Solder balls 302 are attached to the exposed solder ball pads.

In an embodiment, flowchart 2000 further includes step 2018. In step 2018, the stiffener is coupled to at least one of the plurality of solder ball pads with the at least one via. For example, stiffener 112 is coupled to the solder ball pads by one or more vias 302.

Figure 20F:
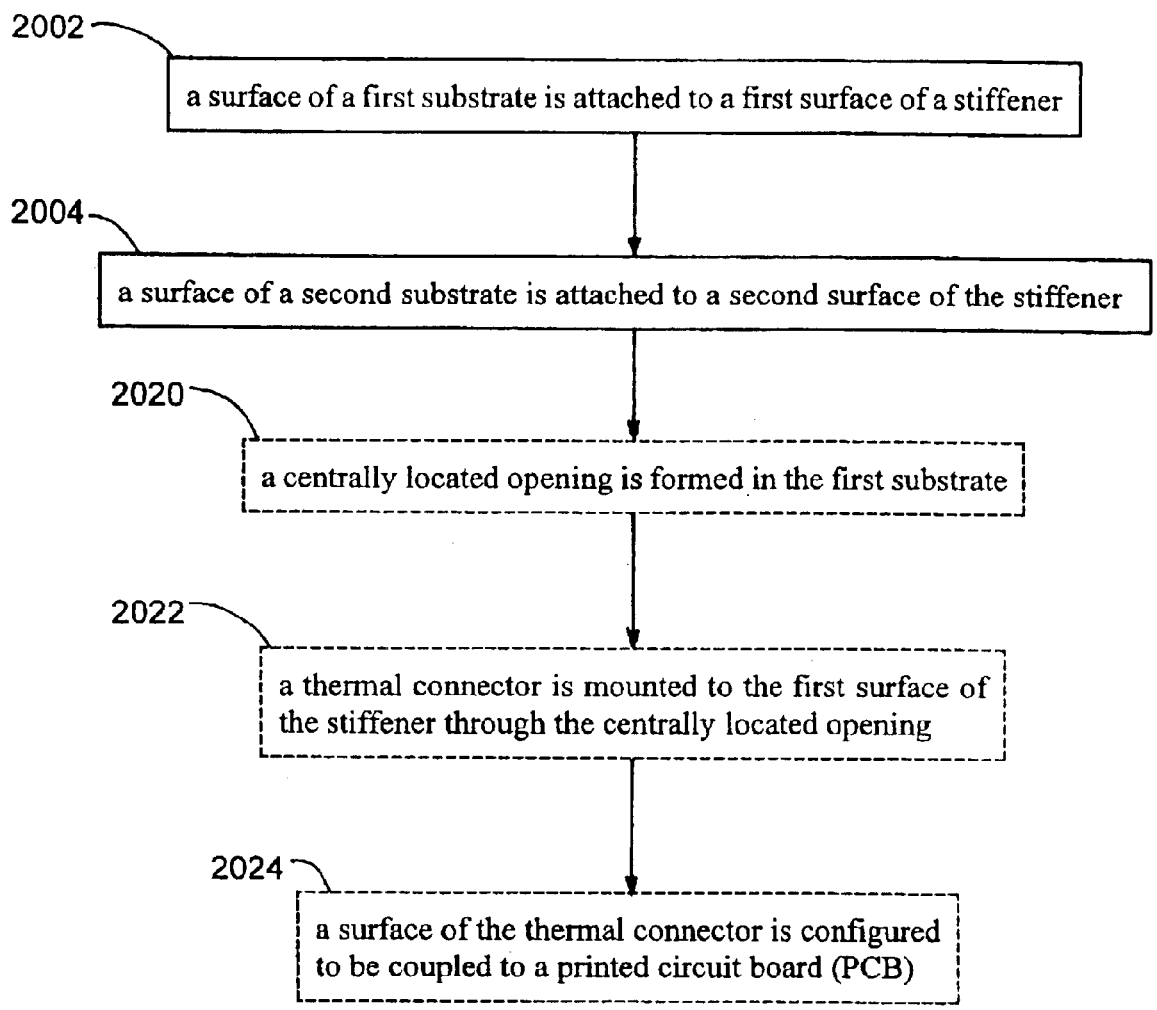

FIG. 20F provides additional optional steps for flowchart 2000 of FIG. 20A:

In an embodiment, flowchart 2000 further includes step 2020. In step 2020, a centrally located opening is formed in the first substrate. For example, the centrally located opening is centrally located opening 402 that is formed in first substrate 104, as shown in FIG. 5.

In an embodiment, flowchart 2000 further includes step 2022. In step 2022, a thermal connector is mounted to the first surface of the stiffener through the centrally located opening. For example, the thermal connector is ground/thermal connector 404, which is mounted to the bottom surface of stiffener 112 through centrally located opening 402, as shown in FIG. 5.

In an embodiment, flowchart 2000 further includes step 2024. In step 2024, a surface of the thermal connector is configured to be coupled to a printed circuit board (PCB). For example, the surface is bottom surface 408 of ground/thermal connector 404. In an embodiment, bottom surface 408 may be plated with solder to facilitate surface mount to soldering pads on a PCB.

Figure 20G:
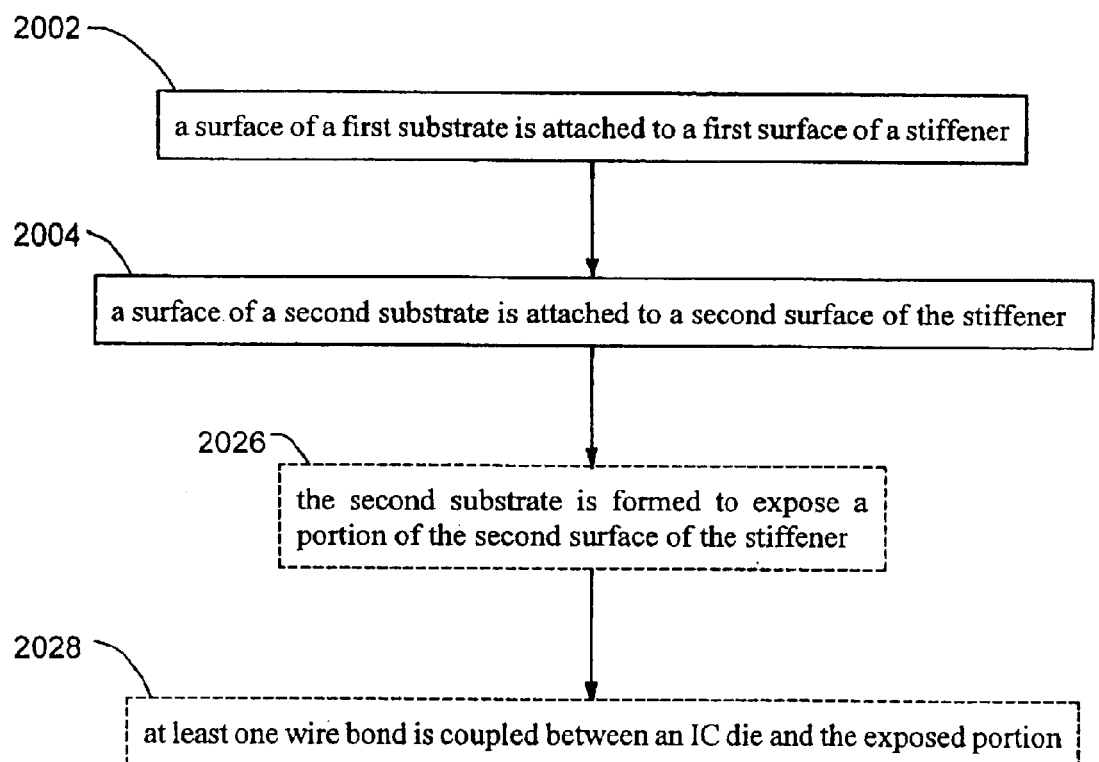

FIG. 20G provides additional optional steps for flowchart 2000 of FIG. 20A:

In an embodiment, flowchart 2000 further includes step 2026. In step 2026, the second substrate is formed to expose a portion of the second surface of the stiffener. For example, second substrate 502 may be formed to expose a portion of the top surface of stiffener 112. For example, second substrate 502 may be formed to include one or more of centrally located opening 504, fifth and sixth openings 508e and 508f, and first and second edges 1028 and 1030, as shown in FIG. 10. Accordingly, the exposed portion may be one or more of stiffener surface portions 1044, 1046, 1048, 1050, and 1052. In an embodiment, step 2026 may include the step where at least one opening is formed in the second substrate. For example, the at least one opening in second substrate 504 may be one or more of centrally located opening 504, and fifth and sixth openings 508e and 508f.

In an embodiment, flowchart 2000 further includes step 2028. In step 2028, at least one wire bond is coupled between an IC die and the exposed portion. For example, as shown in FIG. 10, the at least one wire bond may be wire bond 1002 coupled between IC die I/O pad 1020 and stiffener surface portion 1044, and/or wire bond 1004 coupled between IC die I/O pad 1022 and stiffener surface portion 1046.

In an embodiment, the at least one wire bond may be coupled between at least one trace on a second surface of the second substrate and the exposed portion. For example, the at least one wire bond may be wire bond 1006 coupled between a trace (not shown) on the top surface of second substrate 502 and first stiffener portion 1044, wire bond 1008 coupled between a trace (not shown) on the top surface of second substrate 502 and stiffener surface portion 1048, and/or wire bond 1010 coupled between a trace (not shown) on the top surface of second substrate 502 and stiffener surface portion 1052.

Figure 20H:
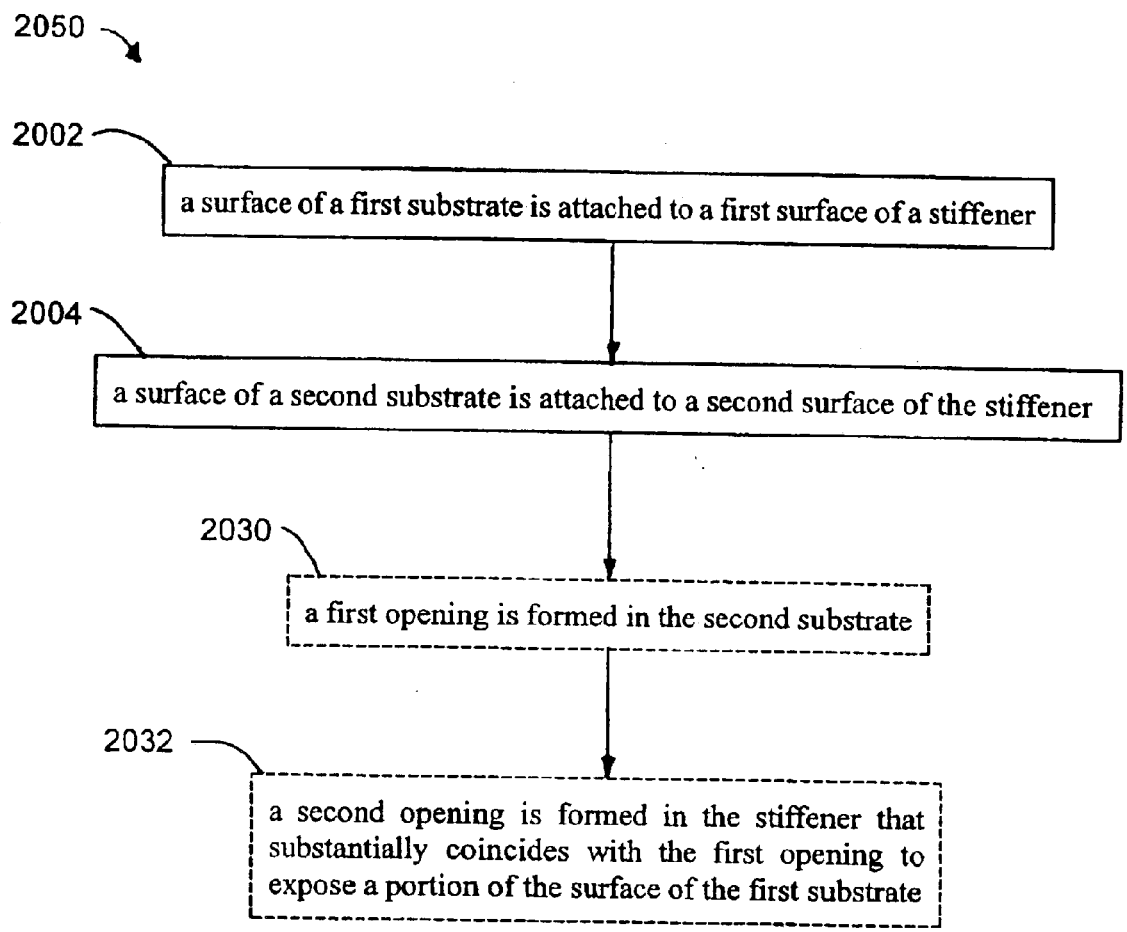

FIG. 20H provides a flowchart 2050 with additional optional steps for flowchart 2000 of FIG. 20A:

In an embodiment, flowchart 2000 further includes step 2030. In step 2030, a first opening is formed in the second substrate. For example, the first opening may be one of centrally located opening 504, wire bond openings 508, or may be the opening in second substrate 502 formed by second substrate edge 810, as shown in FIG. 8.

In an embodiment, flowchart 2000 further includes step 2032. In step 2032, a second opening is formed in the stiffener that substantially coincides with the first opening to expose a portion of the surface of the first substrate. For example, the second opening may be one of stiffener openings 114 in stiffener 112, or the opening in stiffener 112 formed by a stiffener edge 812, as shown in FIG. 8. Accordingly, the exposed portion of the surface of the first substrate may be one of first substrate surface portions 818, 820, and 822, for example.

Figure 20I:
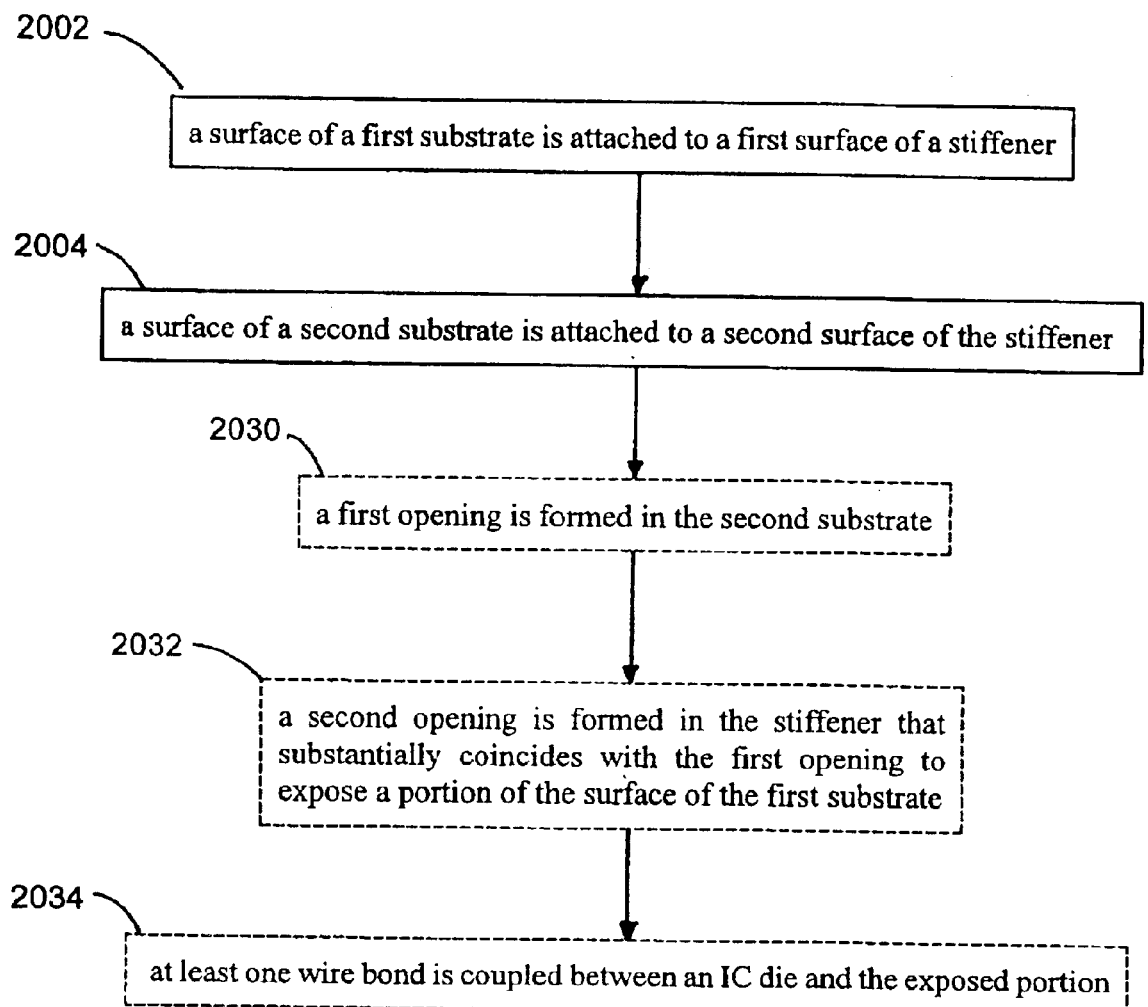

FIG. 20I provides an additional optional step for flowchart 2050 of FIG. 20H, according to an embodiment of the present invention. In step 2034, at least one wire bond is coupled between an IC die and the exposed portion. For example, the at least one wire bond may be wire bond 108 coupled between IC die pin 118 and a trace (not shown) on first substrate surface portion 820, as shown in FIG. 8.

Figure 20J:
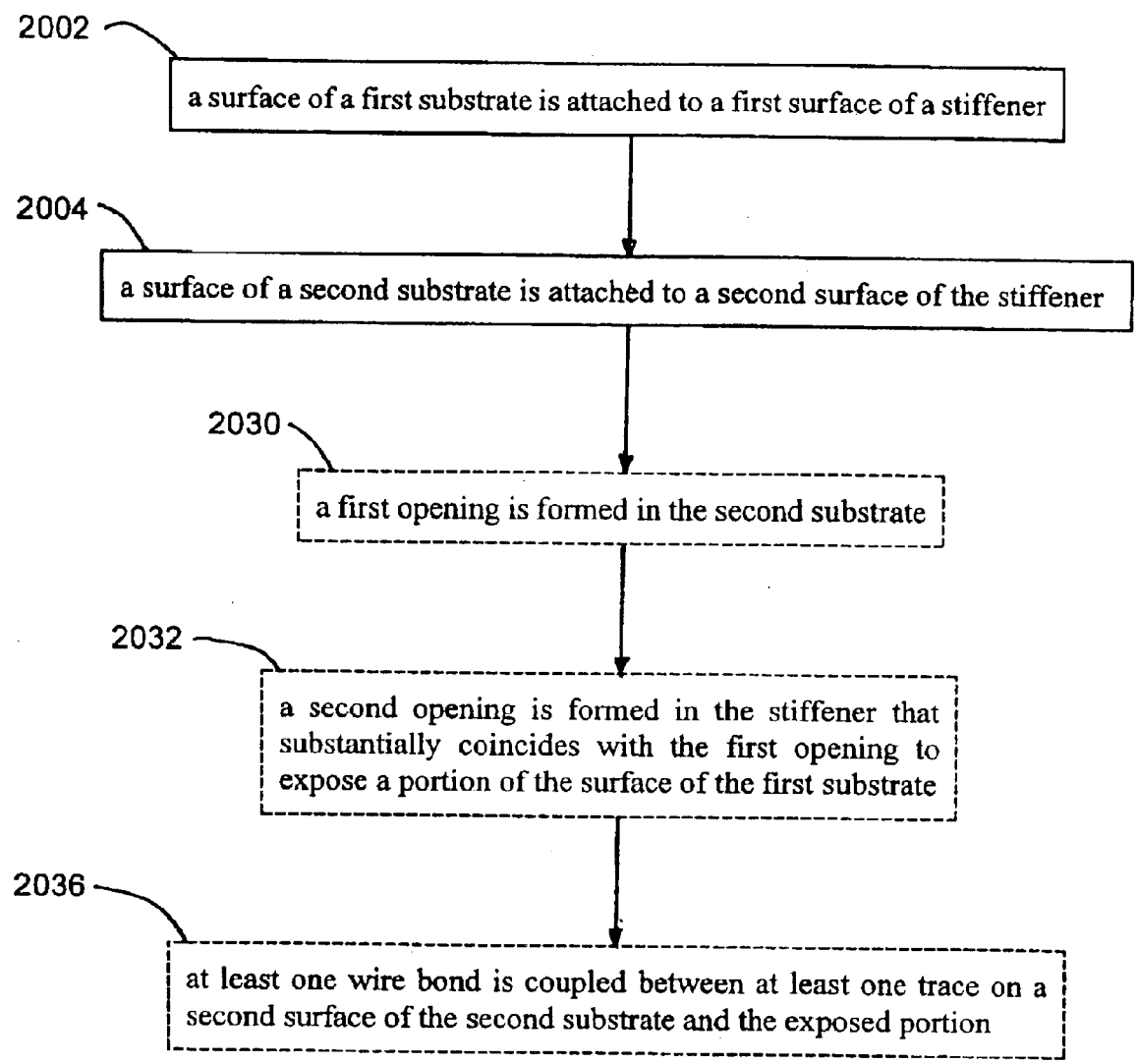

FIG. 20J provides an additional optional step for flowchart 2050 of FIG. 20H, according to an embodiment of the present invention. In step 2036, at least one wire bond is coupled between at least one trace on a second surface of the second substrate and the exposed portion. For example, the at least one wire bond may be one or more of wire bonds 806 coupled between a trace (not shown) on the top surface of second substrate 502 and traces (not shown) on first substrate surface portions 818, 820, and 822, as shown in FIG. 8.

Figure 20K:
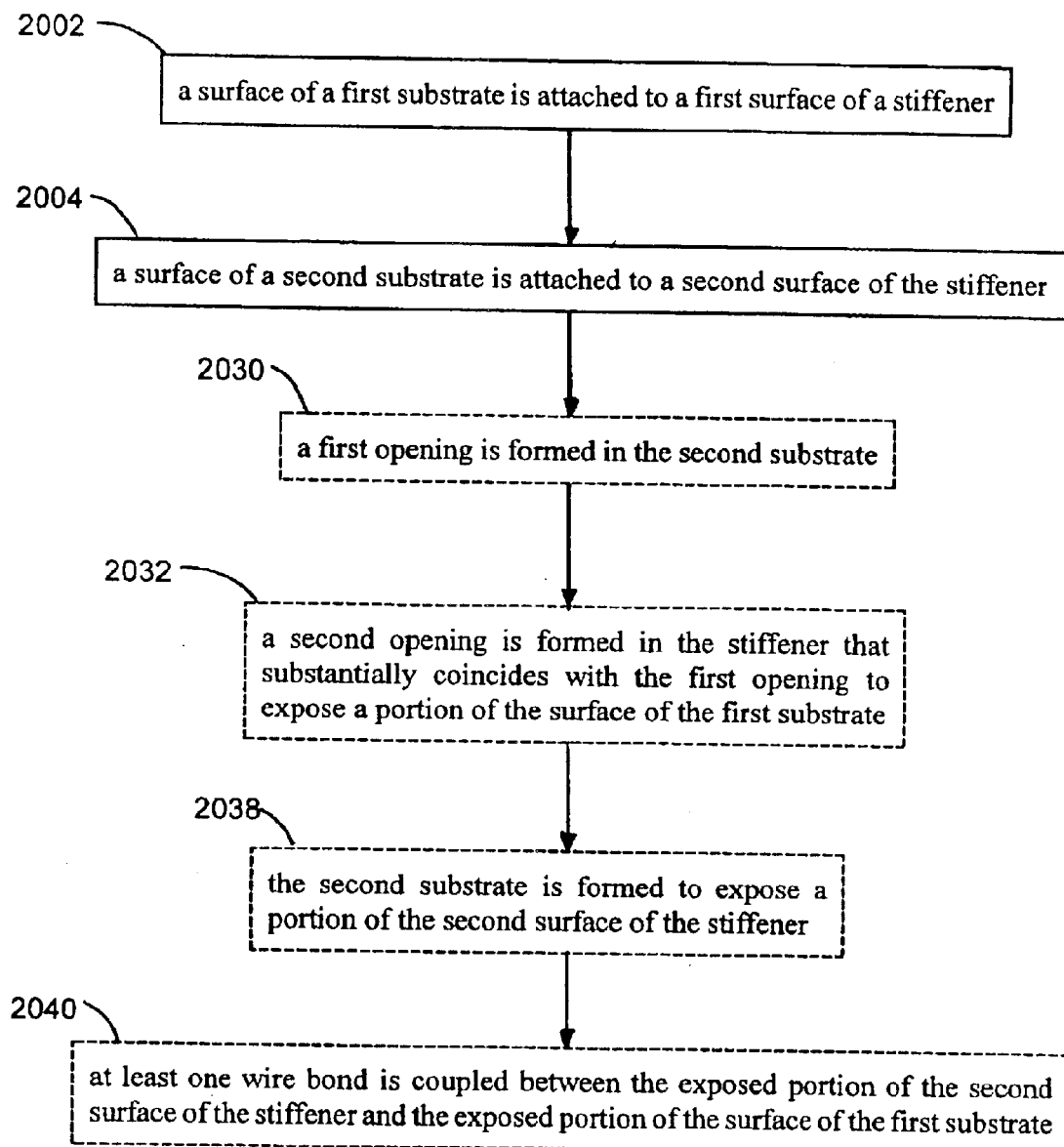

FIG. 20K provides additional optional steps for flowchart 2050 of FIG. 20H:

In an embodiment, flowchart 2050 further includes step 2038. In step 2038, the second substrate is formed to expose a portion of the second surface of the stiffener. For example, second substrate 502 may be formed to expose stiffener portion 824 on the top surface of stiffener 112, as shown in FIG. 8.

In an embodiment, flowchart 2050 further includes step 2040. In step 2040, at least one wire bond is coupled between the exposed portion of the second surface of the stiffener and the exposed portion of the surface of the first substrate. For example, the at least one wire bond may be wire bond 1012 coupled between stiffener surface portion 1044 and a trace (not shown) on first substrate surface portion 1036, as shown in FIG. 10.

Figure 20L:
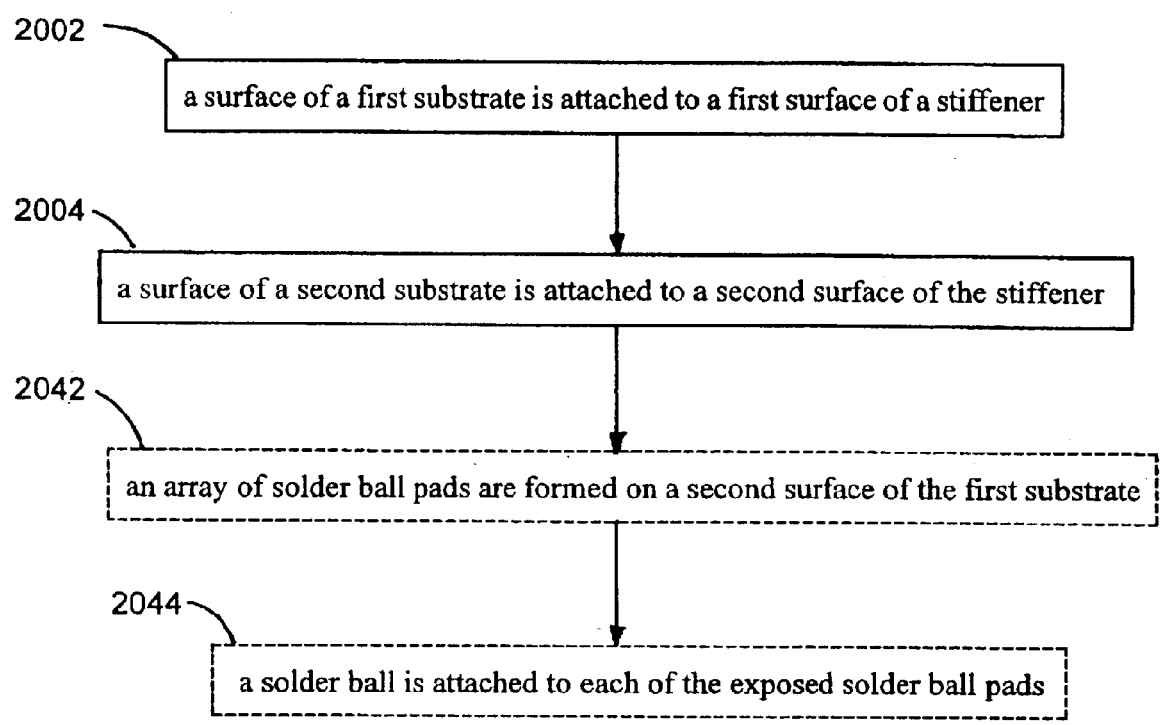

FIG. 20L provides additional optional steps for flowchart 2000 of FIG. 20A:

In an embodiment, flowchart 2000 further includes step 2042. In step 2042, an array of solder ball pads are formed on a second surface of the first substrate. For example, the solder ball pads are formed in a bottom metal layer of first substrate 104, and are exposed through a solder mask.

In an embodiment, flowchart 2000 further includes step 2044. In step 2044, a solder ball is attached to each of the exposed solder ball pads. For example, the solder balls are solder balls 106 arranged as shown in either of FIGS. 13 and 14.

3.2 Two Substrate BGA Package Embodiments with Additional Electronic Devices

According to an embodiment of the present invention, the electrical performance of a BGA package having two package substrates is improved by the attachment of one or more additional electronic devices to the top surface of the BGA package. In an example die-up BGA package of the present invention, an IC die is mounted to the top surface of the second package substrate. According to further embodiments of the present invention, additional electronic devices are attached to the top surface of the second substrate. This allows for enhanced electrical performance, by allowing electronic devices in addition to the IC die to be present in the BGA package. The electronic devices may be mounted closely to the IC die, and hence may have shorter signal communication paths with the IC die. Further benefits may be realized, as would be understood by persons skilled in the relevant art(s) from the teachings herein.

Embodiments allowing the attachment of one or more electronic devices to the top surface of the BGA package with two substrates are adaptable to any BGA package type, including any of those described elsewhere herein. These BGA package types include tape, ceramic, and organic substrate BGA packages, and include die-up and die-down BGA package configurations. For exemplary purposes, the present invention is described below in relation to a die-up BGA package similar to BGA packages 500, 800, and 1200 respectively shown in FIGS. 5, 8 and 12, but the present invention is also applicable to other BGA package configurations described herein and elsewhere, as would be understood by persons skilled in the relevant art(s) from the teachings herein.

Figure 15A:
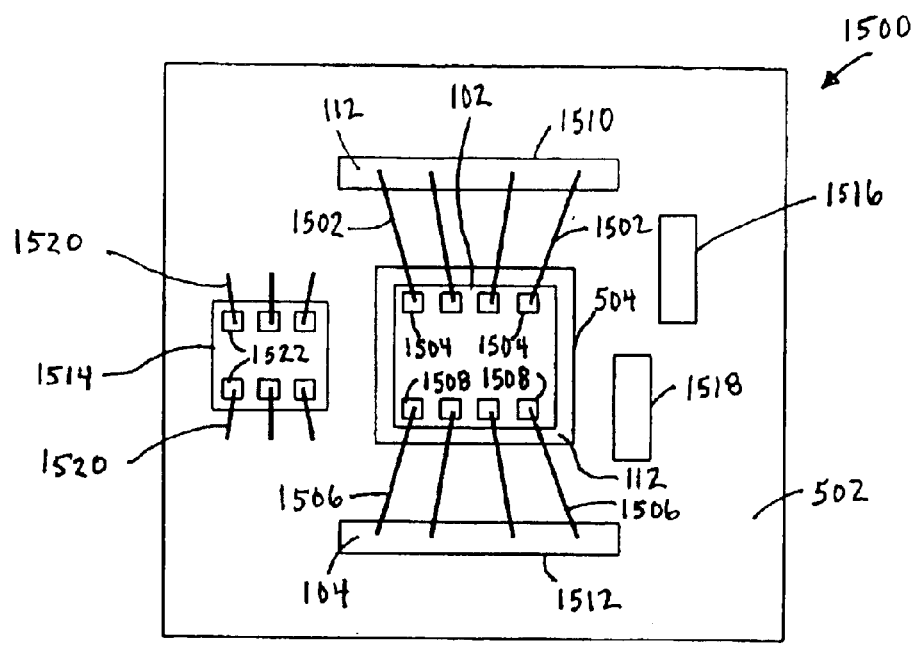
FIG. 15A shows a top view of a BGA package with electronic devices attached to the second substrate, according to an embodiment of the present invention.
Figure 15B:
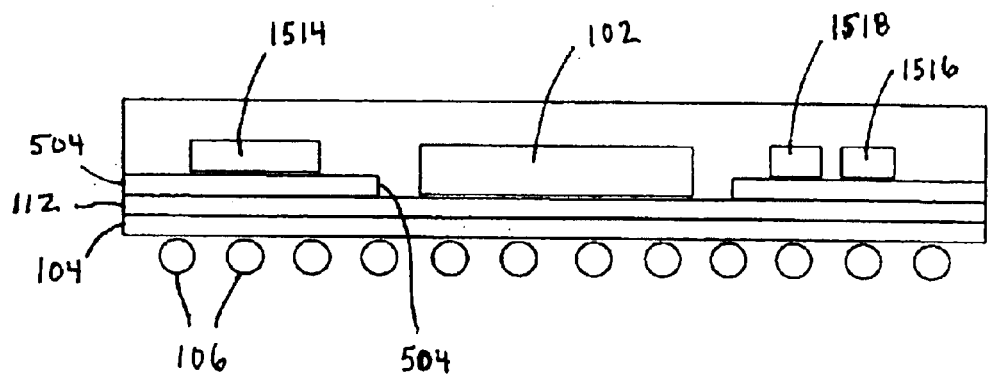
FIG. 15B shows a cross-sectional view of the BGA package of FIG. 15A, according to an embodiment of the present invention.

FIG. 15A shows a top view of an example BGA package 1500, according to an embodiment of the present invention. FIG. 15B shows a cross-sectional view of BGA package 1500. BGA package 1500 is configured similarly to BGA packages described above. As shown in FIG. 15A, IC die 102 is attached to stiffener 112 through centrally located opening 504 in second substrate 502. One or more wire bonds 1502 are coupled between I/O pads 1504 of IC die 102 to stiffener 112 through a first opening 1510 in second substrate 502. One or more wire bonds 1506 are coupled between I/O pads 1508 of IC die 102 to traces (not shown) on the top surface of first substrate 104 through a second opening 1512 in second substrate 502 and a corresponding opening in stiffener 112.

According to the present invention, electronic devices in addition to IC die 102 may be attached/mounted to the top surface of substrate 502. As shown in FIG. 15A, a first electronic device 1514, a second electronic device 1516, and a third electronic device 1518 are attached to the top surface of second substrate 502, according to an example embodiment of the present invention. First, second, and third electronic devices 1514, 1516, and 1518 may be any applicable type of electronic device that would be useful to include in an integrated circuit package, that meets applicable size constraints.

For example, first, second, and third electronic devices 1514, 1516, and 1518 may be passive or active components. For instance, one or more of first, second, and third electronic devices 1514, 1516, and 1518 may be any passive component type, including resistors, capacitors, and/or inductors. One or more of first, second, and third electronic devices 1514, 1516, and 1518 may be leaded and/or leadless devices. Furthermore, one or more of first, second, and third electronic devices 1514, 1516, and 1518 may be any active component type, including digital and analog IC dies.

In the example of FIGS. 15A–B, first electronic device 1514 is shown as a second IC die. One or more wire bonds 1520 couple pins/pads 1522 of first electronic device 1514 to traces (not shown) on the top surface of second substrate 502. Wire bonds coupled to pins of first electronic device 1514 may also be coupled to stiffener 112 through openings in second substrate 502, and may be coupled to traces on the top surface of first substrate 104 through openings in stiffener 112 and second substrate 502. First electronic device 1514 may alternatively be mounted to second substrate 502 in a "flip chip" fashion. Second and third electronic devices 1516 and 1518 are shown in FIG. 15A as leadless passive components surface mounted to second substrate 502. The present invention is applicable to any number and combination of types of electronic devices being attached/mounted to the top surface of second substrate 502.

Figure 20M:
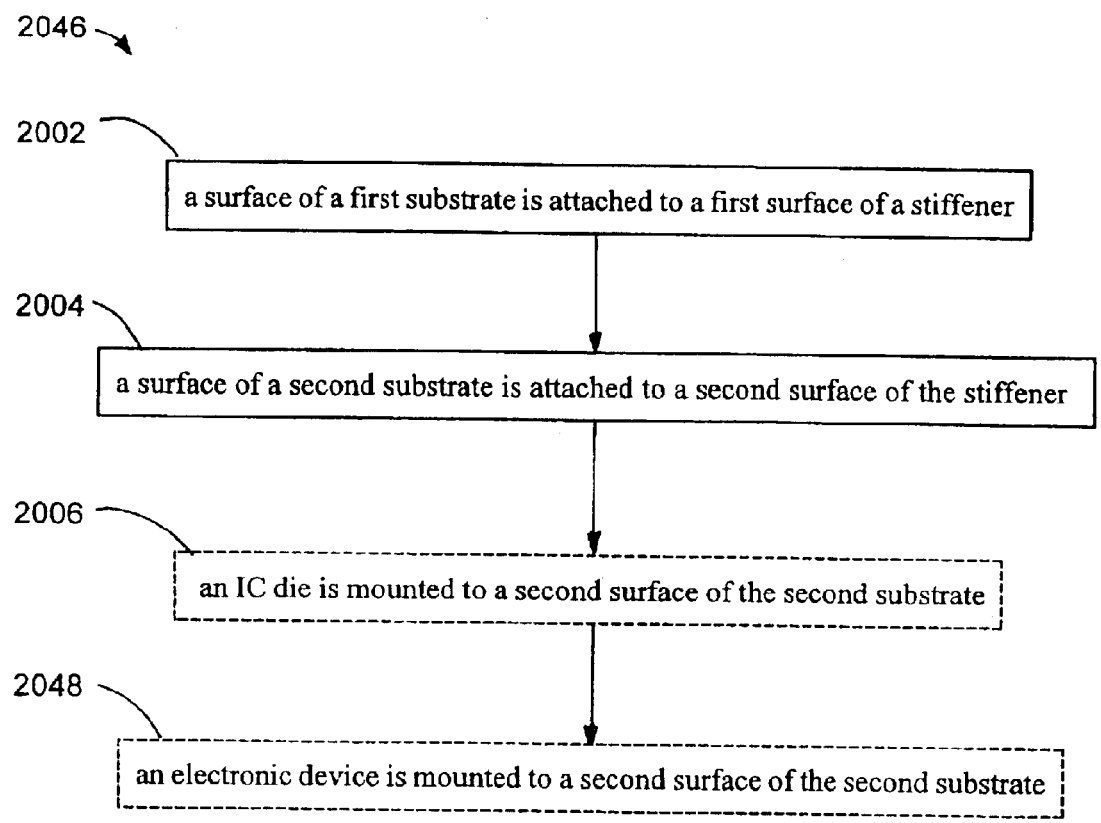

FIG. 20M provides an additional exemplary step for flowchart 2046 of FIG. 20B, for assembling an embodiment of the present invention. The steps of FIG. 20M do not necessarily have to occur in the order shown, as will be apparent to persons skilled in the relevant art(s) based on the teachings herein. Other structural embodiments will be apparent to persons skilled in the relevant art(s) based on the following discussion.

In step 2048, an electronic device is mounted to a second surface of the second substrate. For example, as shown in FIGS. 15A–B, the electronic device may be one of first, second, and third electronic devices 1514, 1516, and 1518, that are mounted to the top surface of second substrate 502. The electronic device may be leaded or leadless.

In an embodiment, step 2048 may include the step where the electronic device is an active device. For example, the electronic device may be an IC die that, includes analog circuits, digital circuits, or a combination thereof. As shown in FIG. 15A, first electronic device 1514 is an IC die.

In an embodiment, step 2048 may include the step where the electronic device is a passive device. For example, the electronic device may be any passive component type, including resistor, capacitor, diode, and inductor. As shown in FIG. 15A, second and third electronic devices 1516 and 1518 are leadless passive components.

3.3 Process Flow Embodiments for Assembling Two Substrate BGA Packages

In this section, embodiments for assembling BGA packages that have two substrates are provided. As described above, BGA packages with two substrates may be assembled individually. The embodiments described below provide processes for assembling BGA packages, and their sub-components, in quantities of one or greater. These implementations are described herein for illustrative purposes, and are not limiting. For instance, the present invention as described herein is applicable to assembling both die-up and die-down BGA package types, as well as other IC package types. Furthermore, each of the embodiments presented below are applicable to tape substrate BGA packages, plastic substrate BGA packages, and ceramic substrate BGA packages. The description below is adaptable to these and other package types, as would be understood to persons skilled in the relevant art(s) from the teachings herein.

Figure 21A:
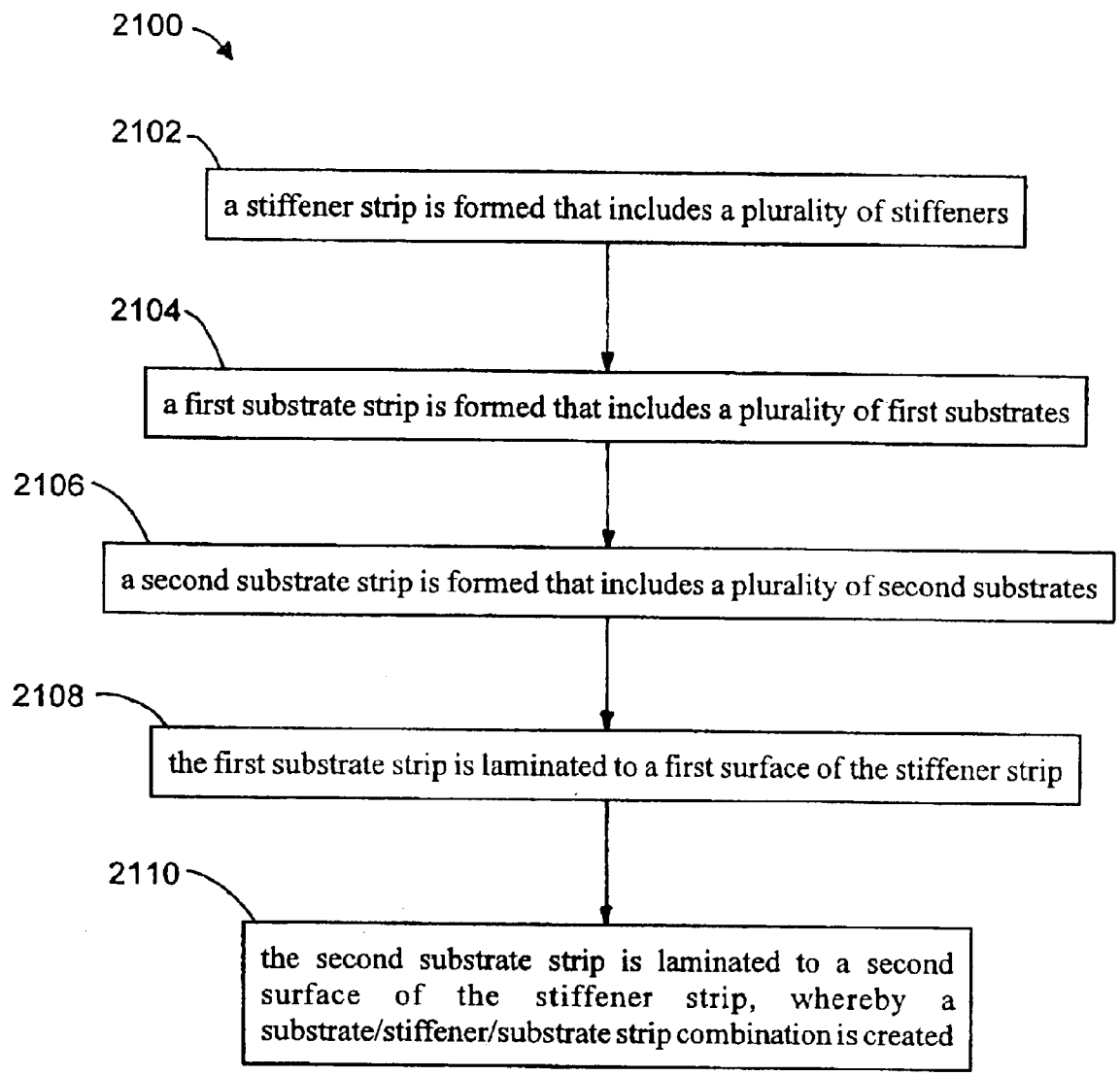

FIG. 21A shows a flowchart 2100 providing operational steps for assembling one or more embodiments of the present invention. FIGS. 21B–G provide operational steps according to further embodiments. Optional steps according to the further embodiments are indicated by dotted lines. The steps of FIGS. 21A–G do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below in relation to FIG. 17, which shows a cross-sectional view of a substrate/stiffener/substrate strip 1700, according to an exemplary embodiment of the present invention, and in relation to additional figures.

Figure 17:
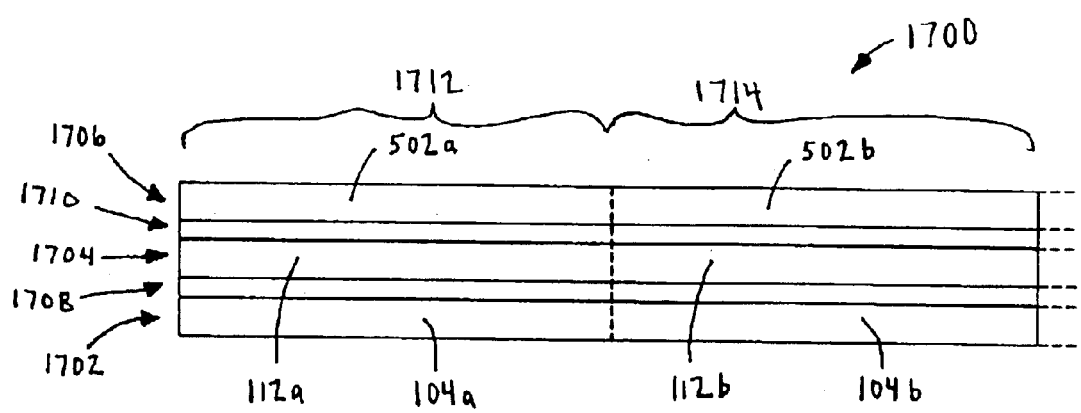
FIG. 17 shows a cross-sectional view of a substrate/stiffener/substrate strip, according to an exemplary embodiment of the present invention.

Flowchart 2100 begins with step 2102. In step 2102, a stiffener strip is formed that includes a plurality of stiffeners. As shown in FIG. 17, substrate/stiffener/substrate strip 1700 includes a first substrate strip 1702, a stiffener strip 1704, and a second substrate strip 1706. The stiffener strip of step 2102 may be stiffener strip 1704. As shown in FIG. 17, stiffener strip 1704 includes a first stiffener 112a, a second stiffener 112b, and may include one or more further stiffeners 112. Stiffeners 112 of stiffener strip 1704 may be arranged in a single row of stiffeners 112, or may be arranged in any number of multiple rows of stiffeners 112.

In step 2104, a first substrate strip is formed that includes a plurality of first substrates. For example, the first substrate strip may be first substrate strip 1702 shown in FIG. 17. First substrate strip 1702 includes a plurality of first substrates 104. For example, as shown in FIG. 17, first substrate strip 1702 includes a first first substrate 104a, a second first substrate 104b, and may include one or more further first substrates 104. First substrates 104 of first substrate strip 1702 may be arranged in a single row of first substrates 104, or may be any number of multiple rows of first substrates 104.

In step 2106, a second substrate strip is formed that includes a plurality of second substrates. For example, the second substrate strip may be second substrate strip 1706 shown in FIG. 17. Second substrate strip 1706 includes a plurality of second substrates 502. For example, as shown in FIG. 17, second substrate strip 1706 includes a first second substrate 502a, a second second substrate 502b, and may include one or more further second substrates 502. Second substrates 502 of second substrate strip 1706 may be arranged in a single row of second substrates 502, or may be any number of multiple rows of second substrates 502.

In step 2108, the first substrate strip is laminated to a first surface of the stiffener strip. As shown in FIG. 17, first substrate strip 1702 is attached by an adhesive material 1708 to stiffener strip 1704. Adhesive material 1708 may be a laminate or other adhesive material.

In step 2110, the second substrate strip is laminated to a second surface of the stiffener strip, whereby a substrate/stiffener/substrate strip combination is created. As shown in FIG. 17, second substrate strip 1706 is attached by an adhesive material 1710 to stiffener strip 1704. Adhesive material 1710 may be a laminate or other adhesive material. In embodiments, first and second substrate strips 702 and 706 may be sequentially or simultaneously laminated to stiffener strip 704. For example, first and second substrate strips 702 and 706 may be laminated to stiffener strip 704 using a 2/3/4 roller method. Simultaneous lamination of the two substrates to the stiffener may act to balance thermal and mechanical stresses produced during the lamination process. In an embodiment, lamination of flex tape substrates may use adhesives with Tg between 40–50° C. and high peel strength materials.

As shown in FIG. 17, substrate/stiffener/substrate strip 1700 includes a plurality of joined substrate/stiffener/substrate combinations, including first and second substrate/stiffener/substrate combinations 1712 and 1714. First and second substrate/stiffener/substrate combinations 1712 and 1714 may form substantially complete BGA packages after separation.

Figure 18A:
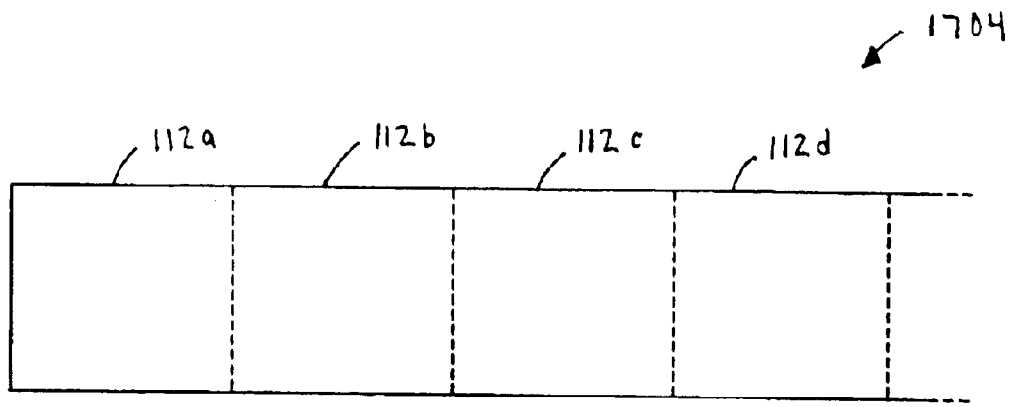
Figure 18B:
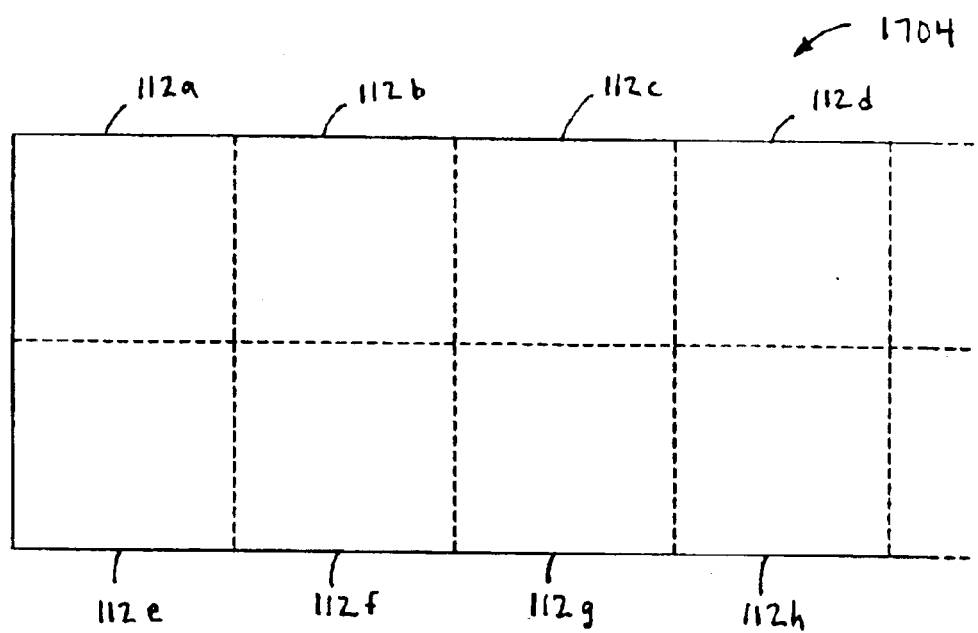
Figure 21B:
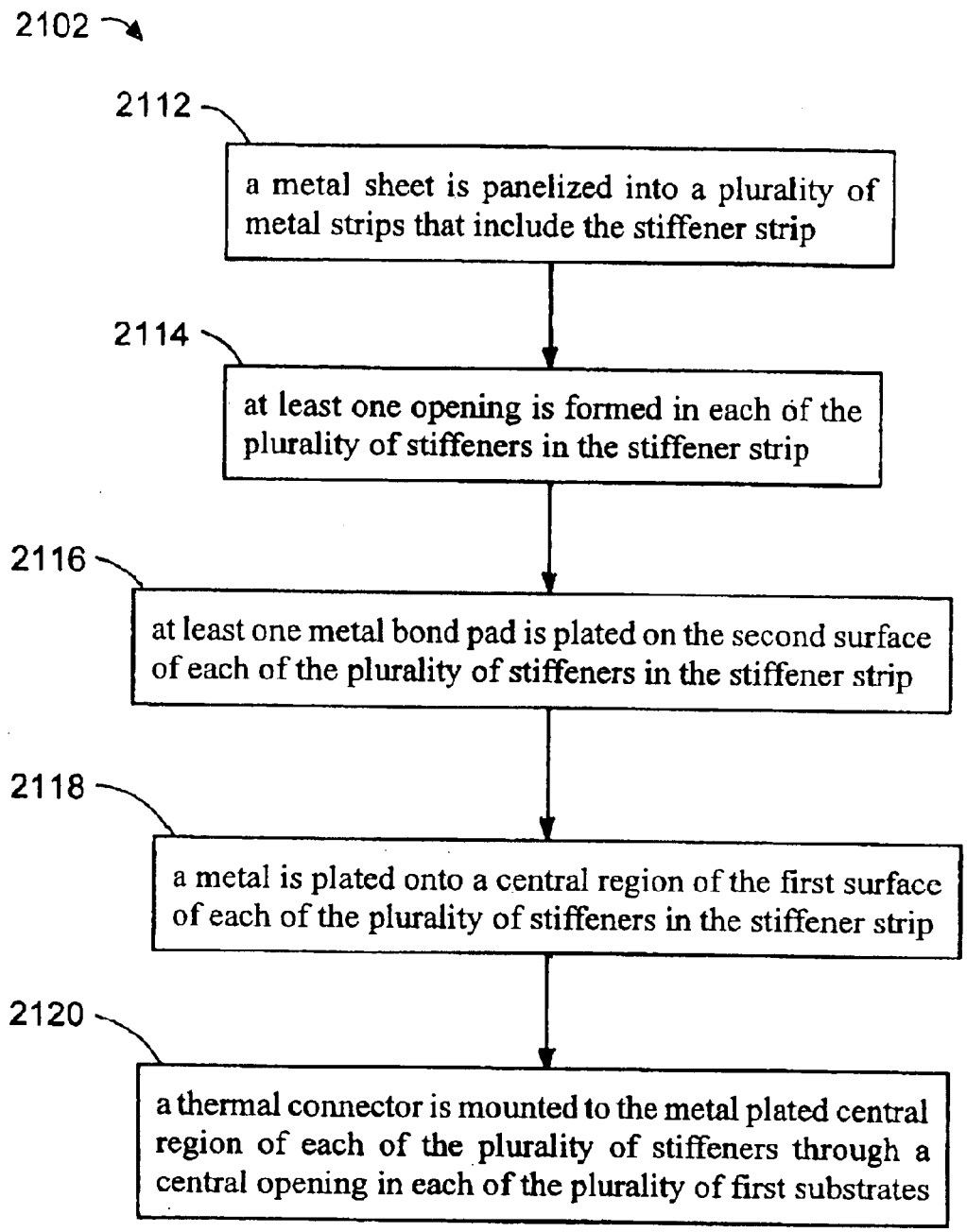

Stiffener strip 1704 may be formed in step 2102 according to materials and processes of the present invention. FIG. 21B provides exemplary steps for step 2102, according to embodiments of the present invention. Any one or more of the steps shown in FIG. 21B are applicable to forming stiffener strip 1704 according to step 2102:

In step 2112, a metal sheet is panelized into a plurality of metal strips that include the stiffener strip. FIG. 18A illustrates an example stiffener strip 1704, according to an embodiment of the present invention. In an embodiment, stiffener strip 1704 is a metal strip that was panelized (i.e., delineated and separated) from a metal sheet, along with one or more further metal strips. Stiffener strip 1704 of FIG. 18A is a single row of stiffeners 112. Stiffener strip 1704 may also include a double row of stiffeners 112, as shown in FIG. 18B, or may include further stiffener rows. For example, stiffener strip 1704 may be a metal strip having 4–6 units arranged in a row or in a matrix. Furthermore, stiffener strip 1704 may be a metal strip formed from copper, aluminum, nickel, tin, or other metal, polymer, or alloy of metals.

Figure 18C:
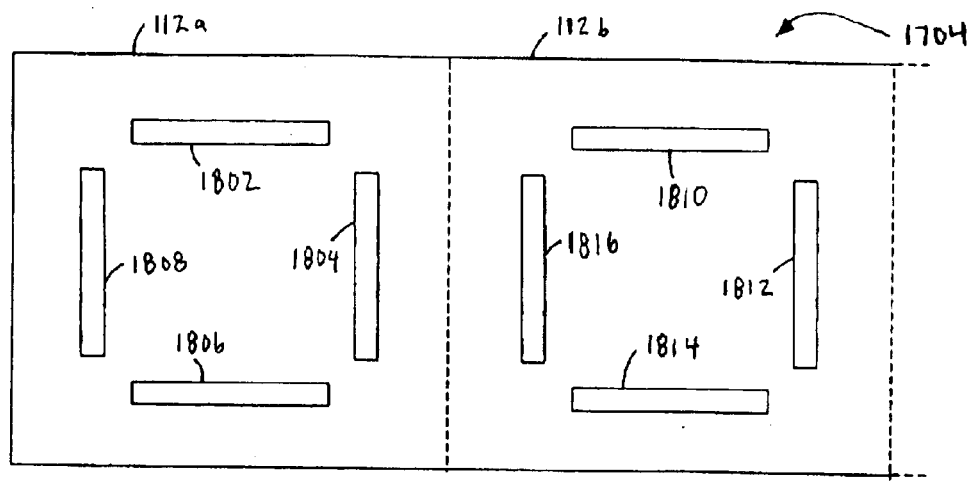

In step 2114, at least one opening is formed in each of the plurality of stiffeners in the stiffener strip. FIG. 18C shows stiffener strip 1704, with first stiffener 112a and second stiffener 112b, according to an embodiment of the present invention. First and second stiffeners 112a and 112b include openings 1802, 1804, 1806, 1808, 1810, 1812, 1814, and 1816. Openings 1802, 1804, 1806, 1808, 1810, 1812, 1814, and 1816 may be used to allow wire bonds to pass through and attach to the top surface of a first substrate 104 in a BGA package. In an embodiment, step 2114 may include the step of using an acid etching process to form the at least one opening. Openings in stiffener strip 1704 may be formed by other processes, including using a metal punch, chemical etching, ion milling, and laser etching, for example.

Figure 18D:
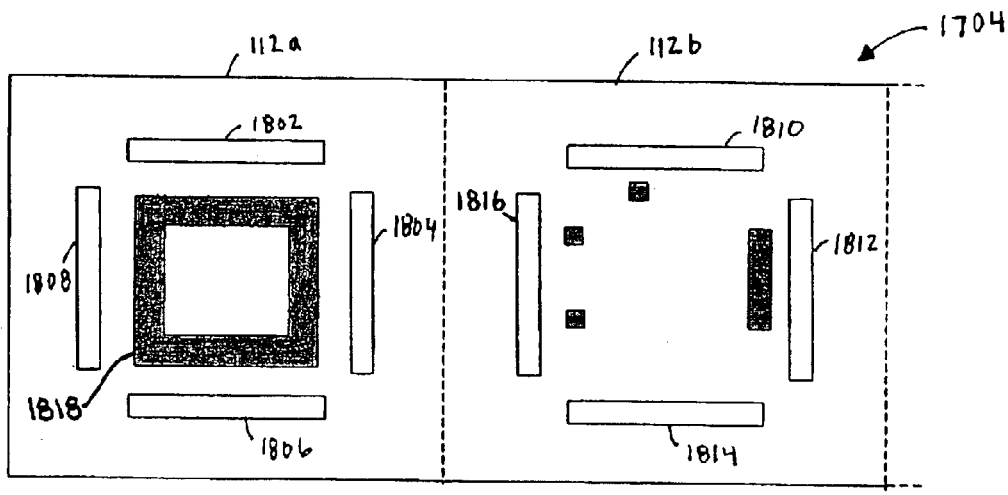

In step 2116, at least one metal bond pad is plated on the second surface of each of the plurality of stiffeners in the stiffener strip. For example, FIG. 18D shows a top surface of stiffener strip 1704, with first stiffener 112a and second stiffener 112b, according to an embodiment of the present invention. First stiffener 112a includes a ground ring 1818, and second stiffener 112b includes a first, a second, a third, and a fourth metal bond pad 1820, 1822, 1824, and 1826. The at least one metal bond pad of step 2116 may be one or more of ground ring 1818 and first, second, third, and fourth metal bond pads 1820, 1822, 1824, and 1826. The metal bond pads may be used to attach wire bonds to the top surface of a stiffener 112 in a BGA package. The metal bond pads may be silver, nickel, gold, or other metal or alloy. To further process the stiffener strip for attachment to the substrate strips, its surfaces may be treated with black/brown copper oxide. The finish of the stiffener strip surfaces may be smooth, rough, matte, velvet, or otherwise, which may aid in adhesion of the substrate strips to the stiffener strip.

Figure 18E:
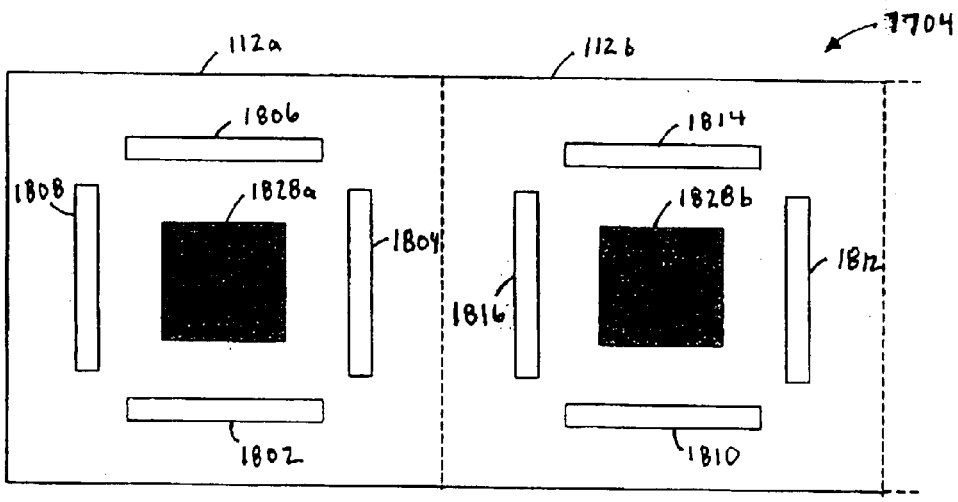

In step 2118, a metal is plated onto a central region of the first surface of each of the plurality of stiffeners in the stiffener strip. For example, FIG. 18E shows a bottom surface of stiffener strip 1704, with first stiffener 112a and second stiffener 112b, according to an embodiment of the present invention. First and second stiffeners 112a and 112b respectively include a centrally located metal pad 1828a and 1828b. Centrally located metal pads 1828a and 1828b may be used to attach ground/thermal connectors 404, as shown in FIG. 5, to the bottom surface of stiffeners 112 in BGA packages. The centrally located metal pads may be silver, nickel, gold, other metal, or combinations/alloys thereof.

In step 2120, a thermal connector is mounted to the metal plated central region of each of the plurality of stiffeners through a central opening in each of the plurality of first substrates. For example, after step 2108, when stiffener strip 1704 and first substrate strip 1702 are attached, ground/thermal connectors 404 may be mounted to centrally located metal pads 1828a and 1828b on the bottom surface of stiffeners 112a and 112b, through centrally located openings 402 in first substrate strip 1702. Alternatively, ground/thermal connectors 404 may be attached to stiffener strip 1704 prior to step 2108.

Figure 19A:
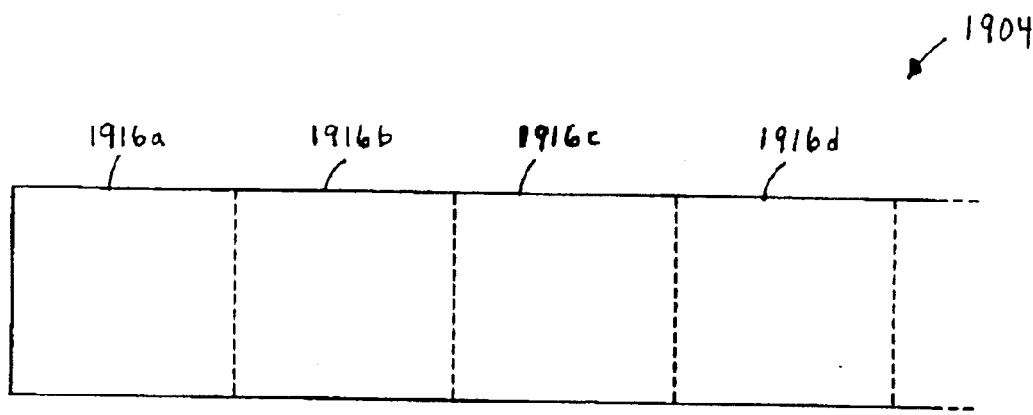
Figure 19B:
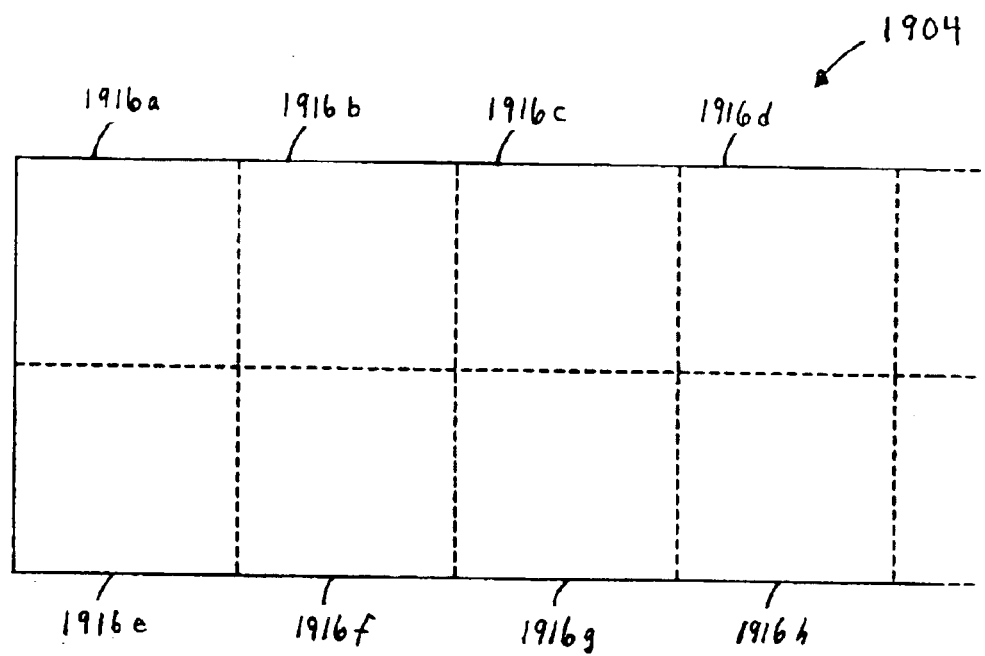
Figure 21C:
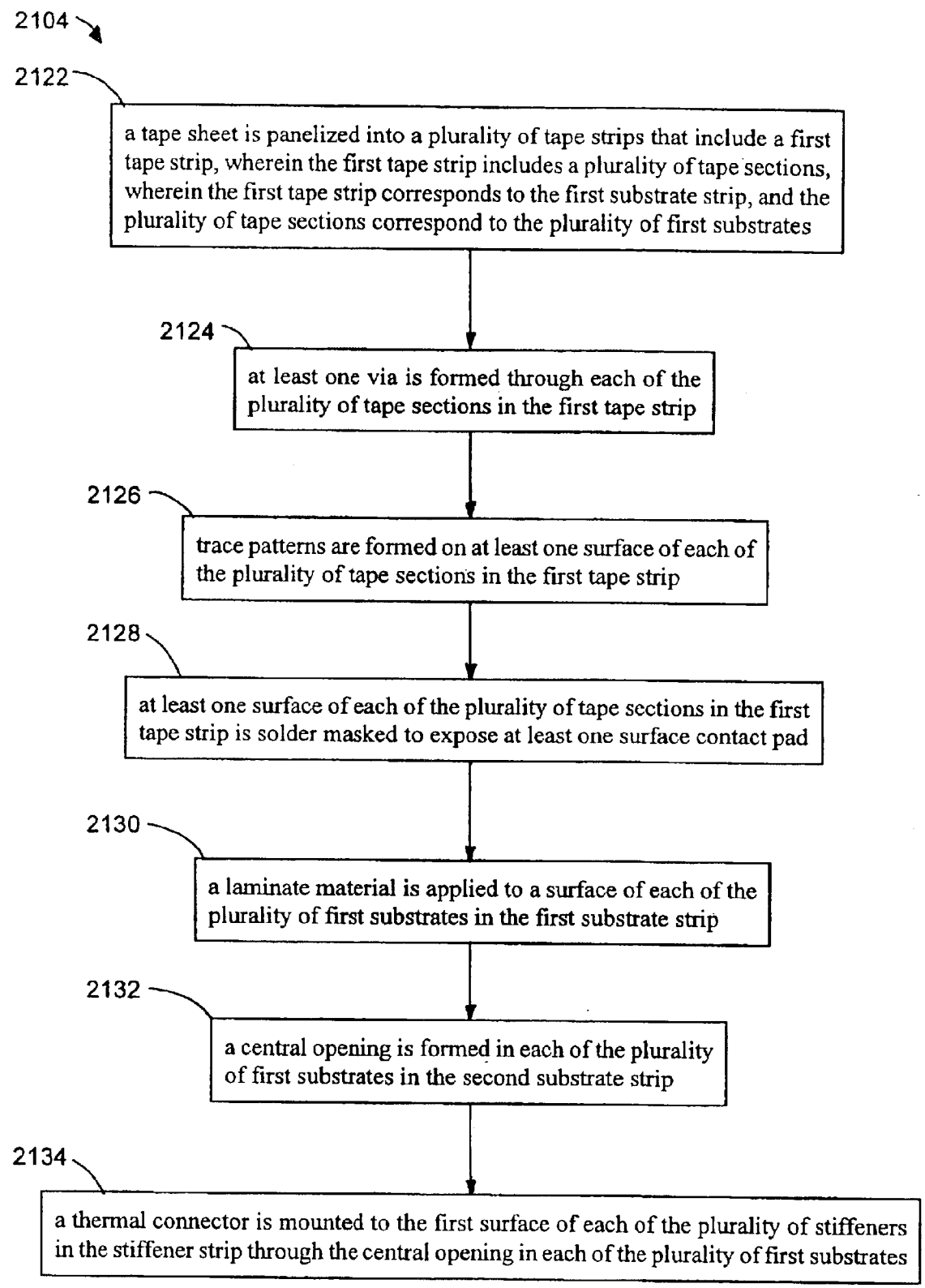

First substrate strip 1702 may be formed in step 2104 according to materials and processes of the present invention. FIG. 21C provides exemplary steps for step 2104, according to embodiments of the present invention. Any one or more of the steps shown in FIG. 21C are applicable to forming first substrate strip 1702:

In step 2122, a tape sheet is panelized into a plurality of tape strips that include a first tape strip, wherein the first tape strip includes a plurality of tape sections, wherein the first tape strip corresponds to the first substrate strip, and the plurality of tape sections correspond to the plurality of first substrates. FIG. 19A illustrates an example first tape strip 1904, according to embodiments of the present invention. In a tape substrate embodiment, first tape strip 1904 is a tape strip that was panelized from a tape sheet, along with one or more further tape strips. First tape strip 1904 as shown in FIG. 19A includes a single row of tape sections 1916. After further processing, such as that described below in relation to FIG. 21C, the plurality of tape sections 1916 will be formed into first substrates 104. (As described below, FIGS. 19A–D also apply to forming second substrate(s) 502). First tape strip 1904 may also include a double row of first tape sections 1916, as shown in FIG. 19B, or may include further first substrate rows. First tape strip 1904 may be a dielectric material made from various substances, such as polyimide tape.

Figure 19C:
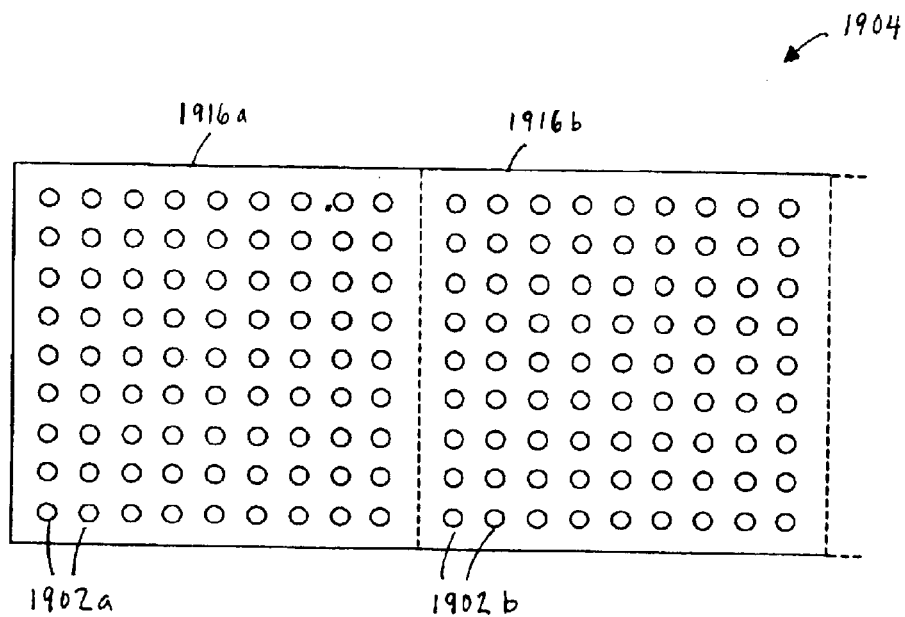

In step 2124, at least one via is formed through each of the plurality of tape sections in the first tape strip. FIG. 19C shows an example arrangement of vias 1902a and 1902b respectively in tape sections 1916a and 1916b of first tape strip 1904, according to an embodiment of the present invention. The present invention is applicable to any arrangement of via locations, and any number of vias, in the tape sections of first tape strip 1904.

Figure 19D:
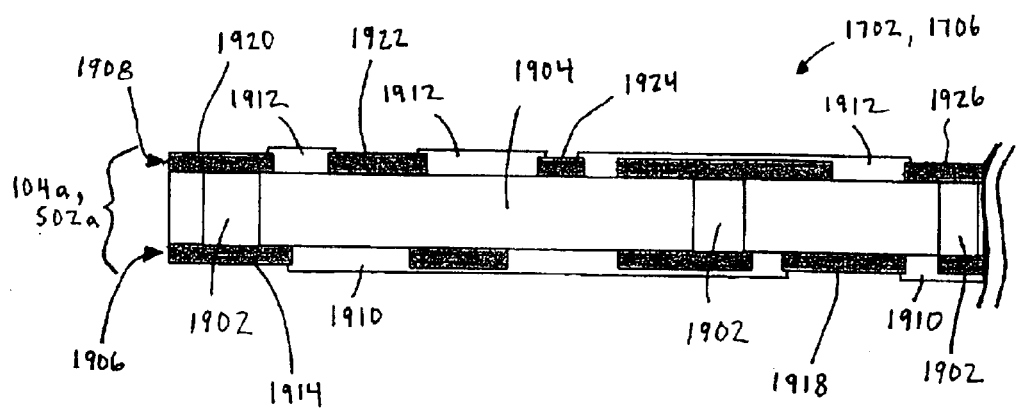

In step 2126, trace patterns are formed on at least one surface of each of the plurality of tape sections in the first tape strip. For example, FIG. 19D illustrates a cross-sectional view of a portion of first substrate strip 1702 (or second substrate strip 1706, as described below), according to embodiments of the present invention. A first metal layer 1906 and a second metal layer 1908 are formed on first tape strip 1904. First and second metal layers 1906 and 1908 may include copper, nickel, silver, gold, other metal, or combination/alloy thereof. Trace patterns are formed in the metal layers, as shown in first and second metal layers 1906 and 1908 of FIG. 19D. Two metal layers are shown in FIG. 19D for illustrative purposes, but the present invention is applicable to any number of one or more metal layers.

In step 2128, at least one surface of each of the plurality of tape sections in the first tape strip is solder masked to expose at least one surface contact pad. For example, as shown in FIG. 19D, the bottom surface of first substrate strip 1702 is coated with a solder mask 1910. Solder mask 1910 is formed to cover some portions of, and expose other portions of the trace patterns of first metal layer 1906. The top surface of first substrate strip 1702 is coated with a solder mask 1912 that is formed to cover some portions of, and expose other portions of the trace patterns of second metal layer 1908. The solder mask protects some trace patterns from contact, and exposes other trace patterns, such as bond fingers/surface contact pads. As shown in FIG. 19D, on the bottom surface of first substrate strip 1702, a first and a second surface contact pad 1914 and 1918 are exposed. On the top surface of first substrate strip 1702, a third, a fourth, a fifth, and a sixth surface contact pad 1920, 1922, 1924, and 1926 are exposed. The present invention is applicable to any number of surface contact pads being exposed.

In step 2130, a laminate material is applied to a surface of each of the plurality of first substrates in the first substrate strip. For example, an adhesive material may be applied to the top surface of first substrate strip 1702 in preparation to be attached to the bottom surface of stiffener strip 1704.

Figure 19E:
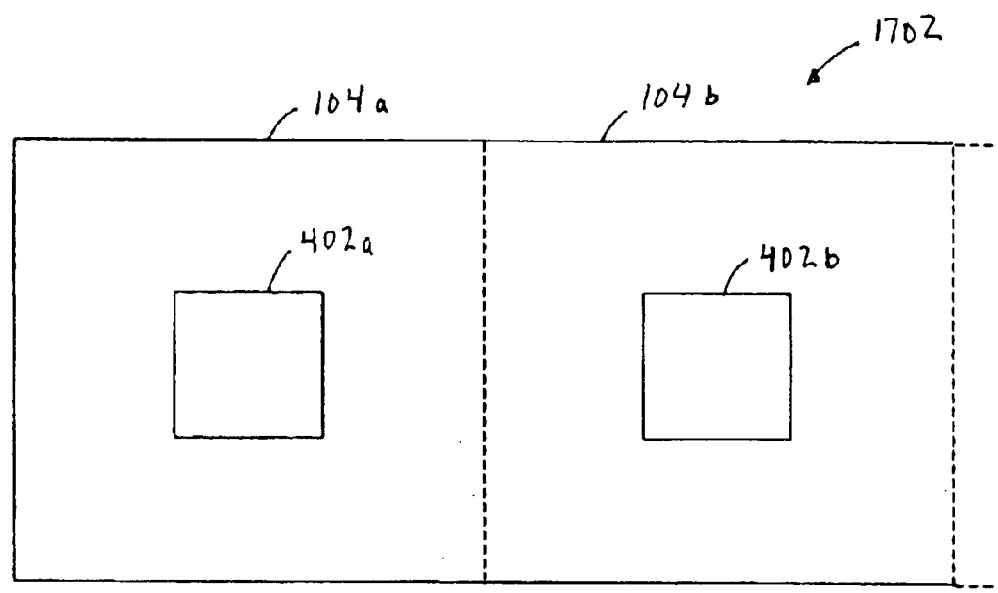

In step 2132, a central opening is formed in each of the plurality of first substrates in the second substrate strip. For example, FIG. 19E shows centrally located openings 402a and 402b formed in first first substrate 104a and second first substrate 104b, respectively. The central opening may be cut or punched out of a substrate. Furthermore, the central opening may be formed in other ways.

In step 2134, a thermal connector is mounted to the first surface of each of the plurality of stiffeners in the stiffener strip through the central opening in each of the plurality of first substrates. For example, after step 2108, when stiffener strip 1704 and first substrate strip 1702 are attached, ground/thermal connectors 404 may be mounted to the bottom surface of stiffeners 112a and 112b, through centrally located openings 402a and 402b in first substrate strip 1702.

Figure 21D:
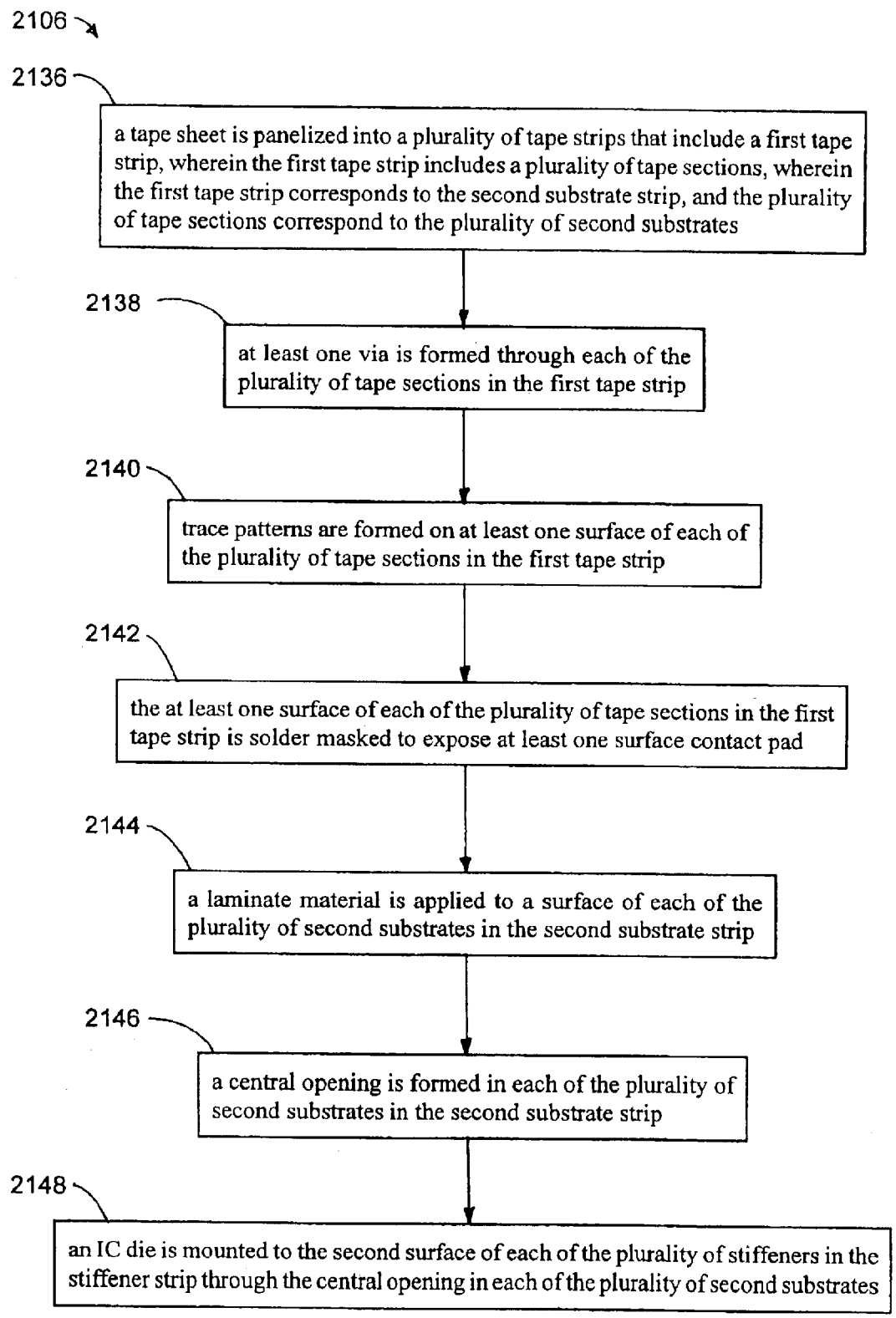

Second substrate strip 1706 may be formed in step 2106 according to materials and processes of the present invention. FIG. 21D provides exemplary steps for step 2106, according to embodiments of the present invention. Any one or more of the steps shown in FIG. 21D are applicable to forming first substrate strip 1706:

In step 2136, a tape sheet is panelized into a plurality of tape strips that include a first tape strip, wherein the first tape strip includes a plurality of tape sections, wherein the first tape strip corresponds to the second substrate strip, and the plurality of tape sections correspond to the plurality of second substrates. FIGS. 19A–D, which were described above in relation to first substrate strip 1702 will now be described in relation to second substrate strip 1706. FIG. 19A illustrates an example first tape strip 1904, according to embodiments of the present invention. In a tape substrate embodiment, first tape strip 1904 is a tape strip that was panelized from a tape sheet, along with one or more further tape strips. First tape strip 1904 includes a single row of tape sections 1916. After further processing, such as the processing described in subsequent steps of FIG. 21D, the plurality of tape sections 1916 will be formed into second substrates 502. First tape strip 1904 may also include a double row of first tape sections 1916, as shown in FIG. 19B, or may include further first substrate rows. First tape strip 1904 may be a dielectric material made from various substances, such as polyimide tape.

In step 2138, at least one via is formed through each of the plurality of tape sections in the first tape strip. FIG. 19C shows example arrangements of vias 1902a and 1902b respectively in tape sections 1916a and 1916b of first tape strip 1904, according to an embodiment of the present invention. The present invention is applicable to any arrangement of via locations, and any number of vias, in the tape sections of first tape strip 1904.

In step 2140, trace patterns are formed on at least one surface of each of the plurality of tape sections in the first tape strip. For example, FIG. 19D illustrates a cross-sectional view of a portion of second substrate strip 1706, according to embodiments of the present invention. As shown in FIG. 19D, a first metal layer 1906 and a second metal layer 1908 are formed on first tape strip 1904. First and second metal layers 1906 and 1908 may include copper, nickel, silver, gold, other metal, or combination/alloy thereof. Trace patterns are formed in first and second metal layers 1906 and 1908, as shown in FIG. 19D. Two metal layers are shown for second substrate strip 1706 in FIG. 19D for illustrative purposes, but the present invention is applicable to any number of one or more metal layers.

In step 2142, the at least one surface of each of the plurality of tape sections in the first tape strip is solder masked to expose at least one surface contact pad. For example, as shown in FIG. 19D, the bottom surface of second substrate strip 1706 is coated with a solder mask 1910. Solder mask 1910 is formed to cover some portions of, and expose other portions of the trace patterns of first metal layer 1906. The top surface of second substrate strip 1706 is coated with a solder mask 1912 that is formed to cover some portions of, and expose other portions of the trace patterns of second metal layer 1908. The solder mask protects some trace patterns from contact, and exposes other trace patterns, such as bond fingers/surface contact pads. As shown in FIG. 19D, on the bottom surface of second substrate strip 1706, a first and a second surface contact pad 1914 and 1918 are exposed. On the top surface of second substrate strip 1706, a third, a fourth, a fifth, and a sixth surface contact pad 1920, 1922, 1924, and 1926 are exposed. The present invention is applicable to any number of surface contact pads being exposed.

In step 2144, a laminate material is applied to a surface of each of the plurality of second substrates in the second substrate strip. For example, an adhesive material may be applied to the bottom surface of second substrate strip 1706 in preparation to be attached to the top surface of stiffener strip 1704.

In step 2146, a central opening is formed in each of the plurality of second substrates in the second substrate strip.

Figure 19F:
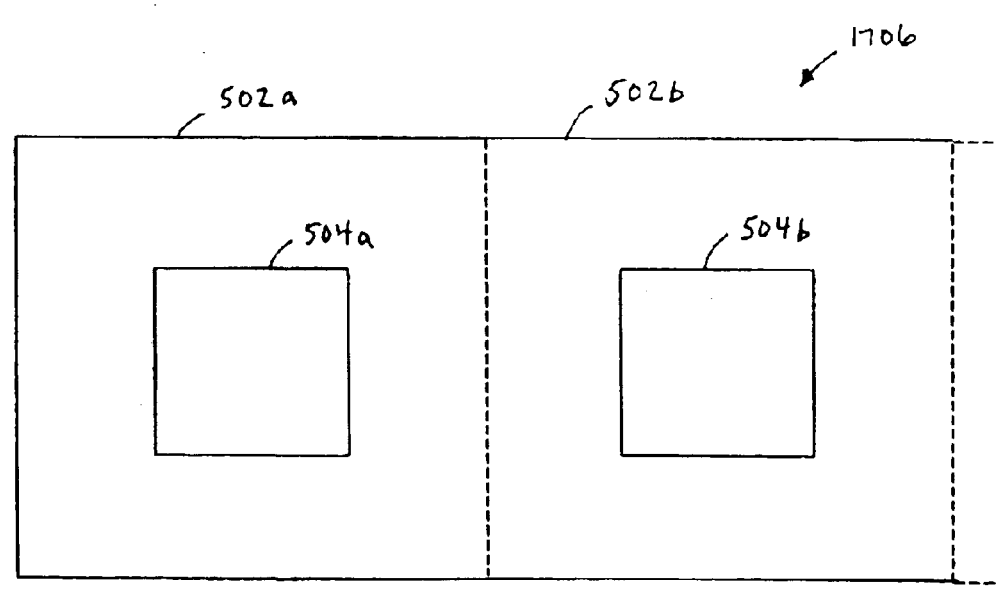

For example, FIG. 19F shows centrally located openings 504a and 504b in first second substrate 502a and second second substrate 502b, respectively. The central opening may be cut or punched out of a substrate. Furthermore, the central opening may be formed in other ways.

In step 2148, an IC die is mounted to the second surface of each of the plurality of stiffeners in the stiffener strip through the central opening in each of the plurality of second substrates.

Figure 21E:
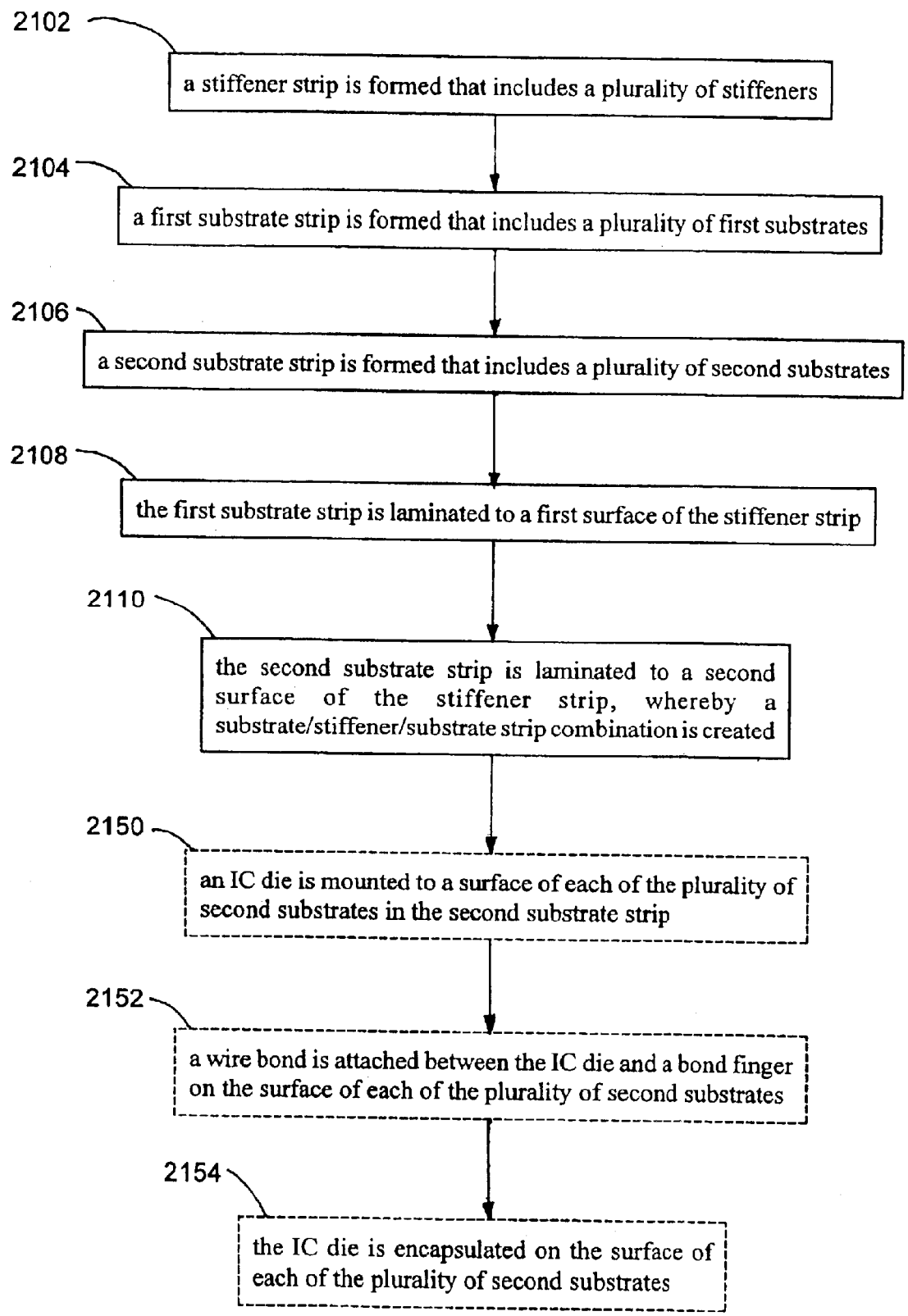

FIG. 21E provides additional optional steps for flowchart 2100 of FIG. 21A:

In an embodiment, flowchart 2100 includes step 2150. In step 2150, an IC die is mounted to a surface of each of the plurality of second substrates in the second substrate strip. For example, the IC die is IC die 102, one of which is mounted to the top surface of each of the plurality of second substrates 502 in second substrate strip 1706.

In an embodiment, flowchart 2100 includes step 2152. In step 2152, a wire bond is attached between the IC die and a bond finger on the surface of each of the plurality of second substrates. For example, the wire bond is wire bond 802 shown in FIG. 8, at least one of which is coupled between IC die pad 804 of each IC die 102 and a trace (not shown) on the top surface of the corresponding second substrate 502 in second substrate strip 1706.

In an embodiment, flowchart 2100 includes step 2154. In step 2154, the IC die is encapsulated on the surface of each of the plurality of second substrates. For example, encapsulant 116 is applied to the top surface of each of second substrates 502 in second substrate strip 1706, encapsulating each IC die 102 and corresponding wire bonds. The techniques for applying encapsulant 116 may include overmold, saw singulated molding, glob top liquid encapsulation, and other known processes.

Figure 21F:
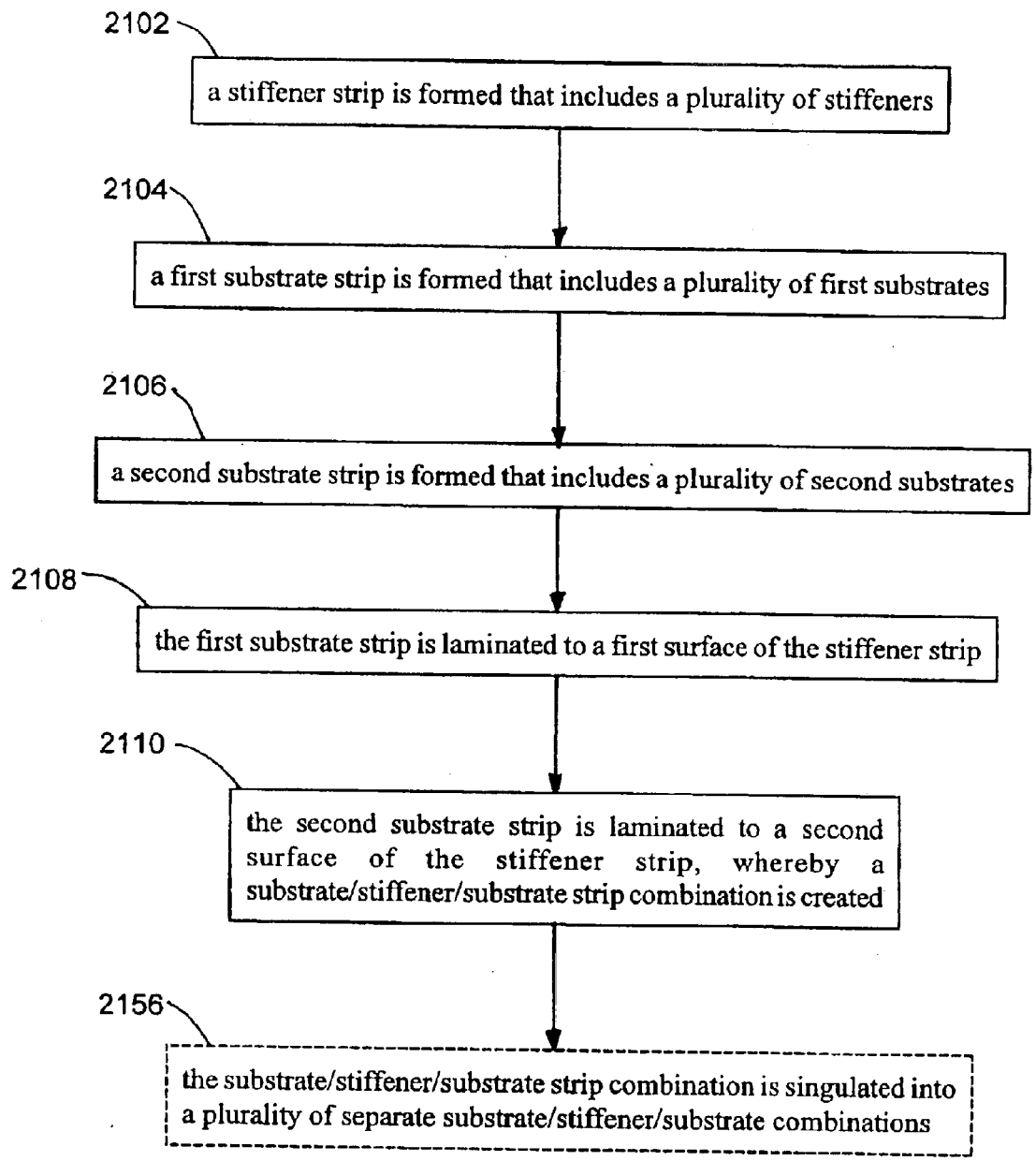

FIG. 21F provides an additional optional step for flowchart 2100 of FIG. 21A, according to an embodiment of the present invention. In step 2156, the substrate/stiffener/substrate strip combination is singulated into a plurality of separate substrate/stiffener/substrate combinations. For example, the substrate/stiffener/substrate strip combination is substrate/stiffener/substrate strip 1700, shown in FIG. 17. Substrate/stiffener/substrate strip 1700 is singulated, or separated, into a plurality of separate substrate/stiffener/substrate combinations, such as first and second substrate/stiffener/substrate combinations 1712 and 1714. The separate substrate/stiffener/substrate combinations form substantially completed BGA packages of the present invention.

Figure 21G:
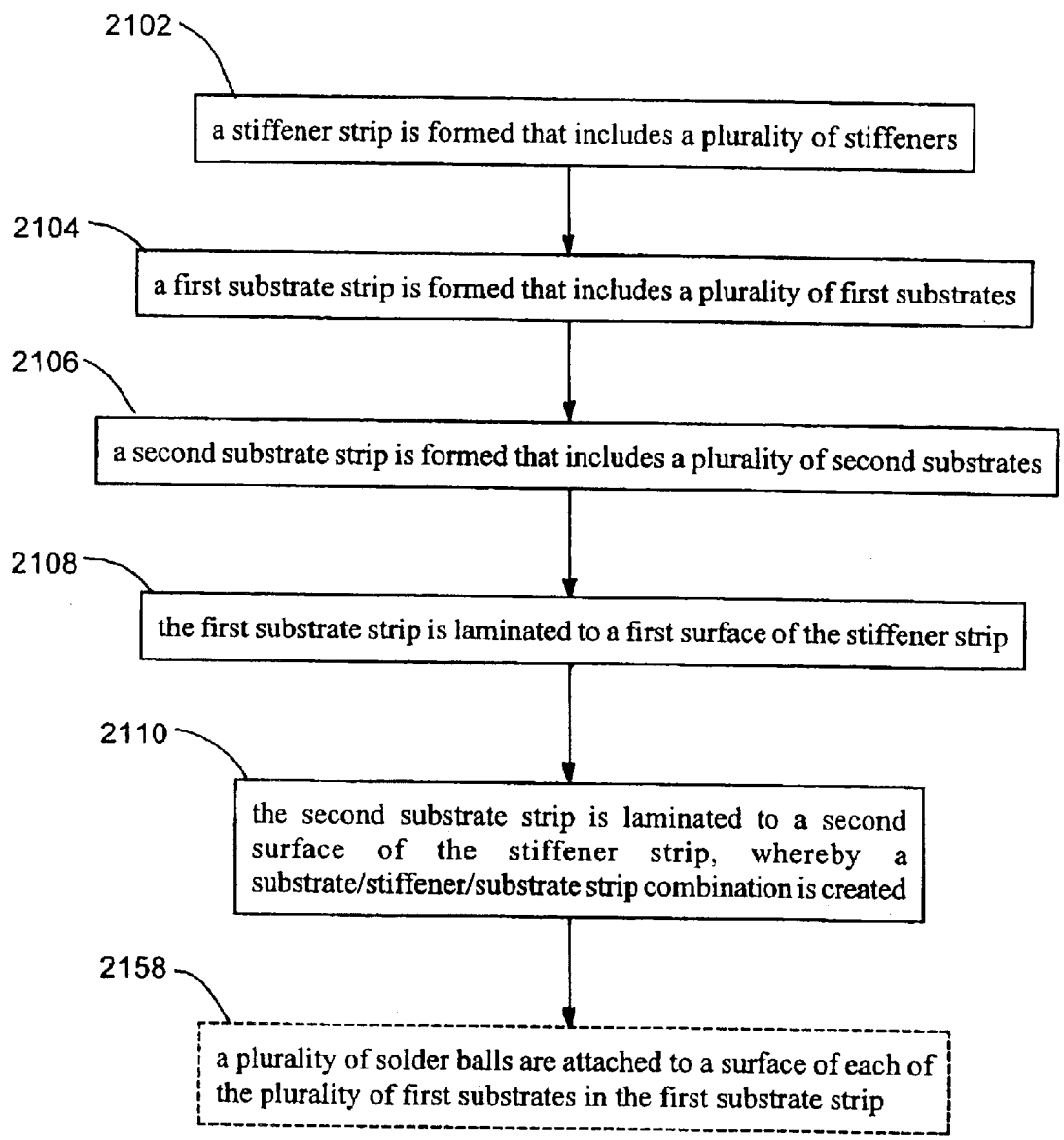

FIG. 21G provides an additional optional step for flowchart 2100 of FIG. 21A, according to an embodiment of the present invention. In step 2158, a plurality of solder balls are attached to a surface of each of the plurality of first substrates in the first substrate strip. For example, the plurality of solder balls are solder balls 106, which are attached to and cover the bottom surface of first substrates 104 in first substrate strip 1702. Example arrangements of solder balls 106 are shown covering the bottom surfaces of exemplary first substrates 104 in FIGS. 13 and 14. The solder balls may be tin, lead, silver, copper, other metal, or combination/alloy thereof. For example, they may be tin/lead, tin/lead/silver, or tin/silver/copper (lead free).

4.0 Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method of assembling a ball grid array (BGA) package, comprising the step of:

(a) attaching a surface of a first substrate torn first surface of a stiffener, wherein the first substrate has a plurality of electrically conductive vias formed therethrough;

(b) attaching a surface of a second substrate to a second surface of the stiffener, wherein the second substrate has a first opening formed therethrough, wherein the stiffener has a second opening formed therethrough; and (c) coupling at least one wire bond between an IC die and the first substrate through the first opening and the second opening.

2. The method of claim 1, further comprising the step of:

(d) mounting the IC die to a second surface of the second substrate.

3. The method of claim 1, further comprising the steps of:

(d) forming a centrally located opening in the second substrate; and (e) mounting the IC die to the second surface of the stiffener through the centrally located opening.

4. The method of claim 1, further comprising the step of:

(d) forming at least one via through the first substrate.

5. The method of claim 4, wherein step (d) comprises the step of: positioning the at least one via in a central region of the first substrate.

6. The method of claim 5, further comprising the steps of:

(e) forming a plurality of solder ball pads on a second surface of the first substrate; and (f) coupling the stiffener to at least one of the plurality of solder ball pads with the at least one via.

7. The method of claim 6, wherein step (d) further comprises the step of:

forming a conductive material in the at least one via.

8. The method of claim 1, further comprising the steps of:

(d) forming a centrally located opening in the first substrate; and (e) mounting a thermal connector to the first surface of the stiffener through the centrally located opening.

9. The method of claim 8, wherein step (e) includes the step of:

mounting the thermal connector to the first surface of the stiffener using a solder or silver-filled epoxy.

10. The method of claim 8, further comprising the step of:

(f) configuring a surface of the thermal connector to be coupled to a printed circuit board (PCB).

11. The method of claim 1, further comprising the step of:

(d) forming the second abstracted to expose a portion of the second surface of the stiffener.

12. The method of claim 11, wherein step (d) comprises the step of:

forming at least one opening in the second substrate.

13. The method of claim 11, further comprising the step of:

(e) coupling at least one wire bond between an IC die and the exposed portion.

14. The method of claim 11, further comprising the step of:
(e) coupling at least one wire bond between at least one trace on a second surface of the second substrate and the exposed portion.

15. The method of claim 1, further comprising the steps of:
(d) forming the first opening in the second substrate; and
(e) forming the second opening in the stiffener that substantially coincides with the first opening to expose a portion of the surface of die first substrate.

16. The method of claim 15, wherein step (c) comprises:
(f) coupling the at least one wire bond between the IC die and the exposed portion.

17. The method claim 15, further comprising the step of:
(f) coupling at least one wire bond between at least one trace on a second surface of the second substrate and the exposed portion.

18. The method of claim 15, further comprising the steps of:
(f) forming the second substrate to expose a portion of the second surface of the stiffener; and
(g) coupling at least one wire bond between the exposed portion of the second surface of the stiffener and the exposed portion of the surface of the first substrate.

19. The method of claim 3, further comprising the step of:
(f) coupling the IC die to the second surface of the second substrate with at least one wire bond.

20. The method of claim 2, further comprising the step of:
(e) mounting an electronic device to a second surface of the second substrate.

21. The method of claim 1, further comprising the steps of:
(d) forming an array of solder ball pads on a second surface of the first substrate; and
(e) attaching a solder ball to each of the solder ball pads.

22. The method of claim 1, wherein the IC package in a ball grid array package.

23. A method of making a plurality of integrated circuit (IC) packages, comprising the steps of:
(1) forming a stiffener strip that includes a plurality of stiffeners;
(2) forming a first substrate ship that includes a plurality of first substrates;
(3) forming a second substrate strip that includes a plurality of second substrates;
(4) laminating the first substrate strip to a first surface of the stiffener strip;
(5) laminating the second substrate strip to a second surface of the stiffener strip, whereby a substrate/stiffener/substrate strip combination is created;
(6) mounting a plurality of IC dies to the substrate/stiffener/substrate strip combination; and
(7) electrically coupling a bond pad of each IC die through the second substrate strip and the stiffener strip to a corresponding first substrate of the plurality of first substrates.

24. The method of claim 23, wherein step (1) includes the step of:
(a) penalizing a metal sheet into a plurality of metal strips that include the stiffener strip.

25. The method of claim 23, wherein step (1) includes the step of:
(a) forming at least one opening in each of the plurality of stiffeners in the stiffener strip.

26. The method of claim 25, wherein step (a) includes the step of:
using an acid etching process.

27. The method of claim 23, wherein step (1) includes the stop of:
(a) plating at least one metal bond pad on the second surface of each of the plurality of stiffeners in the stiffener strip.

28. The method of claim 23, wherein step (1) include the step of:
(a) depositing a metal onto a central region of the first surface each of the plurality of stiffens in the stiffener strip.

29. The method of claim 28, wherein step (a) includes the step of:
plating, coating, or forming the metal onto the central region of the first surface of each of the plurality of stiffeners in the stiffener strip.

30. The method of claim 29, further comprising the step of:
(8) mounting a thermal connector to the metal deposited central region of the plurality of stiffeners through a central opening in each of the plurality of first substrates.

31. The method of claim 30, wherein step (8) includes the step of:
mounting the thermal connector to the metal deposited central region of each of the plurality of stiffeners using a solder or silver-filled epoxy.

32. The method of claim 23, wherein step (2) comprises the step of:
(a) penalizing a tape sheet into a plurality of tape strips that include a first tape strip, wherein the first tape strip includes a plurality of tape sections.

33. The method of claim 32, wherein step (2) further comprises the step of:
(a) forming at least one via through each of the plurality of tape sections in the first tape strip.

34. The method of claim 33, wherein step (2) further comprises the step of:
(a) forming trace patterns on at least one surface of each of the plurality of tape sections in the first tape strip.

35. The method of claim 34, wherein step (2) further comprises the step of:
(a) solder masking the at least one surface of each of the plurality of tape sections in the first tape strip to expose at least one surface contact pad.

36. The method of claim 23, wherein step (2) comprises the step of:
(a) applying a laminate material to a surface of each of the plurality of first substrates in the first substrate strip.

37. The method of claim 23, wherein step (2) comprises the step of:
(a) forming a central opening in each of the plurality of first substrates in the second substrate strip.

38. The method of claim 37, further comprising the step of:
(6) mounting a thermal connector to the first surface of each of the plurality of stiffeners in the stiffener strip through the central opening in each of the plurality of first substrates.

39. The method of claim 23, wherein step (3) comprises the step of:
(a) penalizing a tape sheet into a plurality of tape strips that include a first tape strip, wherein the first tape strip includes a plurality of tape sections.

40. The method of claim 39, wherein step (3) further comprises the step of:

(a) forming at least one via through each of the plurality of tape sections in the first tape strip.

41. The method of claim 40, wherein step (3) further comprises the step of:

(a) forming trace patterns on at least one surface of each of the plurality of tape sections in the first tape strip.

42. The method of claim 41, wherein step (3) further comprises the step of:

(a) solder masking the at least one surface of each of the plurality of tape sections in the first tape strip to expose at least one surface contact pad.

43. The method of claim 23, wherein step (3) comprises the step of:

(a) applying a laminate material to a surface of each of the plurality of second substrates in the second substrate strip.

44. The method of claim 23, wherein step (3) comprises the step of:

(a) forming a central opening in each of the plurality of second substrates in the second substrate strip.

45. The method of claim 44, wherein step (6) comprises:

mounting an IC die to the second surface of each of the plurality of second substrates.

46. The method of claim 23, wherein step (6) comprises:

mounting an IC die to a surface of each of the plurality of second substrates in the second substrate strip.

47. The method of claim 46, wherein step (7) comprises:

attaching a wire bond between the IC die and a bond finger on the surface of each of the plurality of second substrates.

48. The method of claim 47, further comprising the step of:

(8) encapsulating the IC die on the surface of each of the plurality of second substrates.

49. The method of claim 23, further comprising the step of:

(8) encapsulating the substrate/stiffener/substrate strip combination into a plurality of separate substrate/stiffener/substrate combinations.

50. The method of claim 23, further comprising the step of:

(8) attaching a plurality of solder balls to a surface of each of the plurality of first substrates in the first substrate strip.

* * * * *

UNITED STATES PATENT AND TRADEMARK OFFICE
CERTIFICATE OF CORRECTION

PATENT NO.       : 6,887,741 B2
APPLICATION NO.  : 10/730093
DATED            : May 3, 2005
INVENTOR(S)      : Zhao et al.

It is certified that error appears in the above-identified patent and that said Letters Patent is hereby corrected as shown below:

Column 24
In claim 1, line 10, "torn" should be changed to --to a--

Column 24
In claim 11, line 58, "abstracted" should be changed to --substrate--

Column 25
In claim 15, line 11, "of die" should be changed to --of the--

Column 25
In claim 22, line 38, "package in" should be changed to --package is--

Column 25
In claim 23, line 44, "ship" should be changed to --strip--

Column 25
In claim 24, line 62, "penalizing" should be changed to --panelizing--

Column 26
In claim 27, line 5, "stop" should be changed to --step--

Column 26
In claim 28, line 9, "include" should be changed to --includes--

Column 26
In claim 28, line 12, "surface each" should be changed to --surface of each--, and "stiffens" should be changed to --stiffeners--

Column 26
In claim 32, line 32, "penalizing" should be changed to --panelizing--

UNITED STATES PATENT AND TRADEMARK OFFICE
CERTIFICATE OF CORRECTION

PATENT NO. : 6,887,741 B2
APPLICATION NO. : 10/730093
DATED : May 3, 2005
INVENTOR(S) : Zhao et al.

It is certified that error appears in the above-identified patent and that said Letters Patent is hereby corrected as shown below:

Column 26
In claim 39, line 65, "penalizing" should be changed to --panelizing--

Column 27
In claim 45, line 26, "plurality of" should be changed to --plurality of stiffeners in the stiffener strip through the central opening in each of the plurality of--

Signed and Sealed this

Twenty-third Day of January, 2007

JON W. DUDAS
*Director of the United States Patent and Trademark Office*